(12) United States Patent
Fahim et al.

(10) Patent No.: US 10,474,526 B2
(45) Date of Patent: Nov. 12, 2019

(54) SYSTEM AND METHOD FOR GRANULAR IN-FIELD CACHE REPAIR

(71) Applicant: Intel Corporation, Santa Clara, CA (US)

(72) Inventors: Bahaa Fahim, Santa Clara, CA (US); Min Huang, Cupertino, CA (US); Zhiguo Wang, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 173 days.

(21) Appl. No.: 15/282,711

(22) Filed: Sep. 30, 2016

(65) Prior Publication Data
US 2018/0095823 A1 Apr. 5, 2018

(51) Int. Cl.
| | |
|---|---|
| G06F 11/10 | (2006.01) |
| G06F 12/0811 | (2016.01) |
| G11C 29/44 | (2006.01) |
| G11C 29/00 | (2006.01) |
| G06F 12/0868 | (2016.01) |
| G06F 12/0875 | (2016.01) |
| G11C 29/52 | (2006.01) |
| G11C 29/04 | (2006.01) |

(52) U.S. Cl.
CPC ...... *G06F 11/1064* (2013.01); *G06F 12/0811* (2013.01); *G06F 12/0868* (2013.01); *G06F 12/0875* (2013.01); *G11C 29/4401* (2013.01); *G11C 29/70* (2013.01); *G06F 2212/1032* (2013.01); *G06F 2212/283* (2013.01); *G11C 29/52* (2013.01); *G11C 2029/0409* (2013.01)

(58) Field of Classification Search
CPC ............ G06F 11/1064; G06F 12/0811; G11C 29/4401; G11C 29/70
See application file for complete search history.

(56) References Cited

U.S. PATENT DOCUMENTS

| | | | | |
|---|---|---|---|---|
| 2003/0145257 A1* | 7/2003 | Fields, Jr. | ........... | G06F 11/1064 714/704 |
| 2006/0031708 A1* | 2/2006 | Desai | ................. | G06F 11/1064 714/5.1 |
| 2009/0150720 A1* | 6/2009 | Rafaeli | ............... | G06F 11/1064 714/6.12 |
| 2009/0164727 A1* | 6/2009 | Penton | ................ | G06F 11/1064 711/118 |
| 2009/0300332 A1* | 12/2009 | Montgomery | ...... | G06F 9/30003 712/220 |

(Continued)

OTHER PUBLICATIONS

Intel Corporation, "IA-32 Intel® Architecture Software Developer's Manual—vol. 2: Instruction Set Reference", 978 pages, 2003.

*Primary Examiner* — Yolanda L Wilson
(74) *Attorney, Agent, or Firm* — Alliance IP, LLC

(57) ABSTRACT

A cache controller id disclosed, The cache controller includes circuitry to receive a request to access data in a target location of a last level cache of a processor on a processor package, identify an in-field failure in the target location of the last level cache, perform, in response to the identification of the in-field failure, an in-field repair, including circuitry to write in-field repair information to a non-volatile memory on the processor package and external to the processor, the non-volatile memory including circuitry to store in-field repair information. Systems and methods are also disclosed.

17 Claims, 28 Drawing Sheets

(56) References Cited

U.S. PATENT DOCUMENTS

| | | | | |
|---|---|---|---|---|
| 2011/0047408 A1* | 2/2011 | Gille | ............... | G06F 11/141 |
| | | | | 714/723 |
| 2013/0111295 A1* | 5/2013 | Li | ............... | G06F 11/1064 |
| | | | | 714/755 |
| 2013/0339823 A1* | 12/2013 | Meaney | ............... | H03M 13/05 |
| | | | | 714/773 |
| 2016/0179675 A1 | 6/2016 | Fahim et al. | | |
| 2016/0239379 A1* | 8/2016 | Fee | ............... | G06F 11/1064 |
| 2016/0378593 A1* | 12/2016 | Takeda | ............... | G06F 12/0811 |
| | | | | 714/755 |

\* cited by examiner

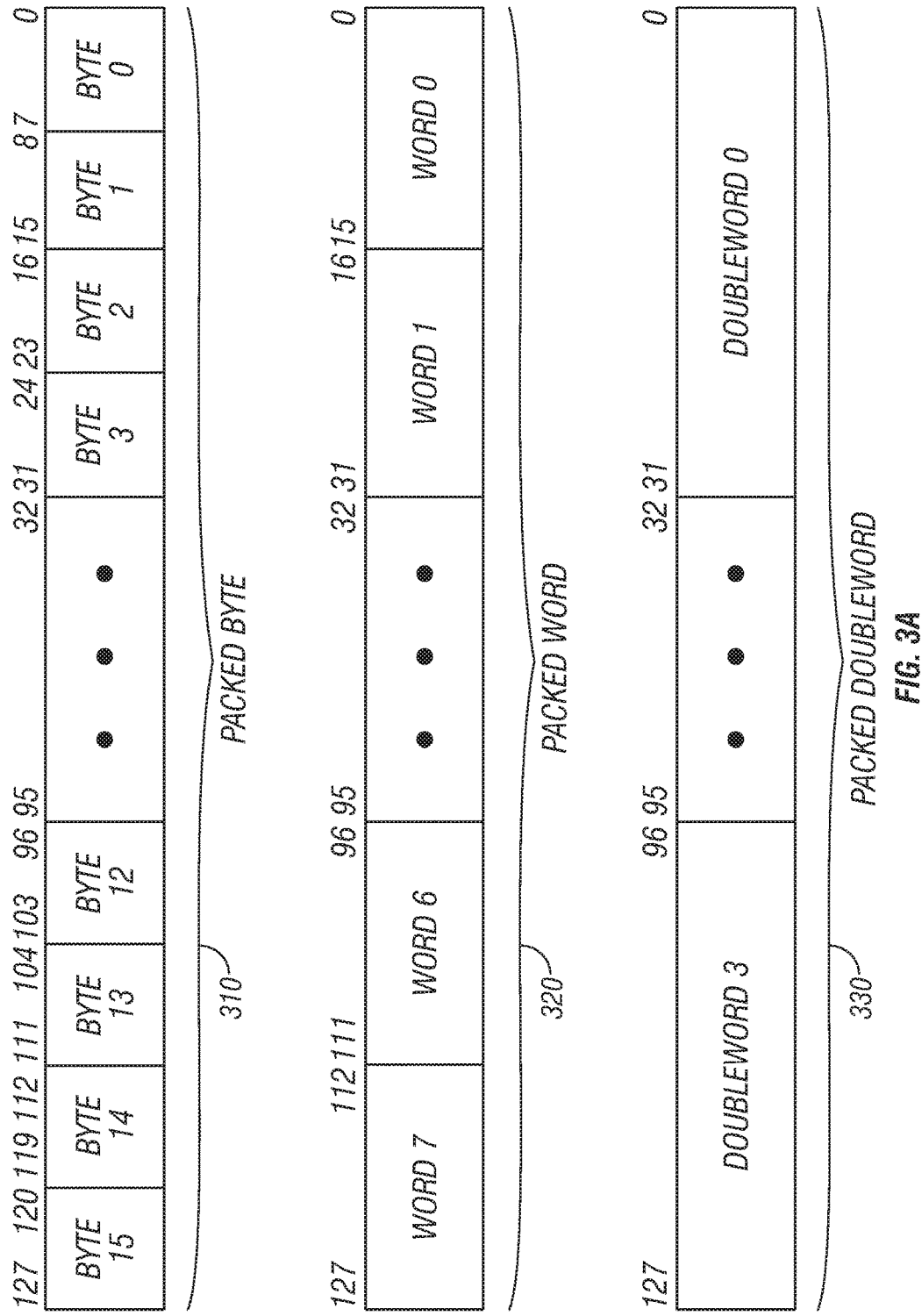

| 127 | 112 111 | 96 95 | 80 79 | 64 63 | 48 47 | 32 31 | 16 15 | 0 |
|---|---|---|---|---|---|---|---|---|
| HALF 7 | HALF 6 | HALF 5 | HALF 4 | HALF 3 | HALF 2 | HALF 1 | HALF 0 | |

341 — PACKED HALF

| 127 | 96 95 | 64 63 | 32 31 | 0 |
|---|---|---|---|---|
| SINGLE 3 | SINGLE 2 | SINGLE 1 | SINGLE 0 | |

342 — PACKED SINGLE

| 127 | 64 63 | 0 |
|---|---|---|
| DOUBLE 1 | DOUBLE 0 | |

343 — PACKED DOUBLE

FIG. 3B

| 127 | 120 119 | 112 111 | 104 103 | | 24 23 | 16 15 | 8 7 | 0 |
|---|---|---|---|---|---|---|---|---|
| bbbb bbbb | bbbb bbbb | bbbb bbbb | • • • | bbbb bbbb | bbbb bbbb | bbbb bbbb |

UNSIGNED PACKED BYTE REPRESENTATION 344

| 127 | 120 119 | 112 111 | 104 103 | | 24 23 | 16 15 | 8 7 | 0 |
|---|---|---|---|---|---|---|---|---|
| sbbb bbbb | sbbb bbbb | sbbb bbbb | • • • | sbbb bbbb | sbbb bbbb | sbbb bbbb |

SIGNED PACKED BYTE REPRESENTATION 345

| 127 | 112 111 | | 16 15 | 0 |
|---|---|---|---|---|
| wwww wwww wwww wwww | • • • | wwww wwww wwww wwww |

UNSIGNED PACKED WORD REPRESENTATION 346

| 127 | 112 111 | | 16 15 | 0 |
|---|---|---|---|---|
| swww wwww wwww wwww | • • • | swww wwww wwww wwww |

SIGNED PACKED WORD REPRESENTATION 347

| 127 | 92 91 | 32 31 | 0 |
|---|---|---|---|
| dddd dddd dddd dddd dddd dddd dddd dddd | • • • | dddd dddd dddd dddd dddd dddd dddd dddd |

UNSIGNED PACKED DOUBLEWORD REPRESENTATION 348

| 127 | 92 91 | 32 31 | 0 |
|---|---|---|---|
| sddd dddd dddd dddd dddd dddd dddd dddd | • • • | sddd dddd dddd dddd dddd dddd dddd dddd |

SIGNED PACKED DOUBLEWORD REPRESENTATION 349

FIG. 3C

SYSTEM AND METHOD FOR GRANULAR IN-FIELD CACHE REPAIR

FIELD OF THE INVENTION

The present disclosure pertains to the field of processing logic, microprocessors, and associated instruction set architecture that, when executed by the processor or other processing logic, perform logical, mathematical, or other functional operations.

DESCRIPTION OF RELATED ART

Multiprocessor systems are becoming more and more common. Processors may include multiple subsystems or functional blocks. For example, a processor may include one or more caches, composed of bit cells, to store information. A bit cell may experience an in-field failure. In the absence of a mechanism to address such a failure, the failure may cause processor downtime, which may cause system wide down time.

DESCRIPTION OF THE FIGURES

Embodiments are illustrated by way of example and not limitation in the Figures of the accompanying drawings:

FIG. 3A illustrates various packed data type representations in multimedia registers, in accordance with embodiments of the present disclosure;

FIG. 3B illustrates possible in-register data storage formats, in accordance with embodiments of the present disclosure;

FIG. 3C illustrates various signed and unsigned packed data type representations in multimedia registers, in accordance with embodiments of the present disclosure;

DETAILED DESCRIPTION

Figure 1A:
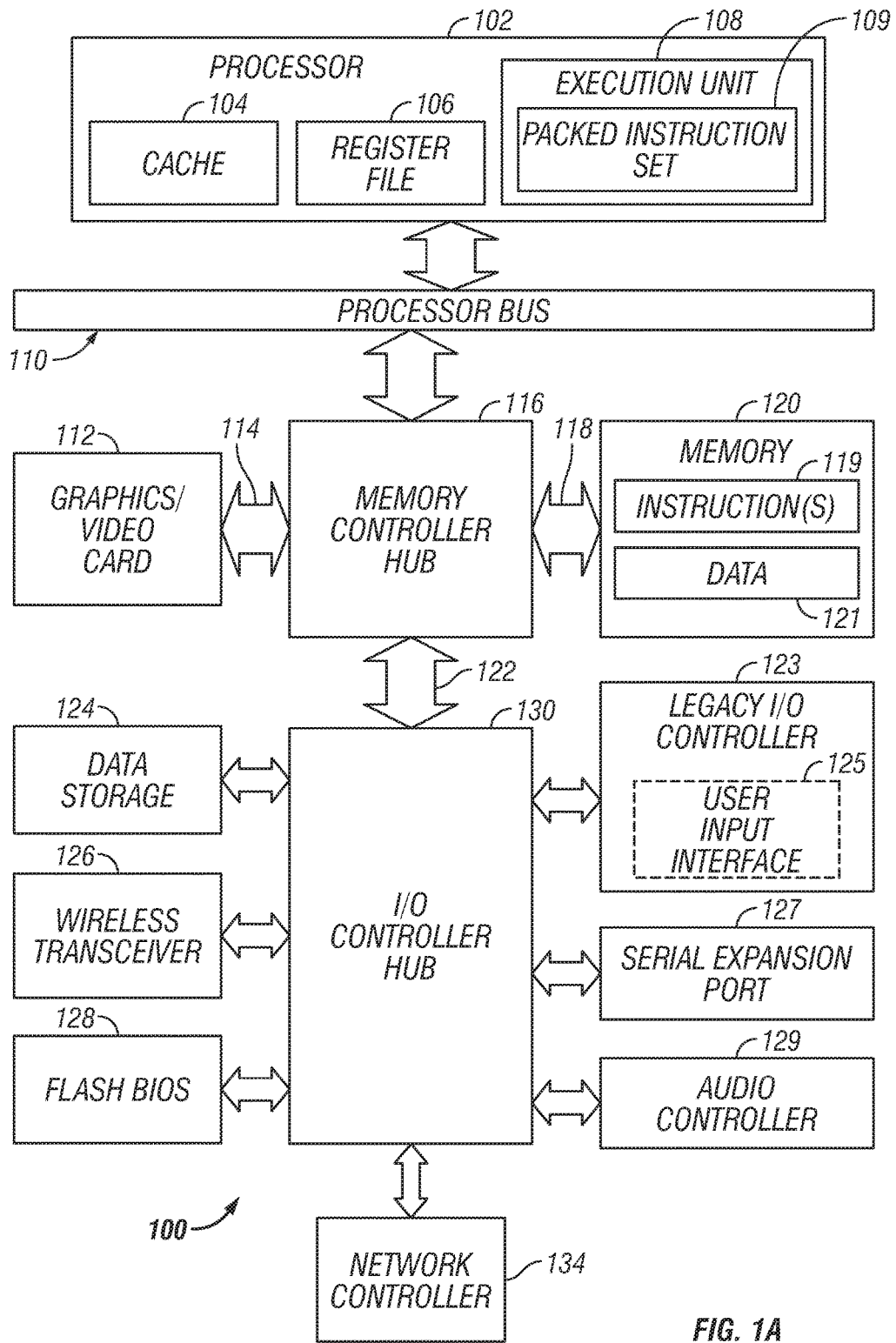
FIG. 1A is a block diagram of an exemplary computer system formed with a processor that may include execution units to execute an instruction, in accordance with embodiments of the present disclosure.

The following description describes an instruction and processing logic and circuitry for granular in-field cache repair. In the following description, numerous specific details such as processing logic, processor types, micro-architectural conditions, events, enablement mechanisms, and the like are set forth in order to provide a more thorough understanding of embodiments of the present disclosure. It will be appreciated, however, by one skilled in the art that the embodiments may be practiced without such specific details. Additionally, some well-known structures, circuits, and the like have not been shown in detail to avoid unnecessarily obscuring embodiments of the present disclosure.

Although the following embodiments are described with reference to a processor, other embodiments are applicable to other types of integrated circuits and logic devices. Similar techniques and teachings of embodiments of the present disclosure may be applied to other types of circuits or semiconductor devices that may benefit from higher pipeline throughput and improved performance. The teachings of embodiments of the present disclosure are applicable to any processor or machine that performs data manipulations. However, the embodiments are not limited to processors or machines that perform 512-bit, 256-bit, 128-bit, 64-bit, 32-bit, or 16-bit data operations and may be applied to any processor and machine in which manipulation or management of data may be performed. In addition, the following description provides examples, and the accompanying drawings show various examples for the purposes of illustration. However, these examples should not be construed in a limiting sense as they are merely intended to provide examples of embodiments of the present disclosure rather than to provide an exhaustive list of all possible implementations of embodiments of the present disclosure.

Although the below examples describe instruction handling and distribution in the context of execution units and logic circuits, other embodiments of the present disclosure may be accomplished by way of a data or instructions stored on a machine-readable, tangible medium, which when performed by a machine cause the machine to perform functions consistent with at least one embodiment of the disclosure. In one embodiment, functions associated with embodiments of the present disclosure are embodied in machine-executable instructions. The instructions may be used to cause a general-purpose or special-purpose processor that may be programmed with the instructions to perform the steps of the present disclosure. Embodiments of the present disclosure may be provided as a computer program product or software which may include a machine or computer-readable medium having stored thereon instructions which may be used to program a computer (or other electronic devices) to perform one or more operations according to embodiments of the present disclosure. Furthermore, steps of embodiments of the present disclosure might be performed by specific hardware components that contain fixed-function logic for performing the steps, or by any combination of programmed computer components and fixed-function hardware components.

Instructions used to program logic to perform embodiments of the present disclosure may be stored within a memory in the system, such as DRAM, cache, flash memory, or other storage. Furthermore, the instructions may be distributed via a network or by way of other computer-readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium may include any type of tangible machine-readable medium suitable for storing or transmitting electronic instructions or information in a form readable by a machine (e.g., a computer).

A design may go through various stages, from creation to simulation to fabrication. Data representing a design may represent the design in a number of manners. First, as may be useful in simulations, the hardware may be represented using a hardware description language or another functional description language. Additionally, a circuit level model with logic and/or transistor gates may be produced at some stages of the design process. Furthermore, designs, at some stage, may reach a level of data representing the physical placement of various devices in the hardware model. In cases wherein some semiconductor fabrication techniques are used, the data representing the hardware model may be the data specifying the presence or absence of various features on different mask layers for masks used to produce the integrated circuit. In any representation of the design, the data may be stored in any form of a machine-readable medium. A memory or a magnetic or optical storage such as a disc may be the machine-readable medium to store information transmitted via optical or electrical wave modulated or otherwise generated to transmit such information. When an electrical carrier wave indicating or carrying the code or design is transmitted, to the extent that copying, buffering, or retransmission of the electrical signal is performed, a new copy may be made. Thus, a communication provider or a network provider may store on a tangible, machine-readable medium, at least temporarily, an article, such as information encoded into a carrier wave, embodying techniques of embodiments of the present disclosure.

In modern processors, a number of different execution units may be used to process and execute a variety of code and instructions. Some instructions may be quicker to complete while others may take a number of clock cycles to complete. The faster the throughput of instructions, the better the overall performance of the processor. Thus it would be advantageous to have as many instructions execute as fast as possible. However, there may be certain instructions that have greater complexity and require more in terms of execution time and processor resources, such as floating point instructions, load/store operations, data moves, etc.

As more computer systems are used in internet, text, and multimedia applications, additional processor support has been introduced over time. In one embodiment, an instruction set may be associated with one or more computer architectures, including data types, instructions, register architecture, addressing modes, memory architecture, interrupt and exception handling, and external input and output (I/O).

In one embodiment, the instruction set architecture (ISA) may be implemented by one or more micro-architectures, which may include processor logic and circuits used to implement one or more instruction sets. Accordingly, processors with different micro-architectures may share at least a portion of a common instruction set. For example, Intel® Pentium 4 processors, Intel® Core™ processors, and processors from Advanced Micro Devices, Inc. of Sunnyvale Calif. implement nearly identical versions of the x86 instruction set (with some extensions that have been added with newer versions), but have different internal designs. Similarly, processors designed by other processor development companies, such as ARM Holdings, Ltd., MIPS, or their licensees or adopters, may share at least a portion of a common instruction set, but may include different processor designs. For example, the same register architecture of the ISA may be implemented in different ways in different micro-architectures using new or well-known techniques, including dedicated physical registers, one or more dynamically allocated physical registers using a register renaming mechanism (e.g., the use of a Register Alias Table (RAT), a Reorder Buffer (ROB) and a retirement register file. In one embodiment, registers may include one or more registers, register architectures, register files, or other register sets that may or may not be addressable by a software programmer.

An instruction may include one or more instruction formats. In one embodiment, an instruction format may indicate various fields (number of bits, location of bits, etc.) to specify, among other things, the operation to be performed and the operands on which that operation will be performed. In a further embodiment, some instruction formats may be further defined by instruction templates (or sub-formats). For example, the instruction templates of a given instruction format may be defined to have different subsets of the instruction format's fields and/or defined to have a given field interpreted differently. In one embodiment, an instruction may be expressed using an instruction format (and, if defined, in a given one of the instruction templates of that instruction format) and specifies or indicates the operation and the operands upon which the operation will operate.

Scientific, financial, auto-vectorized general purpose, RMS (recognition, mining, and synthesis), and visual and multimedia applications (e.g., 2D/3D graphics, image processing, video compression/decompression, voice recognition algorithms and audio manipulation) may require the same operation to be performed on a large number of data items. In one embodiment, Single Instruction Multiple Data (SIMD) refers to a type of instruction that causes a processor to perform an operation on multiple data elements. SIMD technology may be used in processors that may logically divide the bits in a register into a number of fixed-sized or variable-sized data elements, each of which represents a separate value. For example, in one embodiment, the bits in a 64-bit register may be organized as a source operand containing four separate 16-bit data elements, each of which represents a separate 16-bit value. This type of data may be referred to as 'packed' data type or 'vector' data type, and operands of this data type may be referred to as packed data operands or vector operands. In one embodiment, a packed data item or vector may be a sequence of packed data elements stored within a single register, and a packed data operand or a vector operand may a source or destination operand of a SIMD instruction (or 'packed data instruction' or a 'vector instruction'). In one embodiment, a SIMD instruction specifies a single vector operation to be performed on two source vector operands to generate a destination vector operand (also referred to as a result vector operand) of the same or different size, with the same or different number of data elements, and in the same or different data element order.

SIMD technology, such as that employed by the Intel® Core™ processors having an instruction set including x86, MMX™, Streaming SIMD Extensions (SSE), SSE2, SSE3, SSE4.1, and SSE4.2 instructions, ARM processors, such as the ARM Cortex® family of processors having an instruction set including the Vector Floating Point (VFP) and/or NEON instructions, and MIPS processors, such as the Loongson family of processors developed by the Institute of Computing Technology (ICT) of the Chinese Academy of Sciences, has enabled a significant improvement in application performance (Core™ and MMX™ are registered trademarks or trademarks of Intel Corporation of Santa Clara, Calif.).

In one embodiment, destination and source registers/data may be generic terms to represent the source and destination of the corresponding data or operation. In some embodiments, they may be implemented by registers, memory, or other storage areas having other names or functions than those depicted. For example, in one embodiment, "DEST1" may be a temporary storage register or other storage area, whereas "SRC1" and "SRC2" may be a first and second source storage register or other storage area, and so forth. In other embodiments, two or more of the SRC and DEST storage areas may correspond to different data storage elements within the same storage area (e.g., a SIMD register). In one embodiment, one of the source registers may also act as a destination register by, for example, writing back the result of an operation performed on the first and second source data to one of the two source registers serving as a destination registers.

FIG. 1A is a block diagram of an exemplary computer system formed with a processor that may include execution units to execute an instruction, in accordance with embodiments of the present disclosure. System 100 may include a component, such as a processor 102 to employ execution units including logic to perform algorithms for process data, in accordance with the present disclosure, such as in the embodiment described herein. System 100 may be representative of processing systems based on the PENTIUM® III, PENTIUM® 4, Xeon™, Itanium®, XScale™ and/or StrongARM™ microprocessors available from Intel Corporation of Santa Clara, Calif., although other systems (including PCs having other microprocessors, engineering workstations, set-top boxes and the like) may also be used. In one embodiment, sample system 100 may execute a version of the WINDOWS™ operating system available from Microsoft Corporation of Redmond, Wash., although other operating systems (UNIX and Linux for example), embedded software, and/or graphical user interfaces, may also be used. Thus, embodiments of the present disclosure are not limited to any specific combination of hardware circuitry and software.

Embodiments are not limited to computer systems. Embodiments of the present disclosure may be used in other devices such as handheld devices and embedded applications. Some examples of handheld devices include cellular phones, Internet Protocol devices, digital cameras, personal digital assistants (PDAs), and handheld PCs. Embedded applications may include a micro controller, a digital signal processor (DSP), system on a chip, network computers (NetPC), set-top boxes, network hubs, wide area network (WAN) switches, or any other system that may perform one or more instructions in accordance with at least one embodiment.

Computer system 100 may include a processor 102 that may include one or more execution units 108 to perform an algorithm to perform at least one instruction in accordance with one embodiment of the present disclosure. One embodiment may be described in the context of a single processor desktop or server system, but other embodiments may be included in a multiprocessor system. System 100 may be an example of a 'hub' system architecture. System 100 may include a processor 102 for processing data signals. Processor 102 may include a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. In one embodiment, processor 102 may be coupled to a processor bus 110 that may transmit data signals between processor 102 and other components in system 100. The elements of system 100 may perform conventional functions that are well known to those familiar with the art.

In one embodiment, processor 102 may include a Level 1 (L1) internal cache memory 104. Depending on the architecture, the processor 102 may have a single internal cache or multiple levels of internal cache. In another embodiment, the cache memory may reside external to processor 102. Other embodiments may also include a combination of both internal and external caches depending on the particular implementation and needs. Register file 106 may store different types of data in various registers including integer registers, floating point registers, status registers, and instruction pointer register.

Execution unit 108, including logic to perform integer and floating point operations, also resides in processor 102. Processor 102 may also include a microcode (ucode) ROM that stores microcode for certain macroinstructions. In one embodiment, execution unit 108 may include logic to handle a packed instruction set 109. By including the packed instruction set 109 in the instruction set of a general-purpose processor 102, along with associated circuitry to execute the instructions, the operations used by many multimedia applications may be performed using packed data in a general-purpose processor 102. Thus, many multimedia applications may be accelerated and executed more efficiently by using the full width of a processor's data bus for performing operations on packed data. This may eliminate the need to transfer smaller units of data across the processor's data bus to perform one or more operations one data element at a time.

Embodiments of an execution unit 108 may also be used in micro controllers, embedded processors, graphics devices, DSPs, and other types of logic circuits. System 100 may include a memory 120. Memory 120 may be implemented as a dynamic random access memory (DRAM) device, a static random access memory (SRAM) device, flash memory device, or other memory device. Memory 120 may store instructions 119 and/or data 121 represented by data signals that may be executed by processor 102.

A system logic chip 116 may be coupled to processor bus 110 and memory 120. System logic chip 116 may include a memory controller hub (MCH). Processor 102 may communicate with MCH 116 via a processor bus 110. MCH 116 may provide a high bandwidth memory path 118 to memory 120 for storage of instructions 119 and data 121 and for storage of graphics commands, data and textures. MCH 116 may direct data signals between processor 102, memory 120, and other components in system 100 and to bridge the data signals between processor bus 110, memory 120, and system I/O 122. In some embodiments, the system logic chip 116 may provide a graphics port for coupling to a graphics controller 112. MCH 116 may be coupled to memory 120 through a memory interface 118. Graphics card 112 may be coupled to MCH 116 through an Accelerated Graphics Port (AGP) interconnect 114.

System 100 may use a proprietary hub interface bus 122 to couple MCH 116 to I/O controller hub (ICH) 130. In one embodiment, ICH 130 may provide direct connections to some I/O devices via a local I/O bus. The local I/O bus may include a high-speed I/O bus for connecting peripherals to memory 120, chipset, and processor 102. Examples may include the audio controller 129, firmware hub (flash BIOS) 128, wireless transceiver 126, data storage 124, legacy I/O controller 123 containing user input interface 125 (which may include a keyboard interface), a serial expansion port 127 such as Universal Serial Bus (USB), and a network controller 134. Data storage device 124 may comprise a hard disk drive, a floppy disk drive, a CD-ROM device, a flash memory device, or other mass storage device.

For another embodiment of a system, an instruction in accordance with one embodiment may be used with a system on a chip. One embodiment of a system on a chip comprises of a processor and a memory. The memory for one such system may include a flash memory. The flash memory may be located on the same die as the processor and other system components. Additionally, other logic blocks such as a memory controller or graphics controller may also be located on a system on a chip.

Figure 1B:
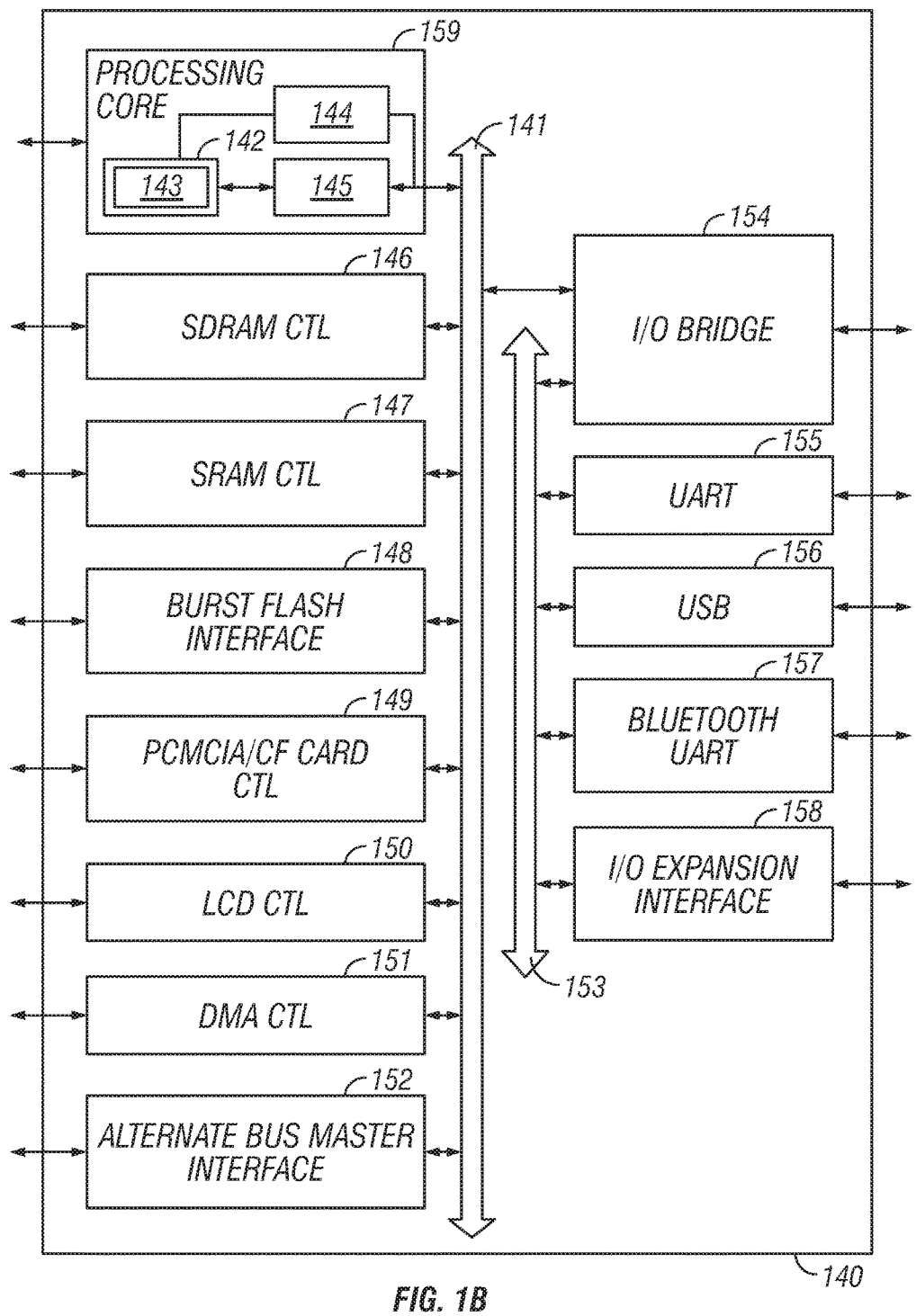
FIG. 1B illustrates a data processing system, in accordance with embodiments of the present disclosure.

FIG. 1B illustrates a data processing system 140 which implements the principles of embodiments of the present disclosure. It will be readily appreciated by one of skill in the art that the embodiments described herein may operate with alternative processing systems without departure from the scope of embodiments of the disclosure.

Computer system 140 comprises a processing core 159 for performing at least one instruction in accordance with one embodiment. In one embodiment, processing core 159 represents a processing unit of any type of architecture, including but not limited to a CISC, a RISC or a VLIW type architecture. Processing core 159 may also be suitable for manufacture in one or more process technologies and by being represented on a machine-readable media in sufficient detail, may be suitable to facilitate said manufacture.

Processing core 159 comprises an execution unit 142, a set of register files 145, and a decoder 144. Processing core 159 may also include additional circuitry (not shown) which may be unnecessary to the understanding of embodiments of the present disclosure. Execution unit 142 may execute instructions received by processing core 159. In addition to performing typical processor instructions, execution unit 142 may perform instructions in packed instruction set 143 for performing operations on packed data formats. Packed instruction set 143 may include instructions for performing embodiments of the disclosure and other packed instructions. Execution unit 142 may be coupled to register file 145 by an internal bus. Register file 145 may represent a storage area on processing core 159 for storing information, including data. As previously mentioned, it is understood that the storage area may store the packed data might not be critical. Execution unit 142 may be coupled to decoder 144. Decoder 144 may decode instructions received by processing core 159 into control signals and/or microcode entry points. In response to these control signals and/or microcode entry points, execution unit 142 performs the appropriate operations. In one embodiment, the decoder may interpret the opcode of the instruction, which will indicate what operation should be performed on the corresponding data indicated within the instruction.

Processing core 159 may be coupled with bus 141 for communicating with various other system devices, which may include but are not limited to, for example, synchronous dynamic random access memory (SDRAM) control 146, static random access memory (SRAM) control 147, burst flash memory interface 148, personal computer memory card international association (PCMCIA)/compact flash (CF) card control 149, liquid crystal display (LCD) control 150, direct memory access (DMA) controller 151, and alternative bus master interface 152. In one embodiment, data processing system 140 may also comprise an I/O bridge 154 for communicating with various I/O devices via an I/O bus 153. Such I/O devices may include but are not limited to, for example, universal asynchronous receiver/transmitter (UART) 155, universal serial bus (USB) 156, Bluetooth wireless UART 157 and I/O expansion interface 158.

One embodiment of data processing system 140 provides for mobile, network and/or wireless communications and a processing core 159 that may perform SIMD operations including a text string comparison operation. Processing core 159 may be programmed with various audio, video, imaging and communications algorithms including discrete transformations such as a Walsh-Hadamard transform, a fast Fourier transform (FFT), a discrete cosine transform (DCT), and their respective inverse transforms; compression/decompression techniques such as color space transformation, video encode motion estimation or video decode motion compensation; and modulation/demodulation (MODEM) functions such as pulse coded modulation (PCM).

Figure 1C:
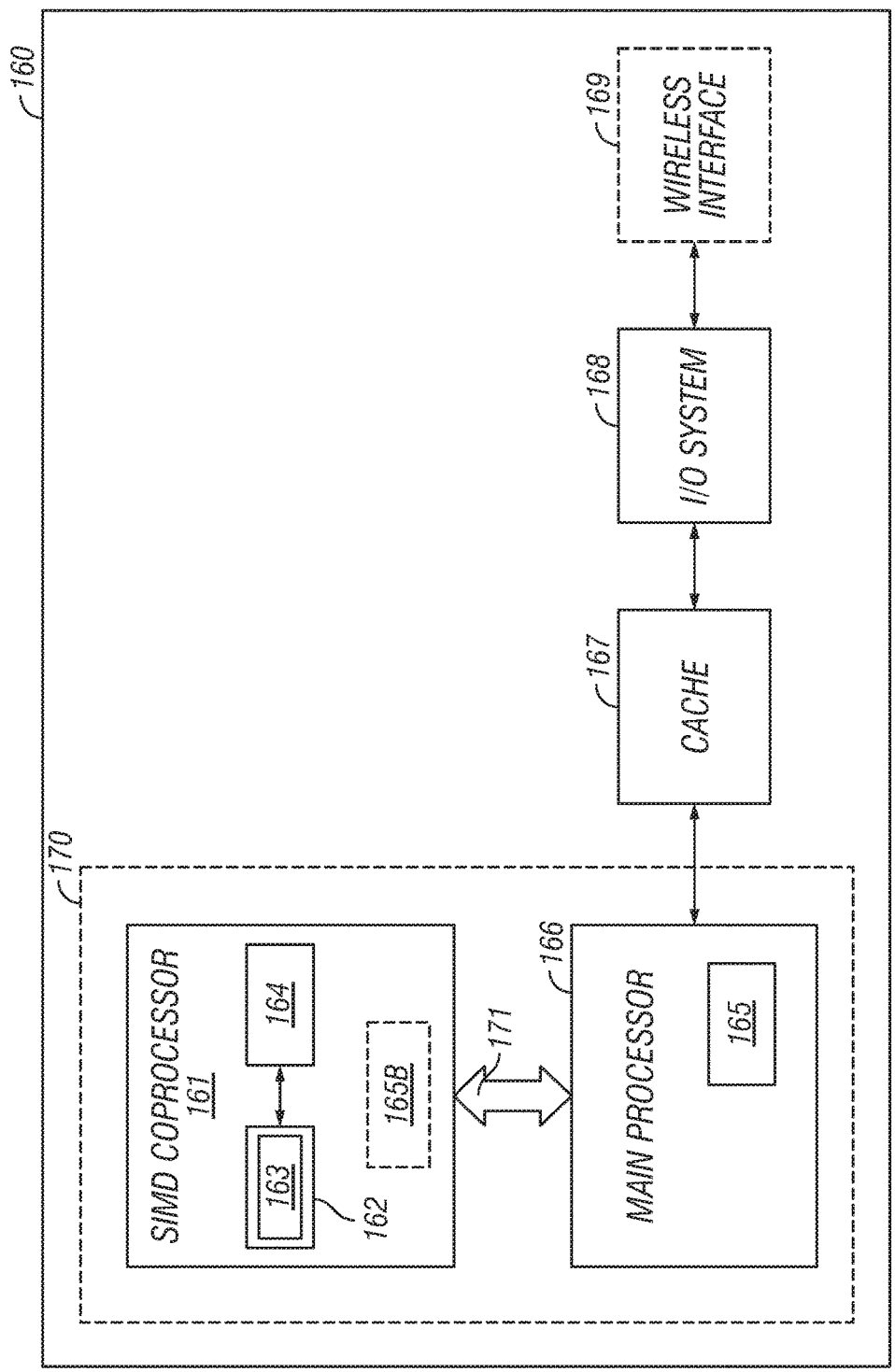
FIG. 1C illustrates other embodiments of a data processing system for performing text string comparison operations.

FIG. 1C illustrates other embodiments of a data processing system that performs SIMD text string comparison operations. In one embodiment, data processing system 160 may include a main processor 166, a SIMD coprocessor 161, a cache memory 167, and an input/output system 168. Input/output system 168 may optionally be coupled to a wireless interface 169. SIMD coprocessor 161 may perform operations including instructions in accordance with one embodiment. In one embodiment, processing core 170 may be suitable for manufacture in one or more process technologies and by being represented on a machine-readable media in sufficient detail, may be suitable to facilitate the manufacture of all or part of data processing system 160 including processing core 170.

In one embodiment, SIMD coprocessor 161 comprises an execution unit 162 and a set of register files 164. One embodiment of main processor 166 comprises a decoder 165 to recognize instructions of instruction set 163 including instructions in accordance with one embodiment for execution by execution unit 162. In other embodiments, SIMD coprocessor 161 also comprises at least part of decoder 165 (shown as 165B) to decode instructions of instruction set 163. Processing core 170 may also include additional circuitry (not shown) which may be unnecessary to the understanding of embodiments of the present disclosure.

In operation, main processor 166 executes a stream of data processing instructions that control data processing operations of a general type including interactions with cache memory 167, and input/output system 168. Embedded within the stream of data processing instructions may be SIMD coprocessor instructions. Decoder 165 of main processor 166 recognizes these SIMD coprocessor instructions as being of a type that should be executed by an attached SIMD coprocessor 161. Accordingly, main processor 166 issues these SIMD coprocessor instructions (or control signals representing SIMD coprocessor instructions) on the coprocessor bus 171. From coprocessor bus 171, these instructions may be received by any attached SIMD coprocessors. In this case, SIMD coprocessor 161 may accept and execute any received SIMD coprocessor instructions intended for it.

Data may be received via wireless interface 169 for processing by the SIMD coprocessor instructions. For one example, voice communication may be received in the form of a digital signal, which may be processed by the SIMD coprocessor instructions to regenerate digital audio samples representative of the voice communications. For another example, compressed audio and/or video may be received in the form of a digital bit stream, which may be processed by the SIMD coprocessor instructions to regenerate digital audio samples and/or motion video frames. In one embodiment of processing core 170, main processor 166, and a SIMD coprocessor 161 may be integrated into a single processing core 170 comprising an execution unit 162, a set of register files 164, and a decoder 165 to recognize instructions of instruction set 163 including instructions in accordance with one embodiment.

Figure 2:
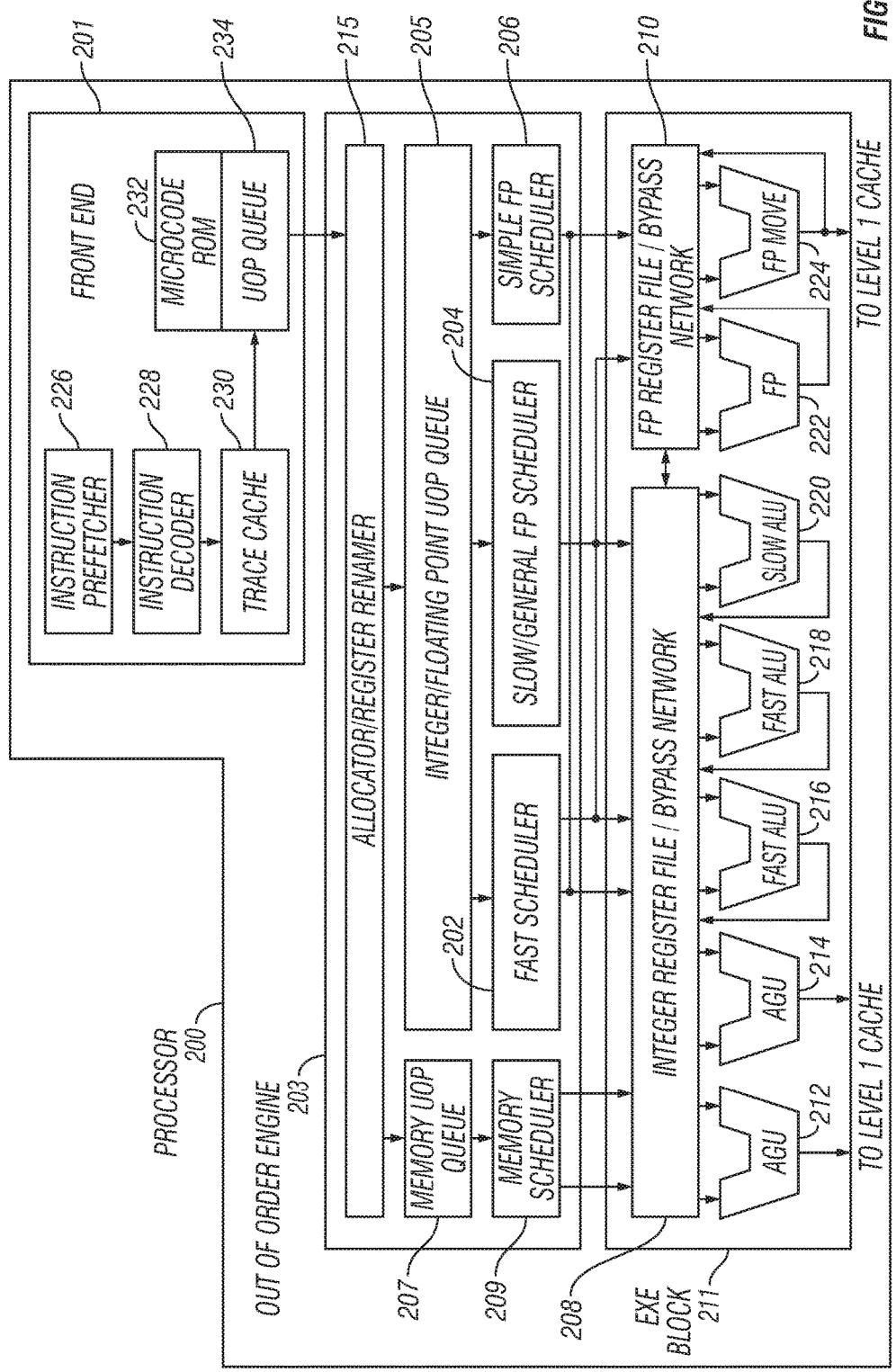
FIG. 2 is a block diagram of the micro-architecture for a processor that may include logic circuits to perform instructions, in accordance with embodiments of the present disclosure.

FIG. 2 is a block diagram of the micro-architecture for a processor 200 that may include logic circuits to perform instructions, in accordance with embodiments of the present disclosure. In some embodiments, an instruction in accordance with one embodiment may be implemented to operate on data elements having sizes of byte, word, doubleword, quadword, etc., as well as datatypes, such as single and double precision integer and floating point datatypes. In one embodiment, in-order front end 201 may implement a part of processor 200 that may fetch instructions to be executed and prepares the instructions to be used later in the processor pipeline. Front end 201 may include several units. In one embodiment, instruction prefetcher 226 fetches instructions from memory and feeds the instructions to an instruction decoder 228 which in turn decodes or interprets the instructions. For example, in one embodiment, the decoder decodes a received instruction into one or more operations called "micro-instructions" or "micro-operations" (also called micro op or uops) that the machine may execute. In other embodiments, the decoder parses the instruction into an opcode and corresponding data and control fields that may be used by the micro-architecture to perform operations in accordance with one embodiment. In one embodiment, trace cache 230 may assemble decoded uops into program ordered sequences or traces in uop queue 234 for execution. When trace cache 230 encounters a complex instruction, microcode ROM 232 provides the uops needed to complete the operation.

Some instructions may be converted into a single micro-op, whereas others need several micro-ops to complete the full operation. In one embodiment, if more than four micro-ops are needed to complete an instruction, decoder 228 may access microcode ROM 232 to perform the instruction. In one embodiment, an instruction may be decoded into a small number of micro ops for processing at instruction decoder 228. In another embodiment, an instruction may be stored within microcode ROM 232 should a number of micro-ops be needed to accomplish the operation. Trace cache 230 refers to an entry point programmable logic array (PLA) to determine a correct micro-instruction pointer for reading the micro-code sequences to complete one or more instructions in accordance with one embodiment from micro-code ROM 232. After microcode ROM 232 finishes sequencing micro-ops for an instruction, front end 201 of the machine may resume fetching micro-ops from trace cache 230.

Out-of-order execution engine 203 may prepare instructions for execution. The out-of-order execution logic has a number of buffers to smooth out and re-order the flow of instructions to optimize performance as they go down the pipeline and get scheduled for execution. The allocator logic in allocator/register renamer 215 allocates the machine buffers and resources that each uop needs in order to execute. The register renaming logic in allocator/register renamer 215 renames logic registers onto entries in a register file. The allocator 215 also allocates an entry for each uop in one of the two uop queues, one for memory operations (memory uop queue 207) and one for non-memory operations (integer/floating point uop queue 205), in front of the instruction schedulers: memory scheduler 209, fast scheduler 202, slow/general floating point scheduler 204, and simple floating point scheduler 206. Uop schedulers 202, 204, 206, determine when a uop is ready to execute based on the readiness of their dependent input register operand sources and the availability of the execution resources the uops need to complete their operation. Fast scheduler 202 of one embodiment may schedule on each half of the main clock cycle while the other schedulers may only schedule once per main processor clock cycle. The schedulers arbitrate for the dispatch ports to schedule uops for execution.

Register files 208, 210 may be arranged between schedulers 202, 204, 206, and execution units 212, 214, 216, 218, 220, 222, 224 in execution block 211. Each of register files 208, 210 perform integer and floating point operations, respectively. Each register file 208, 210, may include a bypass network that may bypass or forward just completed results that have not yet been written into the register file to new dependent uops. Integer register file 208 and floating point register file 210 may communicate data with the other. In one embodiment, integer register file 208 may be split into two separate register files, one register file for low-order thirty-two bits of data and a second register file for high order thirty-two bits of data. Floating point register file 210 may include 128-bit wide entries because floating point instructions typically have operands from 64 to 128 bits in width.

Execution block 211 may contain execution units 212, 214, 216, 218, 220, 222, 224. Execution units 212, 214, 216, 218, 220, 222, 224 may execute the instructions. Execution block 211 may include register files 208, 210 that store the integer and floating point data operand values that the micro-instructions need to execute. In one embodiment, processor 200 may comprise a number of execution units: address generation unit (AGU) 212, AGU 214, fast ALU 216, fast ALU 218, slow ALU 220, floating point ALU 222, floating point move unit 224. In another embodiment, floating point execution blocks 222, 224, may execute floating point, MMX, SIMD, and SSE, or other operations. In yet another embodiment, floating point ALU 222 may include a 64-bit by 64-bit floating point divider to execute divide, square root, and remainder micro-ops. In various embodiments, instructions involving a floating point value may be handled with the floating point hardware. In one embodiment, ALU operations may be passed to high-speed ALU execution units 216, 218. High-speed ALUs 216, 218 may execute fast operations with an effective latency of half a clock cycle. In one embodiment, most complex integer operations go to slow ALU 220 as slow ALU 220 may include integer execution hardware for long-latency type of operations, such as a multiplier, shifts, flag logic, and branch processing. Memory load/store operations may be executed by AGUs 212, 214. In one embodiment, integer ALUs 216, 218, 220 may perform integer operations on 64-bit data operands. In other embodiments, ALUs 216, 218, 220 may be implemented to support a variety of data bit sizes including sixteen, thirty-two, 128, 256, etc. Similarly, floating point units 222, 224 may be implemented to support a range of operands having bits of various widths. In one embodiment, floating point units 222, 224, may operate on 128-bit wide packed data operands in conjunction with SIMD and multimedia instructions.

In one embodiment, uops schedulers 202, 204, 206, dispatch dependent operations before the parent load has finished executing. As uops may be speculatively scheduled and executed in processor 200, processor 200 may also include logic to handle memory misses. If a data load misses in the data cache, there may be dependent operations in flight in the pipeline that have left the scheduler with temporarily incorrect data. A replay mechanism tracks and re-executes instructions that use incorrect data. Only the dependent operations might need to be replayed and the independent ones may be allowed to complete. The schedulers and replay mechanism of one embodiment of a processor may also be designed to catch instruction sequences for text string comparison operations.

The term "registers" may refer to the on-board processor storage locations that may be used as part of instructions to identify operands. In other words, registers may be those that may be usable from the outside of the processor (from a programmer's perspective). However, in some embodiments registers might not be limited to a particular type of circuit. Rather, a register may store data, provide data, and perform the functions described herein. The registers described herein may be implemented by circuitry within a processor using any number of different techniques, such as dedicated physical registers, dynamically allocated physical registers using register renaming, combinations of dedicated and dynamically allocated physical registers, etc. In one embodiment, integer registers store 32-bit integer data. A register file of one embodiment also contains eight multimedia SIMD registers for packed data. For the discussions below, the registers may be understood to be data registers designed to hold packed data, such as 64-bit wide MMX™ registers (also referred to as 'mm' registers in some instances) in microprocessors enabled with MMX technology from Intel Corporation of Santa Clara, Calif. These MMX registers, available in both integer and floating point forms, may operate with packed data elements that accompany SIMD and SSE instructions. Similarly, 128-bit wide XMM registers relating to SSE2, SSE3, SSE4, or beyond (referred to generically as "SSEx") technology may hold such packed data operands. In one embodiment, in storing packed data and integer data, the registers do not need to differentiate between the two data types. In one embodiment, integer and floating point data may be contained in the same register file or different register files. Furthermore, in one embodiment, floating point and integer data may be stored in different registers or the same registers.

In the examples of the following figures, a number of data operands may be described. FIG. 3A illustrates various packed data type representations in multimedia registers, in accordance with embodiments of the present disclosure. FIG. 3A illustrates data types for a packed byte 310, a packed word 320, and a packed doubleword (dword) 330 for 128-bit wide operands. Packed byte format 310 of this example may be 128 bits long and contains sixteen packed byte data elements. A byte may be defined, for example, as eight bits of data. Information for each byte data element may be stored in bit 7 through bit 0 for byte 0, bit 15 through bit 8 for byte 1, bit 23 through bit 16 for byte 2, and finally bit 120 through bit 127 for byte 15. Thus, all available bits may be used in the register. This storage arrangement increases the storage efficiency of the processor. As well, with sixteen data elements accessed, one operation may now be performed on sixteen data elements in parallel.

Generally, a data element may include an individual piece of data that is stored in a single register or memory location with other data elements of the same length. In packed data sequences relating to SSEx technology, the number of data elements stored in a XMM register may be 128 bits divided by the length in bits of an individual data element. Similarly, in packed data sequences relating to MINIX and SSE technology, the number of data elements stored in an MMX register may be 64 bits divided by the length in bits of an individual data element. Although the data types illustrated in FIG. 3A may be 128 bits long, embodiments of the present disclosure may also operate with 64-bit wide or other sized operands. Packed word format 320 of this example may be 128 bits long and contains eight packed word data elements. Each packed word contains sixteen bits of information. Packed doubleword format 330 of FIG. 3A may be 128 bits long and contains four packed doubleword data elements. Each packed doubleword data element contains thirty-two bits of information. A packed quadword may be 128 bits long and contain two packed quad-word data elements.

FIG. 3B illustrates possible in-register data storage formats, in accordance with embodiments of the present disclosure. Each packed data may include more than one independent data element. Three packed data formats are illustrated; packed half 341, packed single 342, and packed double 343. One embodiment of packed half 341, packed single 342, and packed double 343 contain fixed-point data elements. For another embodiment one or more of packed half 341, packed single 342, and packed double 343 may contain floating-point data elements. One embodiment of packed half 341 may be 128 bits long containing eight 16-bit data elements. One embodiment of packed single 342 may be 128 bits long and contains four 32-bit data elements. One embodiment of packed double 343 may be 128 bits long and contains two 64-bit data elements. It will be appreciated that such packed data formats may be further extended to other register lengths, for example, to 96-bits, 160-bits, 192-bits, 224-bits, 256-bits or more.

FIG. 3C illustrates various signed and unsigned packed data type representations in multimedia registers, in accordance with embodiments of the present disclosure. Unsigned packed byte representation 344 illustrates the storage of an unsigned packed byte in a SIMD register. Information for each byte data element may be stored in bit 7 through bit 0 for byte 0, bit 15 through bit 8 for byte 1, bit 23 through bit 16 for byte 2, and finally bit 120 through bit 127 for byte 15. Thus, all available bits may be used in the register. This storage arrangement may increase the storage efficiency of the processor. As well, with sixteen data elements accessed, one operation may now be performed on sixteen data elements in a parallel fashion. Signed packed byte representation 345 illustrates the storage of a signed packed byte. Note that the eighth bit of every byte data element may be the sign indicator. Unsigned packed word representation 346 illustrates how word seven through word zero may be stored in a SIMD register. Signed packed word representation 347 may be similar to the unsigned packed word in-register representation 346. Note that the sixteenth bit of each word data element may be the sign indicator. Unsigned packed doubleword representation 348 shows how doubleword data elements are stored. Signed packed doubleword representation 349 may be similar to unsigned packed doubleword in-register representation 348. Note that the necessary sign bit may be the thirty-second bit of each doubleword data element.

Figure 3D:
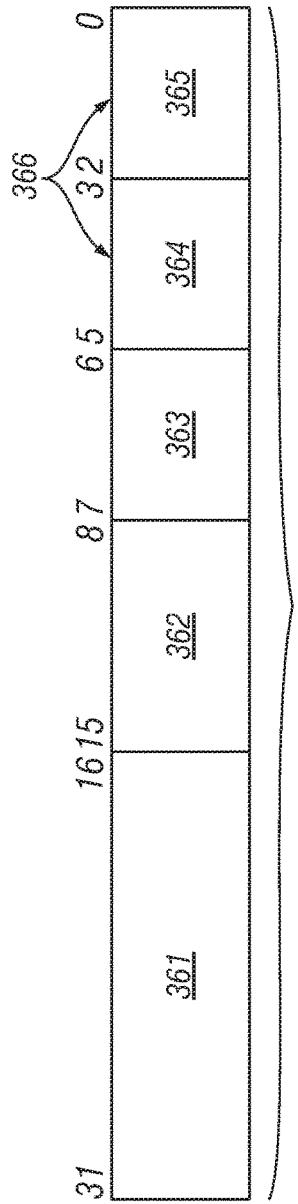
FIG. 3D illustrates an embodiment of an operation encoding format.

FIG. 3D illustrates an embodiment of an operation encoding (opcode). Furthermore, format 360 may include register/memory operand addressing modes corresponding with a type of opcode format described in the "IA-32 Intel Architecture Software Developer's Manual Volume 2: Instruction Set Reference," which is available from Intel Corporation, Santa Clara, Calif. on the world-wide-web (www) at intel-.com/design/litcentr. In one embodiment, an instruction may be encoded by one or more of fields 361 and 362. Up to two operand locations per instruction may be identified, including up to two source operand identifiers 364 and 365. In one embodiment, destination operand identifier 366 may be the same as source operand identifier 364, whereas in other embodiments they may be different. In another embodiment, destination operand identifier 366 may be the same as source operand identifier 365, whereas in other embodiments they may be different. In one embodiment, one of the source operands identified by source operand identifiers 364 and 365 may be overwritten by the results of the text string comparison operations, whereas in other embodiments identifier 364 corresponds to a source register element and identifier 365 corresponds to a destination register element. In one embodiment, operand identifiers 364 and 365 may identify 32-bit or 64-bit source and destination operands.

Figure 3E:
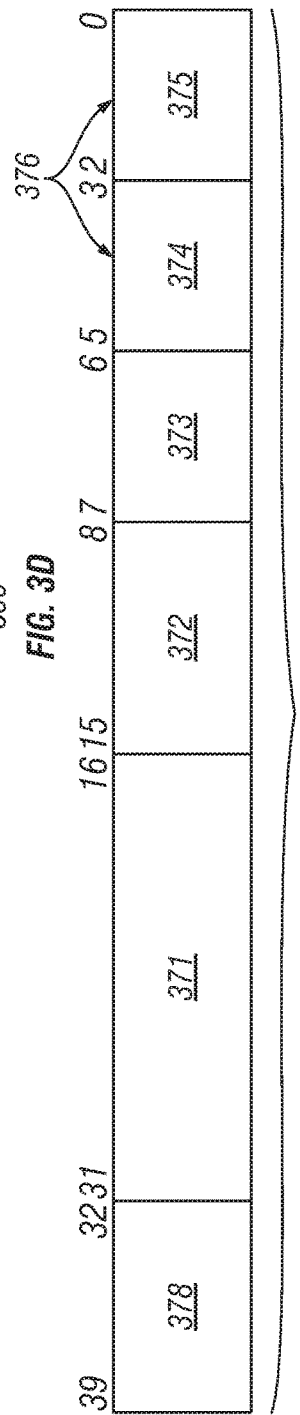
FIG. 3E illustrates another possible operation encoding format having forty or more bits, in accordance with embodiments of the present disclosure.

FIG. 3E illustrates another possible operation encoding (opcode) format 370, having forty or more bits, in accordance with embodiments of the present disclosure. Opcode format 370 corresponds with opcode format 360 and comprises an optional prefix byte 378. An instruction according to one embodiment may be encoded by one or more of fields 378, 371, and 372. Up to two operand locations per instruction may be identified by source operand identifiers 374 and 375 and by prefix byte 378. In one embodiment, prefix byte 378 may be used to identify 32-bit or 64-bit source and destination operands. In one embodiment, destination operand identifier 376 may be the same as source operand identifier 374, whereas in other embodiments they may be different. For another embodiment, destination operand identifier 376 may be the same as source operand identifier 375, whereas in other embodiments they may be different. In one embodiment, an instruction operates on one or more of the operands identified by operand identifiers 374 and 375 and one or more operands identified by operand identifiers 374 and 375 may be overwritten by the results of the instruction, whereas in other embodiments, operands identified by identifiers 374 and 375 may be written to another data element in another register. Opcode formats 360 and 370 allow register to register, memory to register, register by memory, register by register, register by immediate, register to memory addressing specified in part by MOD fields 363 and 373 and by optional scale-index-base and displacement bytes.

Figure 3F:
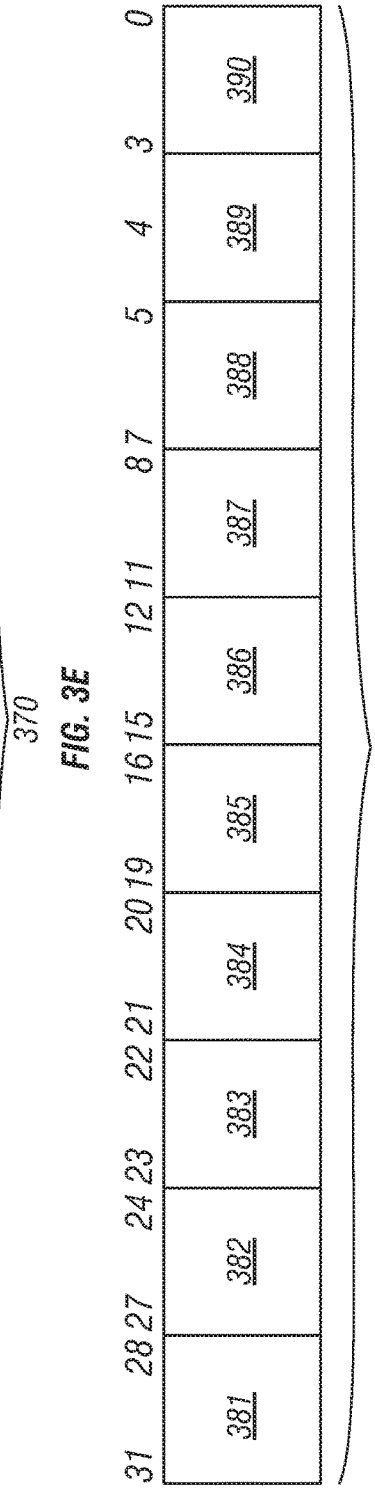
FIG. 3F illustrates yet another possible operation encoding format, in accordance with embodiments of the present disclosure.

FIG. 3F illustrates yet another possible operation encoding (opcode) format, in accordance with embodiments of the present disclosure. 64-bit single instruction multiple data (SIMD) arithmetic operations may be performed through a coprocessor data processing (CDP) instruction. Operation encoding (opcode) format 380 depicts one such CDP instruction having CDP opcode fields 382 and 389. The type of CDP instruction, for another embodiment, operations may be encoded by one or more of fields 383, 384, 387, and 388. Up to three operand locations per instruction may be identified, including up to two source operand identifiers 385 and 390 and one destination operand identifier 386. One embodiment of the coprocessor may operate on eight, sixteen, thirty-two, and 64-bit values. In one embodiment, an instruction may be performed on integer data elements. In some embodiments, an instruction may be executed conditionally, using condition field 381. For some embodiments, source data sizes may be encoded by field 383. In some embodiments, Zero (Z), negative (N), carry (C), and overflow (V) detection may be done on SIMD fields. For some instructions, the type of saturation may be encoded by field 384.

Figure 4A:
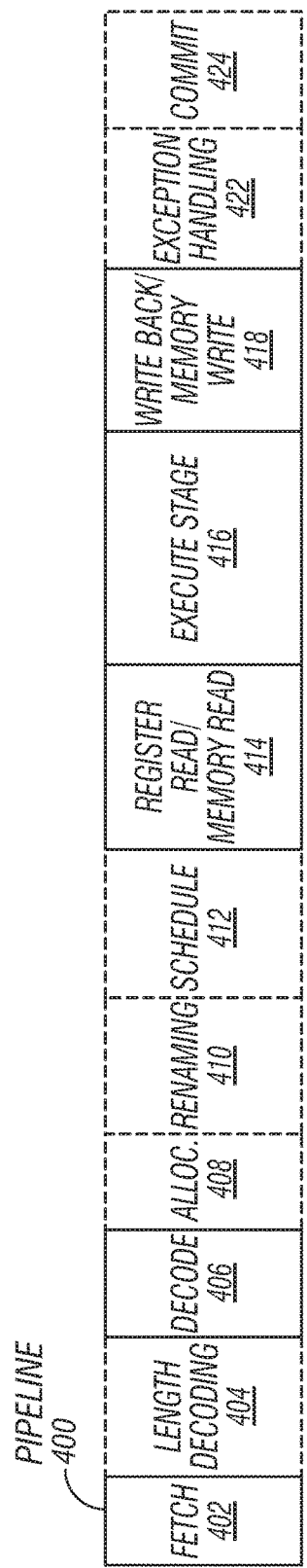
FIG. 4A is a block diagram illustrating an in-order pipeline and a register renaming stage, out-of-order issue/execution pipeline, in accordance with embodiments of the present disclosure.
Figure 4B:
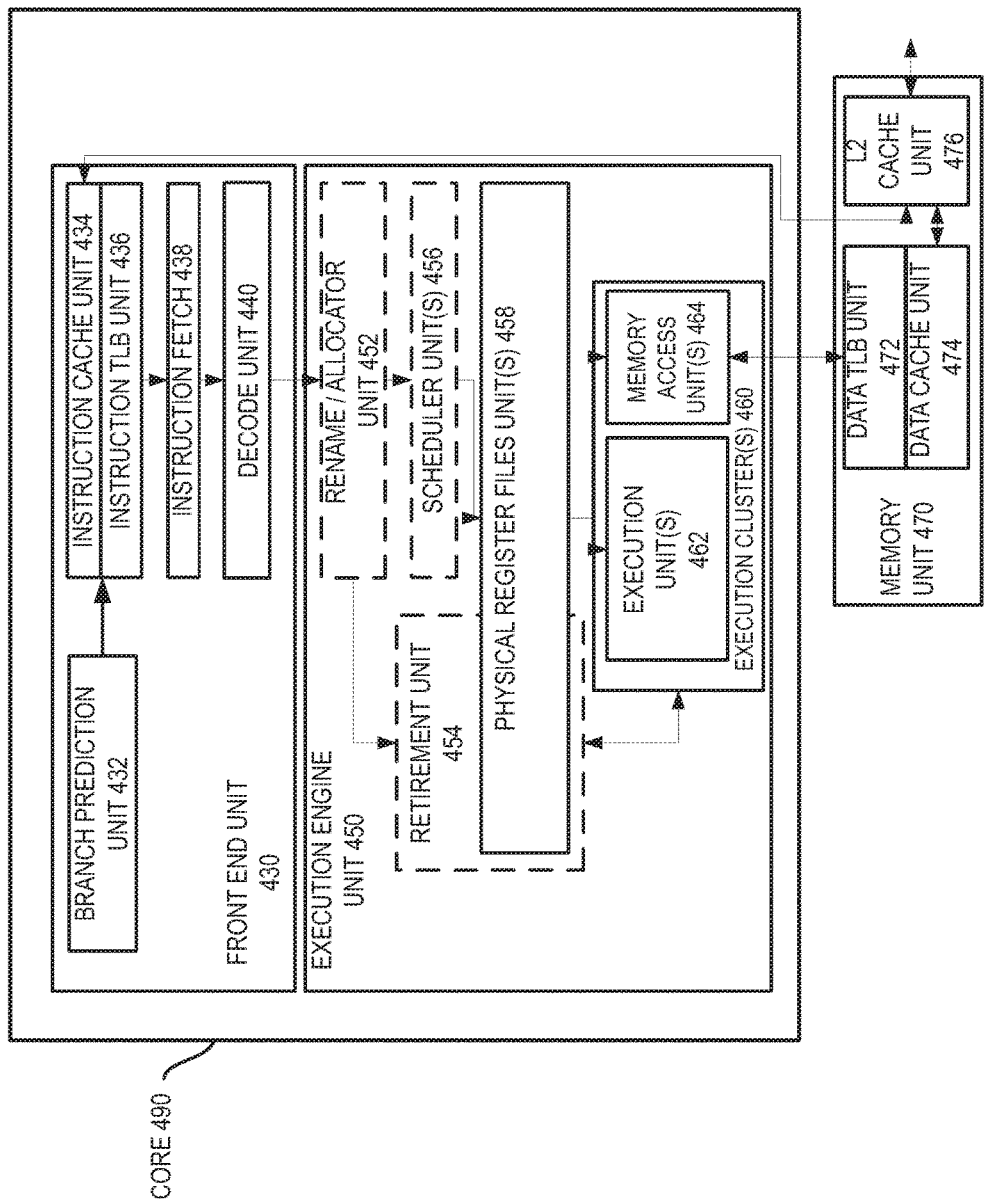
FIG. 4B is a block diagram illustrating an in-order architecture core and a register renaming logic, out-of-order issue/execution logic to be included in a processor, in accordance with embodiments of the present disclosure.

FIG. 4A is a block diagram illustrating an in-order pipeline and a register renaming stage, out-of-order issue/execution pipeline, in accordance with embodiments of the present disclosure. FIG. 4B is a block diagram illustrating an in-order architecture core and a register renaming logic, out-of-order issue/execution logic to be included in a processor, in accordance with embodiments of the present disclosure. The solid lined boxes in FIG. 4A illustrate the in-order pipeline, while the dashed lined boxes illustrates the register renaming, out-of-order issue/execution pipeline. Similarly, the solid lined boxes in FIG. 4B illustrate the in-order architecture logic, while the dashed lined boxes illustrates the register renaming logic and out-of-order issue/execution logic.

In FIG. 4A, a processor pipeline 400 may include a fetch stage 402, a length decode stage 404, a decode stage 406, an allocation stage 408, a renaming stage 410, a scheduling (also known as a dispatch or issue) stage 412, a register read/memory read stage 414, an execute stage 416, a write-back/memory-write stage 418, an exception handling stage 422, and a commit stage 424.

In FIG. 4B, arrows denote a coupling between two or more units and the direction of the arrow indicates a direction of data flow between those units. FIG. 4B shows processor 490 including a front end unit 430 coupled to an execution engine unit 450, and both may be coupled to a memory unit 470.

Processor 490 may implement a reduced instruction set computing (RISC) core, a complex instruction set computing (CISC) core, a very long instruction word (VLIW) core, or a hybrid or alternative core type. In one embodiment, processor 490 may implement a special-purpose core, such as, for example, a network or communication core, compression engine, graphics core, or the like.

Front end unit 430 may include a branch prediction unit 432 coupled to an instruction cache unit 434. Instruction cache unit 434 may be coupled to an instruction translation lookaside buffer (TLB) 436. TLB 436 may be coupled to an instruction fetch unit 438, which is coupled to a decode unit 440. Decode unit 440 may decode instructions, and generate as an output one or more micro-operations, micro-code entry points, microinstructions, other instructions, or other control signals, which may be decoded from, or which otherwise reflect, or may be derived from, the original instructions. The decoder may be implemented using various different mechanisms. Examples of suitable mechanisms include, but are not limited to, look-up tables, hardware implementations, programmable logic arrays (PLAs), microcode read-only memories (ROMs), etc. In one embodiment, instruction cache unit 434 may be further coupled to a level 2 (L2) cache unit 476 in memory unit 470. Decode unit 440 may be coupled to a rename/allocator unit 452 in execution engine unit 450.

Execution engine unit 450 may include rename/allocator unit 452 coupled to a retirement unit 454 and a set of one or more scheduler units 456. Scheduler units 456 represent any number of different schedulers, including reservations stations, central instruction window, etc. Scheduler units 456 may be coupled to physical register file units 458. Each of physical register file units 458 represents one or more physical register files, different ones of which store one or more different data types, such as scalar integer, scalar floating point, packed integer, packed floating point, vector integer, vector floating point, etc., status (e.g., an instruction pointer that is the address of the next instruction to be executed), etc. Physical register file units 458 may be overlapped by retirement unit 454 to illustrate various ways in which register renaming and out-of-order execution may be implemented (e.g., using one or more reorder buffers and one or more retirement register files, using one or more future files, one or more history buffers, and one or more retirement register files; using register maps and a pool of registers; etc.). Generally, the architectural registers may be visible from the outside of the processor or from a programmer's perspective. The registers might not be limited to any known particular type of circuit. Various different types of registers may be suitable as long as they store and provide data as described herein. Examples of suitable registers include, but might not be limited to, dedicated physical registers, dynamically allocated physical registers using register renaming, combinations of dedicated and dynamically allocated physical registers, etc. Retirement unit 454 and physical register file units 458 may be coupled to execution clusters 460. Execution clusters 460 may include a set of one or more execution units 462 and a set of one or more memory access units 464. Execution units 462 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. Scheduler units 456, physical register file units 458, and execution clusters 460 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file unit, and/or execution cluster—and in the case of a separate memory access pipeline, certain embodiments may be implemented in which only the execution cluster of this pipeline has memory access units 464). It should also be understood that where separate pipelines are used, one or more of these pipelines may be out-of-order issue/execution and the rest in-order.

The set of memory access units 464 may be coupled to memory unit 470, which may include a data TLB unit 472 coupled to a data cache unit 474 coupled to a level 2 (L2) cache unit 476. In one exemplary embodiment, memory access units 464 may include a load unit, a store address unit, and a store data unit, each of which may be coupled to data TLB unit 472 in memory unit 470. L2 cache unit 476 may be coupled to one or more other levels of cache and eventually to a main memory. While FIG. 4B illustrates an embodiment in which instruction cache unit 434, data cache unit 474, and level 2 (L2) cache unit 476 reside within core 490, in other embodiments one or more caches or cache units may be internal to a core, external to a core, or apportioned internal to and external to a core in different combinations.

By way of example, the exemplary register renaming, out-of-order issue/execution core architecture may implement pipeline 400 as follows: 1) instruction fetch 438 may perform fetch and length decoding stages 402 and 404; 2) decode unit 440 may perform decode stage 406; 3) rename/allocator unit 452 may perform allocation stage 408 and renaming stage 410; 4) scheduler units 456 may perform schedule stage 412; 5) physical register file units 458 and memory unit 470 may perform register read/memory read stage 414; execution cluster 460 may perform execute stage 416; 6) memory unit 470 and physical register file units 458 may perform write-back/memory-write stage 418; 7) various units may be involved in the performance of exception handling stage 422; and 8) retirement unit 454 and physical register file units 458 may perform commit stage 424.

Processor 490 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.).

It should be understood that the core may support multithreading (executing two or more parallel sets of operations or threads) in a variety of manners. Multithreading support may be performed by, for example, including time sliced multithreading, simultaneous multithreading (where a single physical core provides a logical core for each of the threads that physical core is simultaneously multithreading), or a combination thereof. Such a combination may include, for example, time sliced fetching and decoding and simultaneous multithreading thereafter such as in the Intel® Hyperthreading technology.

While register renaming may be described in the context of out-of-order execution, it should be understood that register renaming may be used in an in-order architecture. While the illustrated embodiment of the processor may also include a separate instruction and data cache units 434/474 and a shared L2 cache unit 476, other embodiments may have a single internal cache for both instructions and data, such as, for example, a Level 1 (L1) internal cache, or multiple levels of internal cache. In some embodiments, the system may include a combination of an internal cache and an external cache that may be external to the core and/or the processor. In other embodiments, all of the caches may be external to the core and/or the processor.

Figure 5A:
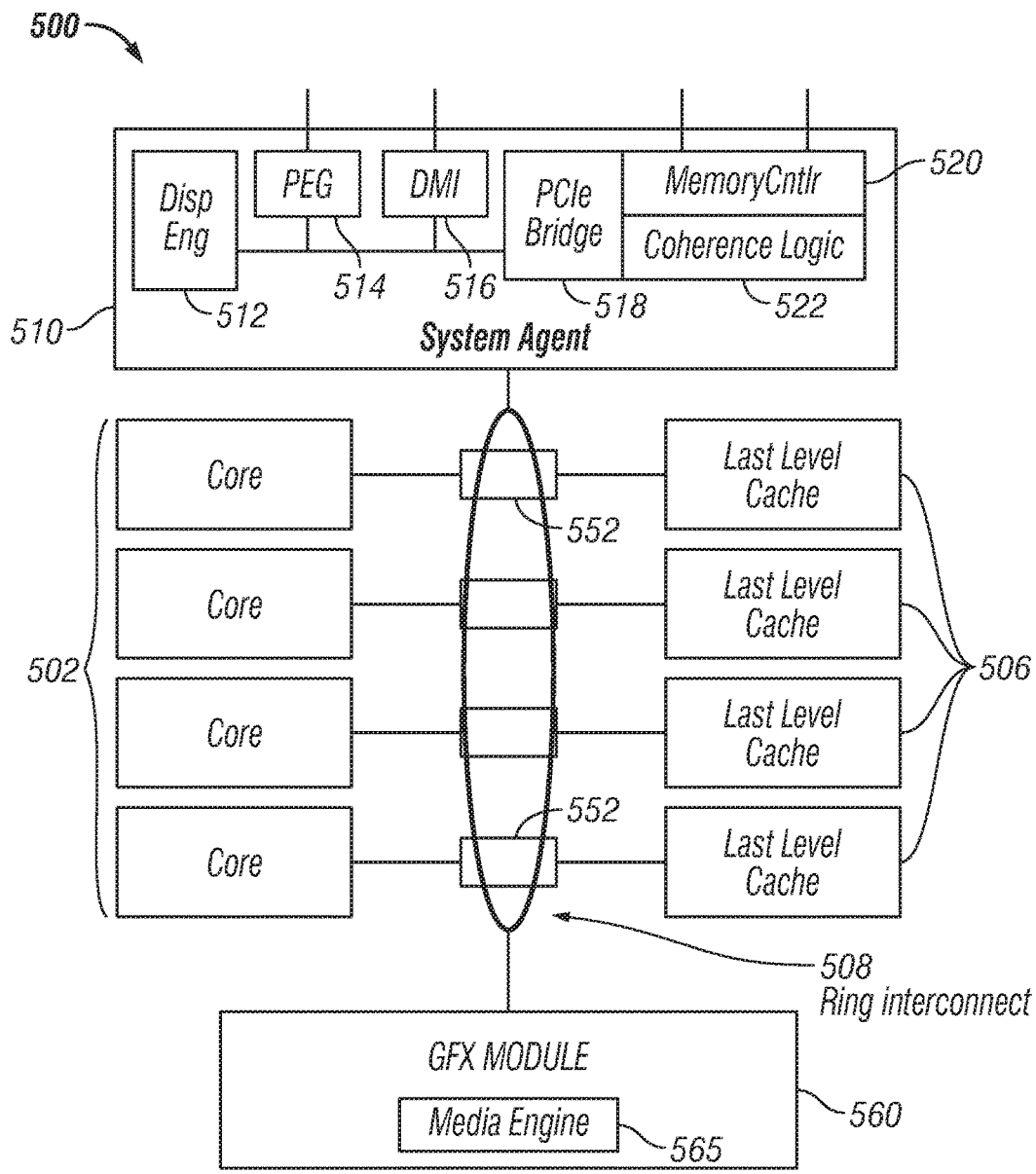
FIG. 5A is a block diagram of a processor, in accordance with embodiments of the present disclosure.

FIG. 5A is a block diagram of a processor 500, in accordance with embodiments of the present disclosure. In one embodiment, processor 500 may include a multicore processor. Processor 500 may include a system agent 510 communicatively coupled to one or more cores 502. Furthermore, cores 502 and system agent 510 may be communicatively coupled to one or more caches 506. Cores 502, system agent 510, and caches 506 may be communicatively coupled via one or more memory control units 552. Furthermore, cores 502, system agent 510, and caches 506 may be communicatively coupled to a graphics module 560 via memory control units 552.

Processor 500 may include any suitable mechanism for interconnecting cores 502, system agent 510, and caches 506, and graphics module 560. In one embodiment, processor 500 may include a ring-based interconnect unit 508 to interconnect cores 502, system agent 510, and caches 506, and graphics module 560. In other embodiments, processor 500 may include any number of well-known techniques for interconnecting such units. Ring-based interconnect unit 508 may utilize memory control units 552 to facilitate interconnections.

Processor 500 may include a memory hierarchy comprising one or more levels of caches within the cores, one or more shared cache units such as caches 506, or external memory (not shown) coupled to the set of integrated memory controller units 552. Caches 506 may include any suitable cache. In one embodiment, caches 506 may include one or more mid-level caches, such as level 2 (L2), level 3 (L3), level 4 (L4), or other levels of cache, a last level cache (LLC), and/or combinations thereof.

In various embodiments, one or more of cores 502 may perform multi-threading. System agent 510 may include components for coordinating and operating cores 502. System agent unit 510 may include, for example, a power control unit (PCU). The PCU may be or include logic and components needed for regulating the power state of cores 502. System agent 510 may include a display engine 512 for driving one or more externally connected displays or graphics module 560. System agent 510 may include an interface 514 for communications busses for graphics. In one embodiment, interface 514 may be implemented by PCI Express (PCIe). In a further embodiment, interface 514 may be implemented by PCI Express Graphics (PEG). System agent 510 may include a direct media interface (DMI) 516. DMI 516 may provide links between different bridges on a motherboard or other portion of a computer system. System agent 510 may include a PCIe bridge 518 for providing PCIe links to other elements of a computing system. PCIe bridge 518 may be implemented using a memory controller 520 and coherence logic 522.

Cores 502 may be implemented in any suitable manner. Cores 502 may be homogenous or heterogeneous in terms of architecture and/or instruction set. In one embodiment, some of cores 502 may be in-order while others may be out-of-order. In another embodiment, two or more of cores 502 may execute the same instruction set, while others may execute only a subset of that instruction set or a different instruction set.

Processor 500 may include a general-purpose processor, such as a Core™ i3, i5, i7, 2 Duo and Quad, Xeon™, Itanium™, XScale™ or StrongARM™ processor, which may be available from Intel Corporation, of Santa Clara, Calif. Processor 500 may be provided from another company, such as ARM Holdings, Ltd, MIPS, etc. Processor 500 may be a special-purpose processor, such as, for example, a network or communication processor, compression engine, graphics processor, co-processor, embedded processor, or the like. Processor 500 may be implemented on one or more chips. Processor 500 may be a part of and/or may be implemented on one or more substrates using any of a number of process technologies, such as, for example, BiCMOS, CMOS, or NMOS.

In one embodiment, a given one of caches 506 may be shared by multiple ones of cores 502. In another embodiment, a given one of caches 506 may be dedicated to one of cores 502. The assignment of caches 506 to cores 502 may be handled by a cache controller or other suitable mechanism. A given one of caches 506 may be shared by two or more cores 502 by implementing time-slices of a given cache 506.

Graphics module 560 may implement an integrated graphics processing subsystem. In one embodiment, graphics module 560 may include a graphics processor. Furthermore, graphics module 560 may include a media engine 565. Media engine 565 may provide media encoding and video decoding.

Figure 5B:
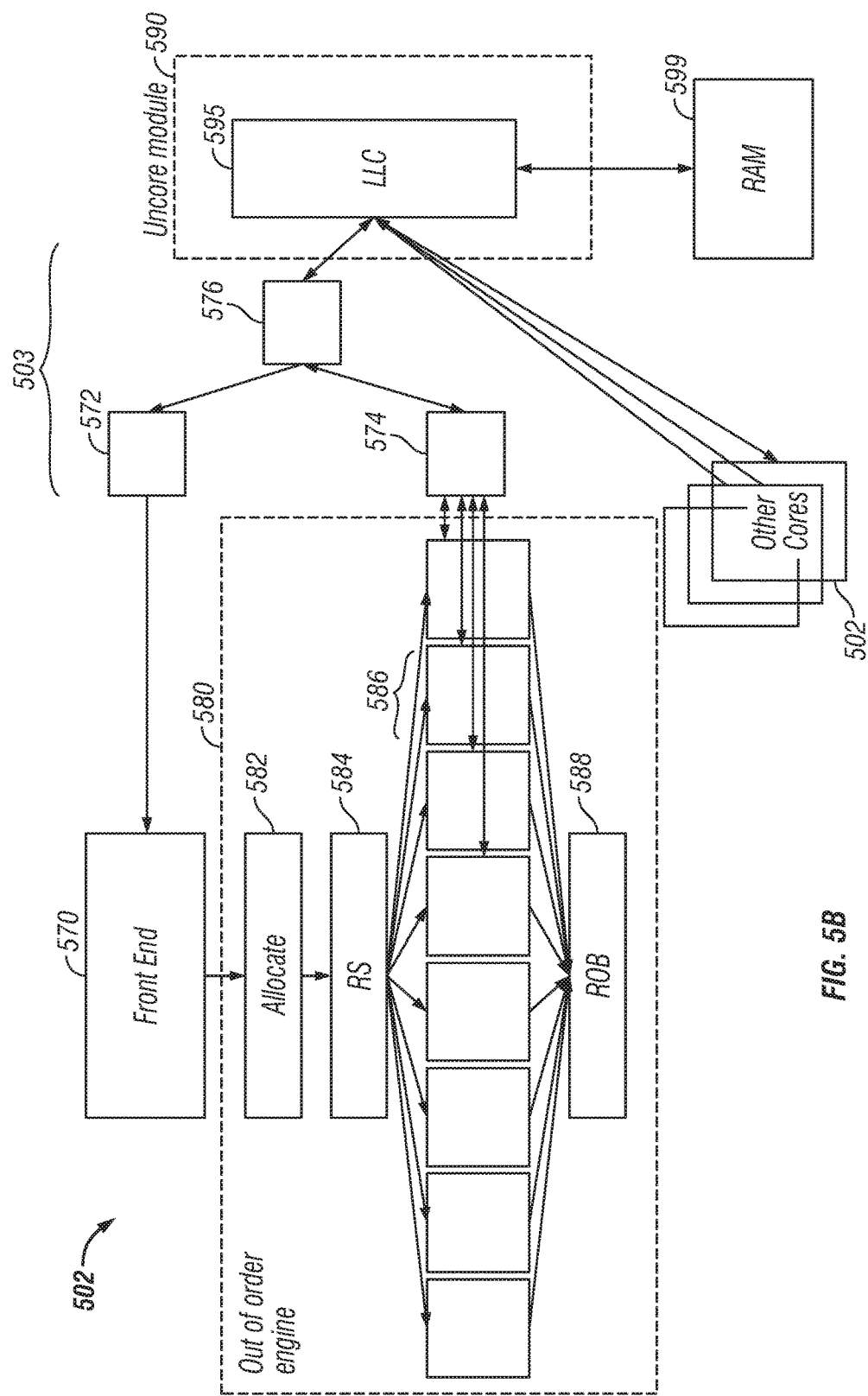
FIG. 5B is a block diagram of an example implementation of a core, in accordance with embodiments of the present disclosure.

FIG. 5B is a block diagram of an example implementation of a core 502, in accordance with embodiments of the present disclosure. Core 502 may include a front end 570 communicatively coupled to an out-of-order engine 580. Core 502 may be communicatively coupled to other portions of processor 500 through cache hierarchy 503.

Front end 570 may be implemented in any suitable manner, such as fully or in part by front end 201 as described above. In one embodiment, front end 570 may communicate with other portions of processor 500 through cache hierarchy 503. In a further embodiment, front end 570 may fetch instructions from portions of processor 500 and prepare the instructions to be used later in the processor pipeline as they are passed to out-of-order execution engine 580.

Out-of-order execution engine 580 may be implemented in any suitable manner, such as fully or in part by out-of-order execution engine 203 as described above. Out-of-order execution engine 580 may prepare instructions received from front end 570 for execution. Out-of-order execution engine 580 may include an allocate module 582. In one embodiment, allocate module 582 may allocate resources of processor 500 or other resources, such as registers or buffers, to execute a given instruction. Allocate module 582 may make allocations in schedulers, such as a memory scheduler, fast scheduler, or floating point scheduler. Such schedulers may be represented in FIG. 5B by resource schedulers 584. Allocate module 582 may be implemented fully or in part by the allocation logic described in conjunction with FIG. 2. Resource schedulers 584 may determine when an instruction is ready to execute based on the readiness of a given resource's sources and the availability of execution resources needed to execute an instruction. Resource schedulers 584 may be implemented by, for example, schedulers 202, 204, 206 as discussed above. Resource schedulers 584 may schedule the execution of instructions upon one or more resources. In one embodiment, such resources may be internal to core 502, and may be illustrated, for example, as resources 586. In another embodiment, such resources may be external to core 502 and may be accessible by, for example, cache hierarchy 503. Resources may include, for example, memory, caches, register files, or registers. Resources internal to core 502 may be represented by resources 586 in FIG. 5B. As necessary, values written to or read from resources 586 may be coordinated with other portions of processor 500 through, for example, cache hierarchy 503. As instructions are assigned resources, they may be placed into a reorder buffer 588. Reorder buffer 588 may track instructions as they are executed and may selectively reorder their execution based upon any suitable criteria of processor 500. In one embodiment, reorder buffer 588 may identify instructions or a series of instructions that may be executed independently. Such instructions or a series of instructions may be executed in parallel from other such instructions. Parallel execution in core 502 may be performed by any suitable number of separate execution blocks or virtual processors. In one embodiment, shared resources—such as memory, registers, and caches—may be accessible to multiple virtual processors within a given core 502. In other embodiments, shared resources may be accessible to multiple processing entities within processor 500.

Cache hierarchy 503 may be implemented in any suitable manner. For example, cache hierarchy 503 may include one or more lower or mid-level caches, such as caches 572, 574. In one embodiment, cache hierarchy 503 may include an LLC 595 communicatively coupled to caches 572, 574 through logic block 576. In another embodiment, LLC 595 may be implemented in a module 590 accessible to all processing entities of processor 500. In a further embodiment, module 590 may be implemented in an uncore module of processors from Intel, Inc. Module 590 may include portions or subsystems of processor 500 necessary for the execution of core 502 but might not be implemented within core 502. Besides LLC 595, Module 590 may include, for example, hardware interfaces, memory coherency coordinators, interprocessor interconnects, instruction pipelines, or memory controllers. Access to RAM 599 available to processor 500 may be made through module 590 and, more specifically, LLC 595. Furthermore, other instances of core 502 may similarly access module 590. Coordination of the instances of core 502 may be facilitated in part through module 590.

Figure 6:
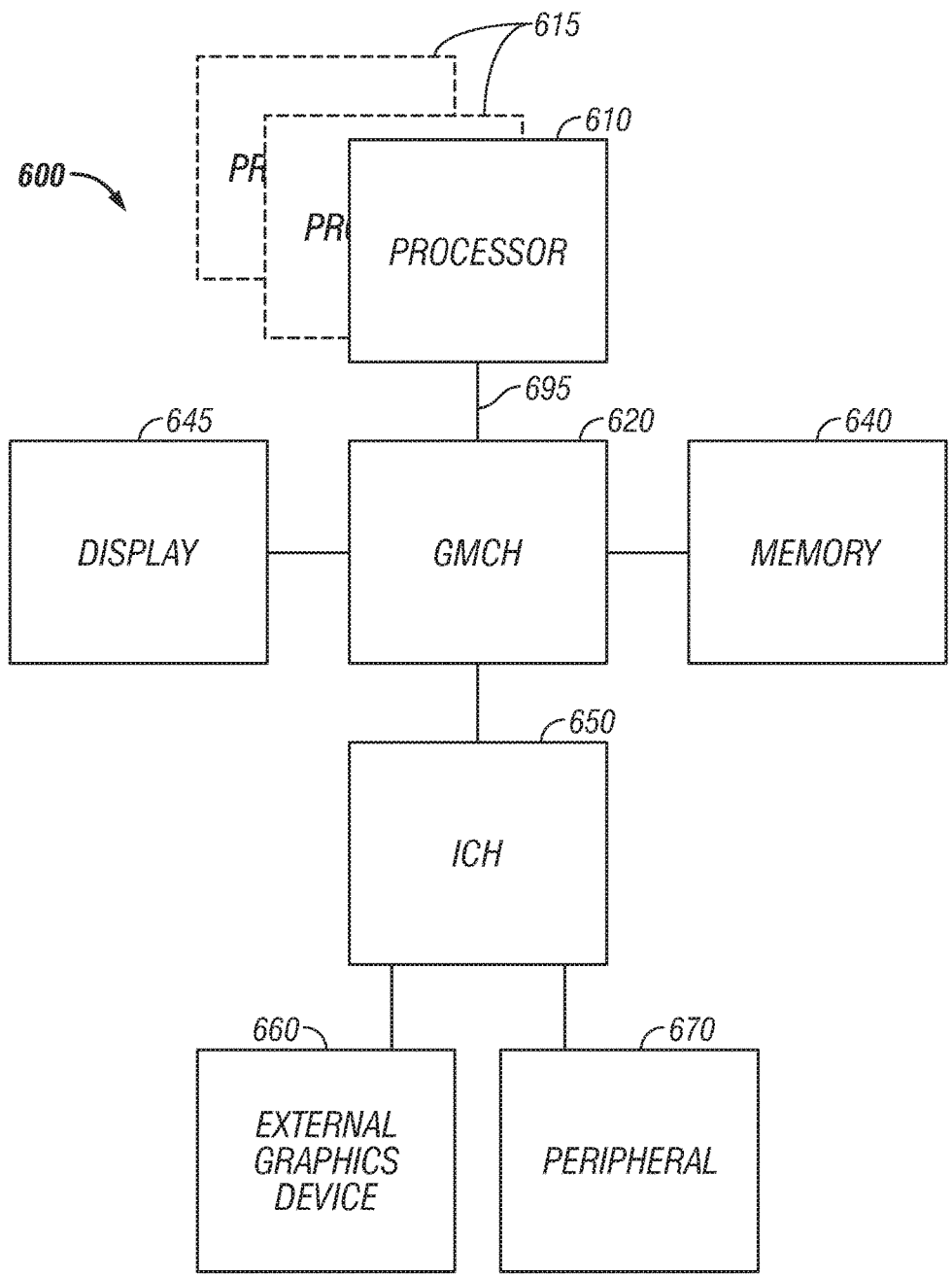
FIG. 6 is a block diagram of a system, in accordance with embodiments of the present disclosure.
Figure 7:
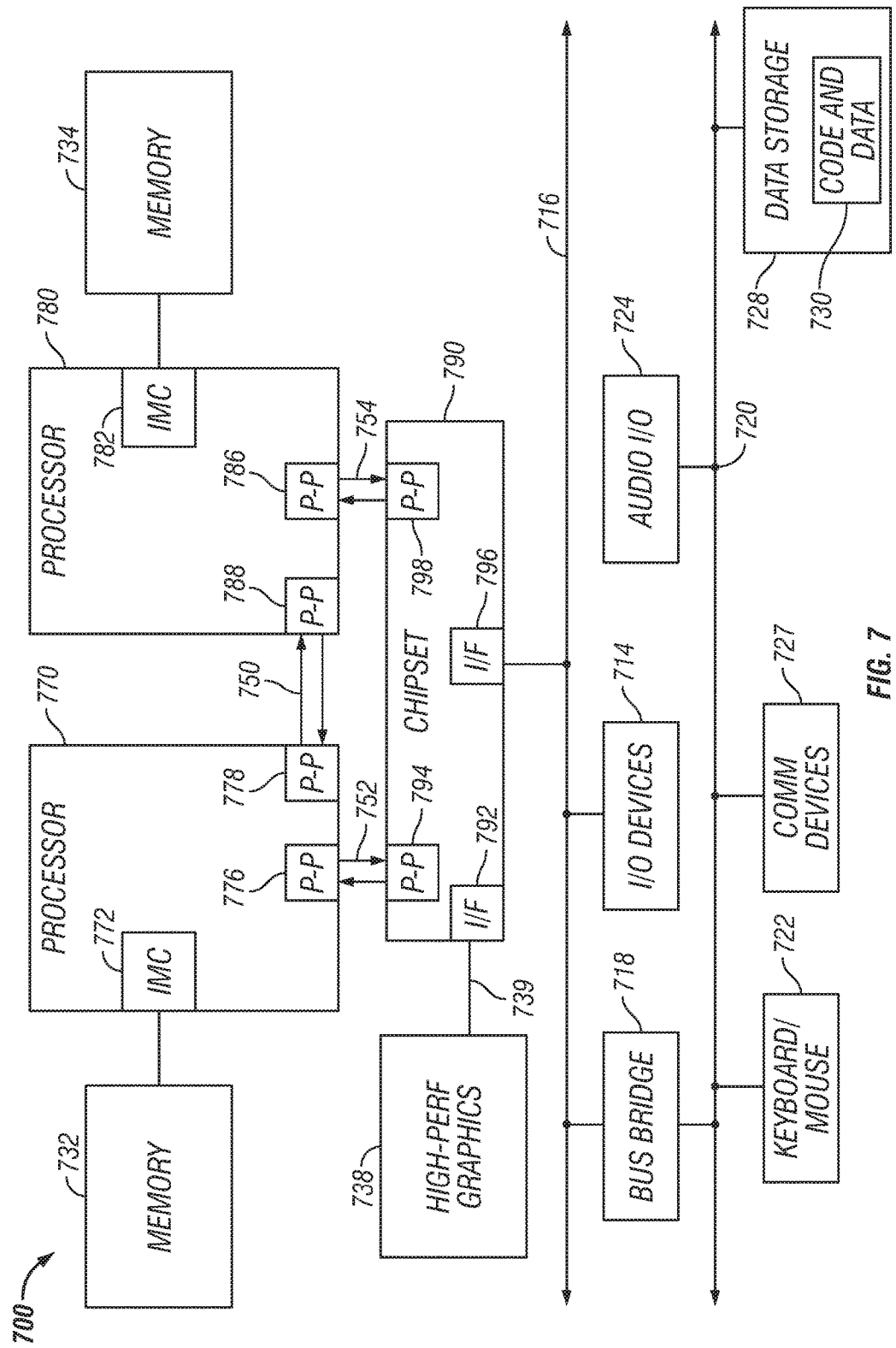
FIG. 7 is a block diagram of a second system, in accordance with embodiments of the present disclosure.
Figure 8:
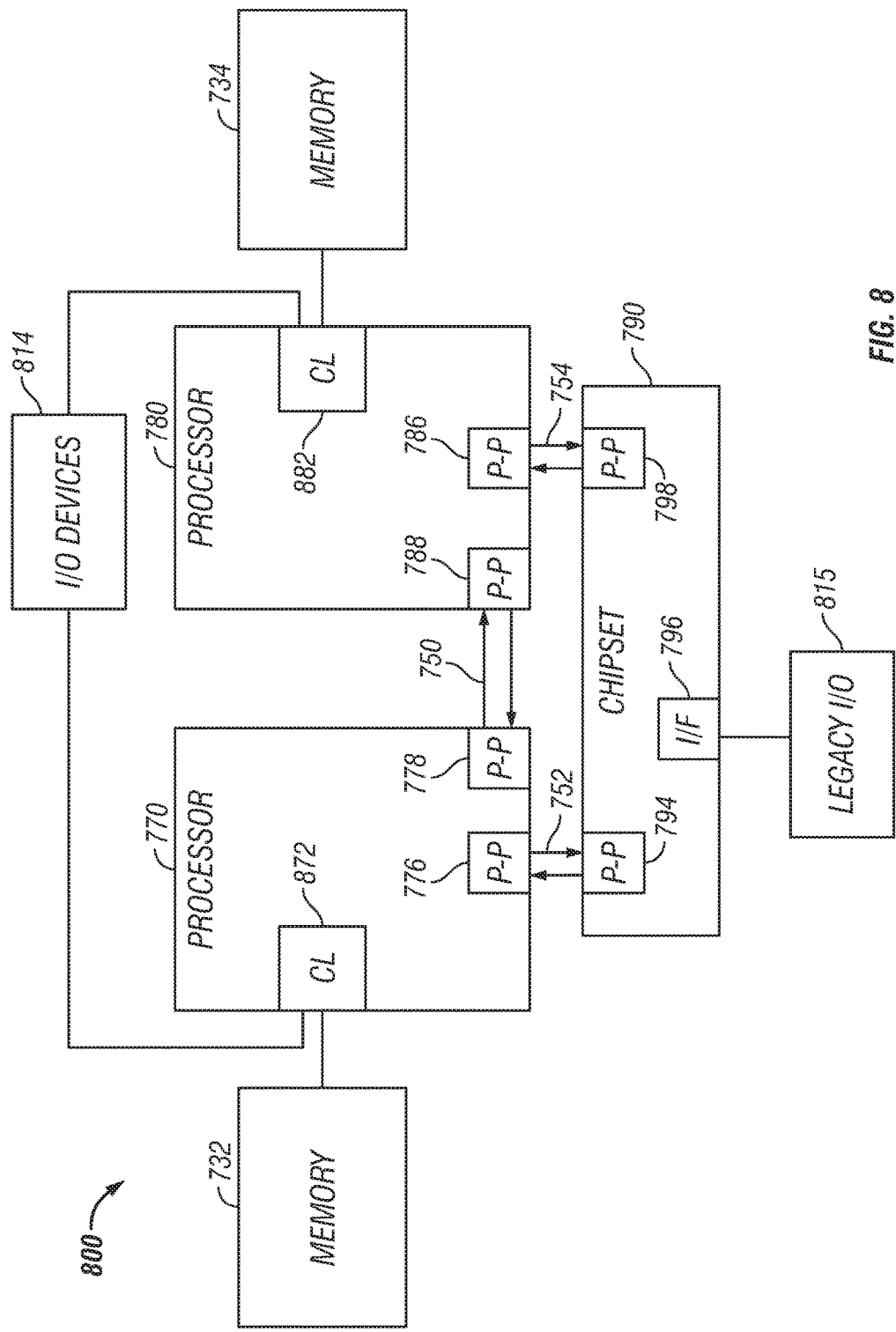
FIG. 8 is a block diagram of a third system in accordance with embodiments of the present disclosure.
Figure 9:
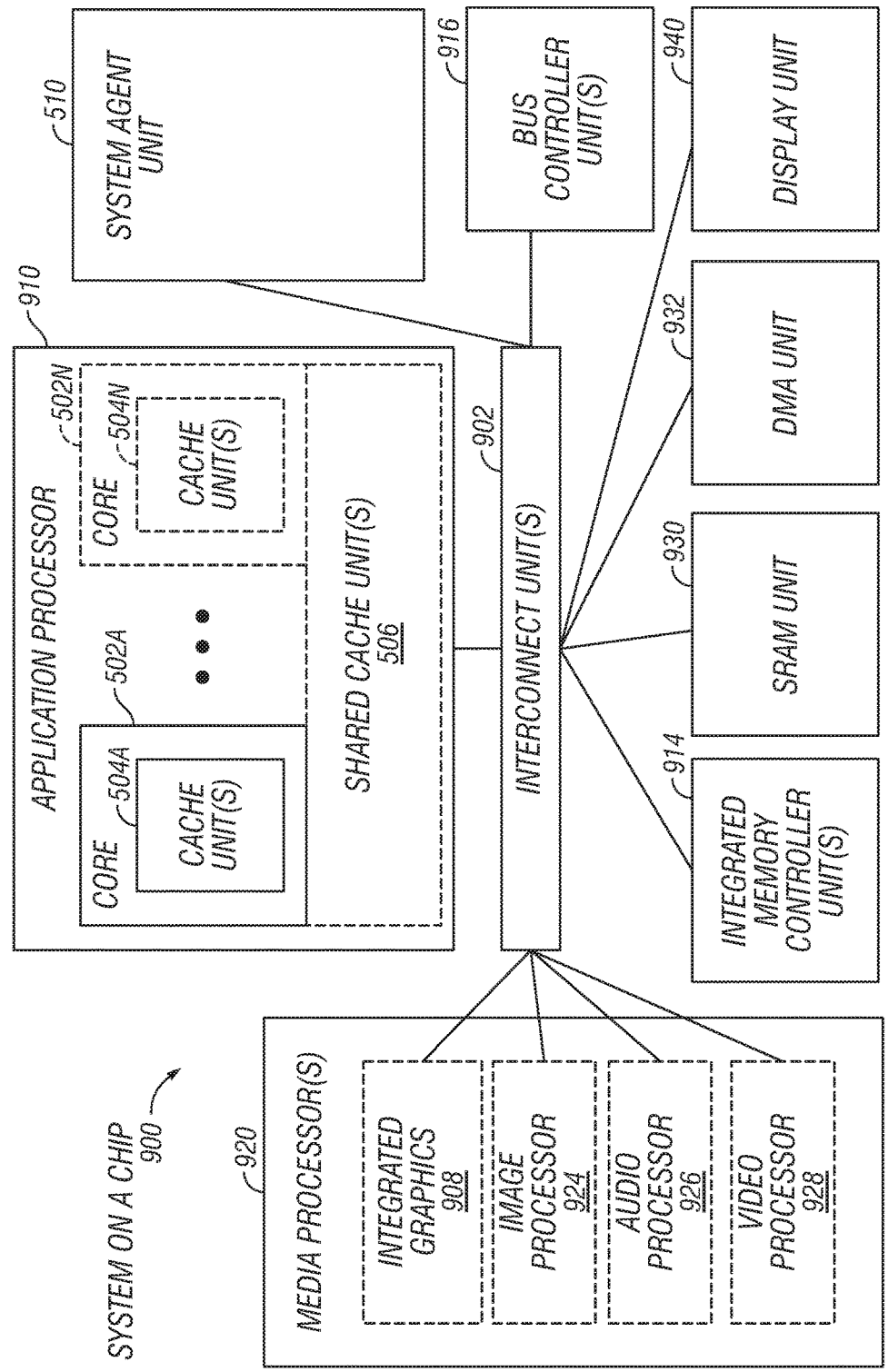
FIG. 9 is a block diagram of a system-on-a-chip, in accordance with embodiments of the present disclosure.

FIGS. 6-8 may illustrate exemplary systems suitable for including processor 500, while FIG. 9 may illustrate an exemplary system on a chip (SoC) that may include one or more of cores 502. Other system designs and implementations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, may also be suitable. In general, a huge variety of systems or electronic devices that incorporate a processor and/or other execution logic as disclosed herein may be generally suitable.

FIG. 6 illustrates a block diagram of a system 600, in accordance with embodiments of the present disclosure. System 600 may include one or more processors 610, 615, which may be coupled to graphics memory controller hub (GMCH) 620. The optional nature of additional processors 615 is denoted in FIG. 6 with broken lines.

Each processor 610, 615 may be some version of processor 500. However, it should be noted that integrated graphics logic and integrated memory control units might not exist in processors 610, 615. FIG. 6 illustrates that GMCH 620 may be coupled to a memory 640 that may be, for example, a dynamic random access memory (DRAM). The DRAM may, for at least one embodiment, be associated with a non-volatile cache.

GMCH 620 may be a chipset, or a portion of a chipset. GMCH 620 may communicate with processors 610, 615 and control interaction between processors 610, 615 and memory 640. GMCH 620 may also act as an accelerated bus interface between the processors 610, 615 and other elements of system 600. In one embodiment, GMCH 620 communicates with processors 610, 615 via a multi-drop bus, such as a frontside bus (FSB) 695.

Furthermore, GMCH 620 may be coupled to a display 645 (such as a flat panel display). In one embodiment, GMCH 620 may include an integrated graphics accelerator. GMCH 620 may be further coupled to an input/output (I/O) controller hub (ICH) 650, which may be used to couple various peripheral devices to system 600. External graphics device 660 may include a discrete graphics device coupled to ICH 650 along with another peripheral device 670.

In other embodiments, additional or different processors may also be present in system 600. For example, additional processors 610, 615 may include additional processors that may be the same as processor 610, additional processors that may be heterogeneous or asymmetric to processor 610, accelerators (such as, e.g., graphics accelerators or digital signal processing (DSP) units), field programmable gate arrays, or any other processor. There may be a variety of differences between the physical resources 610, 615 in terms of a spectrum of metrics of merit including architectural, micro-architectural, thermal, power consumption characteristics, and the like. These differences may effectively manifest themselves as asymmetry and heterogeneity amongst processors 610, 615. For at least one embodiment, various processors 610, 615 may reside in the same die package.

FIG. 7 illustrates a block diagram of a second system 700, in accordance with embodiments of the present disclosure. As shown in FIG. 7, multiprocessor system 700 may include a point-to-point interconnect system, and may include a first processor 770 and a second processor 780 coupled via a point-to-point interconnect 750. Each of processors 770 and 780 may be some version of processor 500 as one or more of processors 610, 615.

While FIG. 7 may illustrate two processors 770, 780, it is to be understood that the scope of the present disclosure is not so limited. In other embodiments, one or more additional processors may be present in a given processor.

Processors 770 and 780 are shown including integrated memory controller units 772 and 782, respectively. Processor 770 may also include as part of its bus controller units point-to-point (P-P) interfaces 776 and 778; similarly, second processor 780 may include P-P interfaces 786 and 788. Processors 770, 780 may exchange information via a point-to-point (P-P) interface 750 using P-P interface circuits 778, 788. As shown in FIG. 7, IMCs 772 and 782 may couple the processors to respective memories, namely a memory 732 and a memory 734, which in one embodiment may be portions of main memory locally attached to the respective processors.

Processors 770, 780 may each exchange information with a chipset 790 via individual P-P interfaces 752, 754 using point to point interface circuits 776, 794, 786, 798. In one embodiment, chipset 790 may also exchange information with a high-performance graphics circuit 738 via interface 792 over a high-performance graphics bus 739.

A shared cache (not shown) may be included in either processor or outside of both processors, yet connected with the processors via P-P interconnect, such that either or both processors' local cache information may be stored in the shared cache if a processor is placed into a low power mode.

Chipset 790 may be coupled to a first bus 716 via an interface 796. In one embodiment, first bus 716 may be a Peripheral Component Interconnect (PCI) bus, or a bus such as a PCI Express bus or another third generation I/O interconnect bus, although the scope of the present disclosure is not so limited.

As shown in FIG. 7, various I/O devices 714 may be coupled to first bus 716, along with a bus bridge 718 which couples first bus 716 to a second bus 720. In one embodiment, second bus 720 may be a low pin count (LPC) bus. Various devices may be coupled to second bus 720 including, for example, a keyboard and/or mouse 722, communication devices 727 and a storage unit 728 such as a disk drive or other mass storage device which may include instructions/code and data 730, in one embodiment. Further, an audio I/O 724 may be coupled to second bus 720. Note that other architectures may be possible. For example, instead of the point-to-point architecture of FIG. 7, a system may implement a multi-drop bus or other such architecture.

FIG. 8 illustrates a block diagram of a third system 800 in accordance with embodiments of the present disclosure. Like elements in FIGS. 7 and 8 bear like reference numerals, and certain aspects of FIG. 7 have been omitted from FIG. 8 in order to avoid obscuring other aspects of FIG. 8.

FIG. 8 illustrates that processors 770, 780 may include integrated memory and I/O control logic ("CL") 872 and 882, respectively. For at least one embodiment, CL 872, 882 may include integrated memory controller units such as that described above in connection with FIGS. 5 and 7. In addition. CL 872, 882 may also include I/O control logic. FIG. 8 illustrates that not only memories 732, 734 may be coupled to CL 872, 882, but also that I/O devices 814 may also be coupled to control logic 872, 882. Legacy I/O devices 815 may be coupled to chipset 790.

FIG. 9 illustrates a block diagram of a SoC 900, in accordance with embodiments of the present disclosure. Similar elements in FIG. 5 bear like reference numerals. Also, dashed lined boxes may represent optional features on more advanced SoCs. An interconnect units 902 may be coupled to: an application processor 910 which may include a set of one or more cores 502A-N, including respective local caches 504A-N, and shared cache units 506; a system agent unit 510; a bus controller units 916; an integrated memory controller units 914; a set of one or more media processors 920 which may include integrated graphics logic 908, an image processor 924 for providing still and/or video camera functionality, an audio processor 926 for providing hardware audio acceleration, and a video processor 928 for providing video encode/decode acceleration; an static random access memory (SRAM) unit 930; a direct memory access (DMA) unit 932; and a display unit 940 for coupling to one or more external displays.

Figure 10:
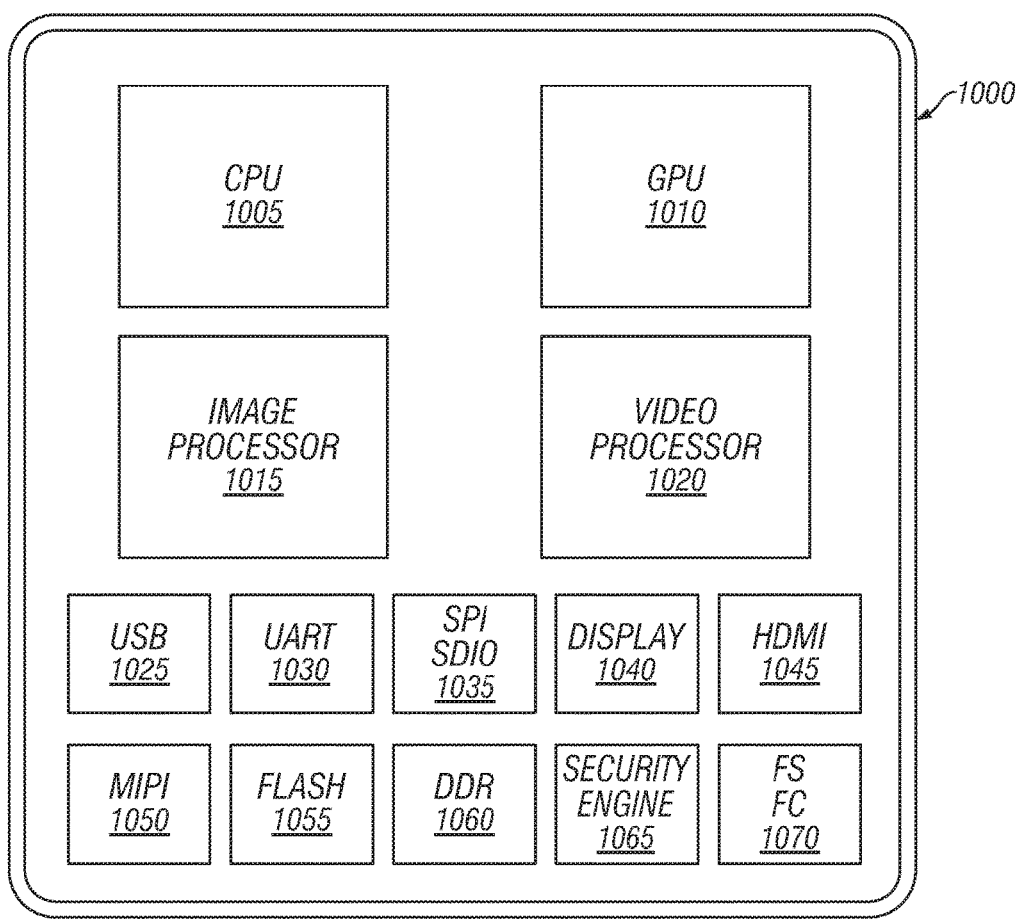
FIG. 10 illustrates a processor containing a central processing unit and a graphics processing unit which may perform at least one instruction, in accordance with embodiments of the present disclosure.

FIG. 10 illustrates a processor containing a central processing unit (CPU) and a graphics processing unit (GPU), which may perform at least one instruction, in accordance with embodiments of the present disclosure. In one embodiment, an instruction to perform operations according to at least one embodiment could be performed by the CPU. In another embodiment, the instruction could be performed by the GPU. In still another embodiment, the instruction may be performed through a combination of operations performed by the GPU and the CPU. For example, in one embodiment, an instruction in accordance with one embodiment may be received and decoded for execution on the GPU. However, one or more operations within the decoded instruction may be performed by a CPU and the result returned to the GPU for final retirement of the instruction. Conversely, in some embodiments, the CPU may act as the primary processor and the GPU as the co-processor.

In some embodiments, instructions that benefit from highly parallel, throughput processors may be performed by the GPU, while instructions that benefit from the performance of processors that benefit from deeply pipelined architectures may be performed by the CPU. For example, graphics, scientific applications, financial applications and other parallel workloads may benefit from the performance of the GPU and be executed accordingly, whereas more sequential applications, such as operating system kernel or application code may be better suited for the CPU.

In FIG. 10, processor 1000 includes a CPU 1005, GPU 1010, image processor 1015, video processor 1020, USB controller 1025, UART controller 1030, SPI/SDIO controller 1035, display device 1040, memory interface controller 1045, MIPI controller 1050, flash memory controller 1055, dual data rate (DDR) controller 1060, security engine 1065, and $I^2S/I^2C$ controller 1070. Other logic and circuits may be included in the processor of FIG. 10, including more CPUs or GPUs and other peripheral interface controllers.

One or more aspects of at least one embodiment may be implemented by representative data stored on a machine-readable medium which represents various logic within the processor, which when read by a machine causes the machine to fabricate logic to perform the techniques described herein. Such representations, known as "IP cores" may be stored on a tangible, machine-readable medium ("tape") and supplied to various customers or manufacturing facilities to load into the fabrication machines that actually make the logic or processor. For example, IP cores, such as the Cortex™ family of processors developed by ARM Holdings, Ltd. and Loongson IP cores developed the Institute of Computing Technology (ICT) of the Chinese Academy of Sciences may be licensed or sold to various customers or licensees, such as Texas Instruments, Qualcomm, Apple, or Samsung and implemented in processors produced by these customers or licensees.

Figure 11:
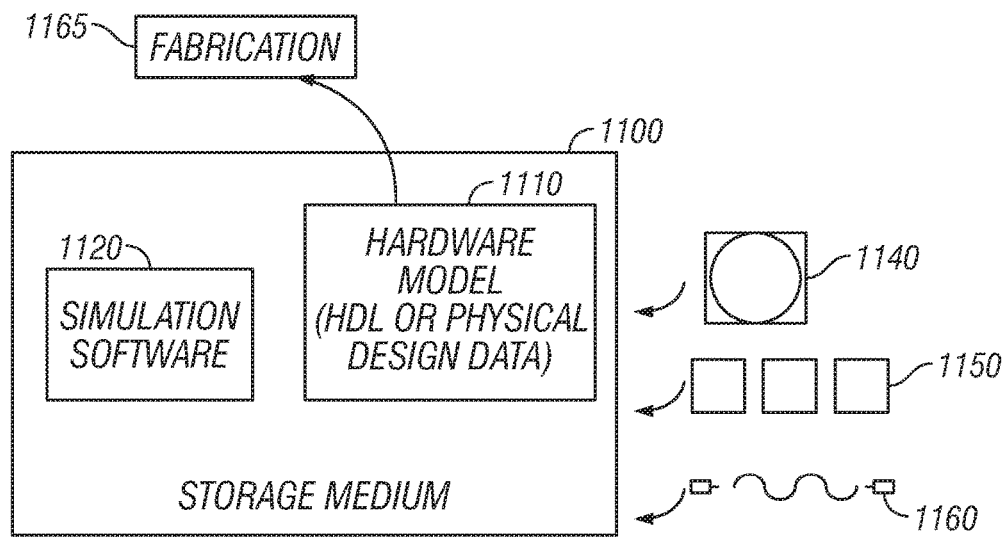
FIG. 11 is a block diagram illustrating the development of IP cores, in accordance with embodiments of the present disclosure.

FIG. 11 illustrates a block diagram illustrating the development of IP cores, in accordance with embodiments of the present disclosure. Storage 1100 may include simulation software 1120 and/or hardware or software model 1110. In one embodiment, the data representing the IP core design may be provided to storage 1100 via memory 1140 (e.g., hard disk), wired connection (e.g., internet) 1150 or wireless connection 1160. The IP core information generated by the simulation tool and model may then be transmitted to a fabrication facility 1165 where it may be fabricated by a $3^{rd}$ party to perform at least one instruction in accordance with at least one embodiment.

In some embodiments, one or more instructions may correspond to a first type or architecture (e.g., x86) and be translated or emulated on a processor of a different type or architecture (e.g., ARM). An instruction, according to one embodiment, may therefore be performed on any processor or processor type, including ARM, x86, MIPS, a GPU, or other processor type or architecture.

Figure 12:
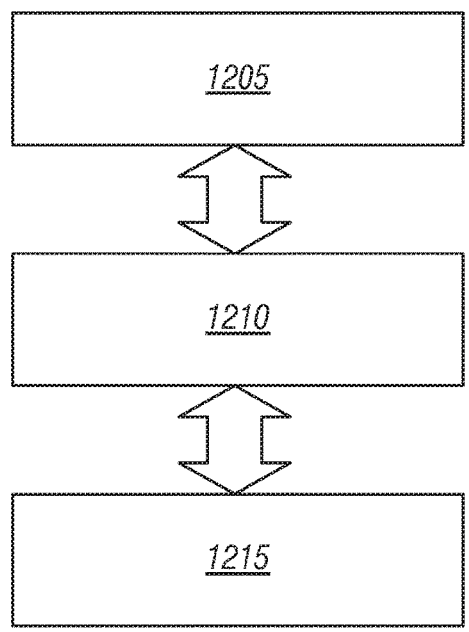
FIG. 12 illustrates how an instruction of a first type may be emulated by a processor of a different type, in accordance with embodiments of the present disclosure.

FIG. 12 illustrates how an instruction of a first type may be emulated by a processor of a different type, in accordance with embodiments of the present disclosure. In FIG. 12, program 1205 contains some instructions that may perform the same or substantially the same function as an instruction according to one embodiment. However the instructions of program 1205 may be of a type and/or format that is different from or incompatible with processor 1215, meaning the instructions of the type in program 1205 may not be able to execute natively by the processor 1215. However, with the help of emulation logic, 1210, the instructions of program 1205 may be translated into instructions that may be natively be executed by the processor 1215. In one embodiment, the emulation logic may be embodied in hardware. In another embodiment, the emulation logic may be embodied in a tangible, machine-readable medium containing software to translate instructions of the type in program 1205 into the type natively executable by processor 1215. In other embodiments, emulation logic may be a combination of fixed-function or programmable hardware and a program stored on a tangible, machine-readable medium. In one embodiment, the processor contains the emulation logic, whereas in other embodiments, the emulation logic exists outside of the processor and may be provided by a third party. In one embodiment, the processor may load the emulation logic embodied in a tangible, machine-readable medium containing software by executing microcode or firmware contained in or associated with the processor.

Figure 13:
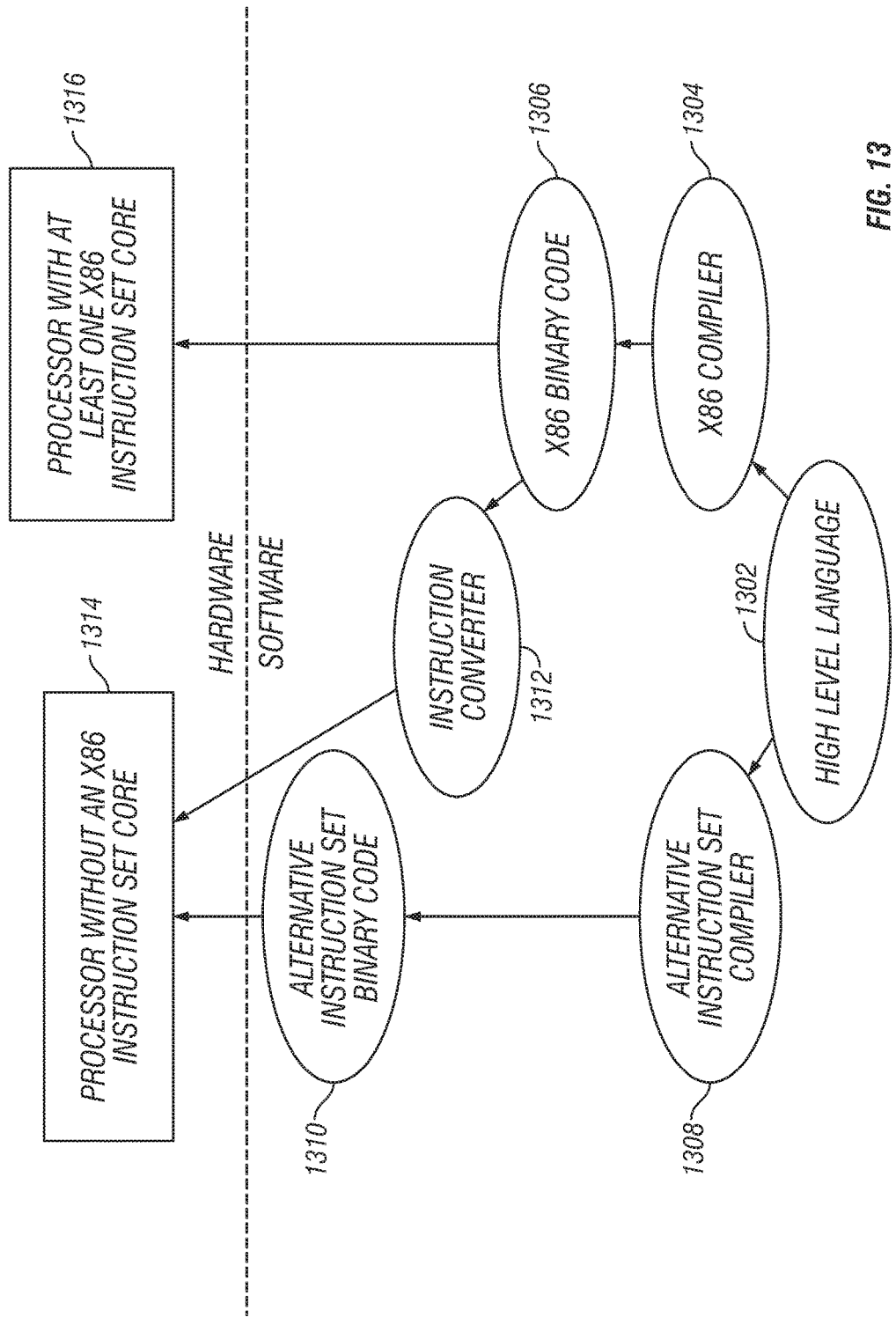
FIG. 13 illustrates a block diagram contrasting the use of a software instruction converter to convert binary instructions in a source instruction set to binary instructions in a target instruction set, in accordance with embodiments of the present disclosure.

FIG. 13 illustrates a block diagram contrasting the use of a software instruction converter to convert binary instructions in a source instruction set to binary instructions in a target instruction set, in accordance with embodiments of the present disclosure. In the illustrated embodiment, the instruction converter may be a software instruction converter, although the instruction converter may be implemented in software, firmware, hardware, or various combinations thereof. FIG. 13 shows a program in a high level language 1302 may be compiled using an x86 compiler 1304 to generate x86 binary code 1306 that may be natively executed by a processor with at least one x86 instruction set core 1316. The processor with at least one x86 instruction set core 1316 represents any processor that may perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. x86 compiler 1304 represents a compiler that may be operable to generate x86 binary code 1306 (e.g., object code) that may, with or without additional linkage processing, be executed on the processor with at least one x86 instruction set core 1316. Similarly, FIG. 13 shows the program in high level language 1302 may be compiled using an alternative instruction set compiler 1308 to generate alternative instruction set binary code 1310 that may be natively executed by a processor without at least one x86 instruction set core 1314 (e.g., a processor with cores that execute the MIPS instruction set of MIPS Technologies of Sunnyvale, Calif. and/or that execute the ARM instruction set of ARM Holdings of Sunnyvale, Calif.). Instruction converter 1312 may be used to convert x86 binary code 1306 into code that may be natively executed by the processor without an x86 instruction set core 1314. This converted code might not be the same as alternative instruction set binary code 1310; however, the converted code will accomplish the general operation and be made up of instructions from the alternative instruction set. Thus, instruction converter 1312 represents software, firmware, hardware, or a combination thereof that, through emulation, simulation or any other process, allows a processor or other electronic device that does not have an x86 instruction set processor or core to execute x86 binary code 1306.

Figure 14:
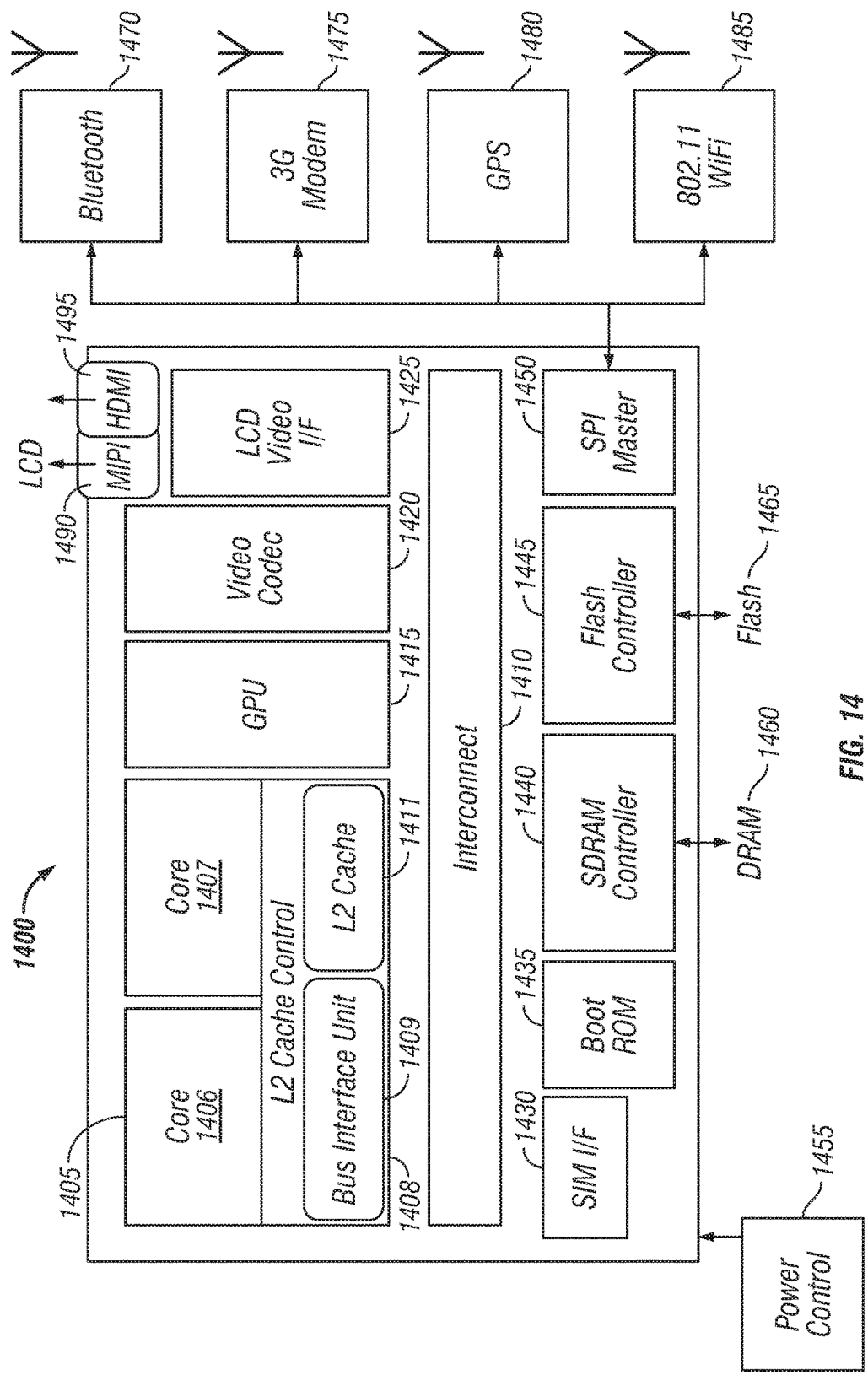
FIG. 14 is a block diagram of an instruction set architecture of a processor, in accordance with embodiments of the present disclosure.

FIG. 14 is a block diagram of an instruction set architecture 1400 of a processor, in accordance with embodiments of the present disclosure. Instruction set architecture 1400 may include any suitable number or kind of components.

For example, instruction set architecture 1400 may include processing entities such as one or more cores 1406, 1407 within a processor subsystem 1405, and a graphics processing unit 1415. Cores 1406, 1407 may be communicatively coupled to the rest of instruction set architecture 1400 through any suitable mechanism, such as through a bus or cache. In one embodiment, cores 1406, 1407 may be communicatively coupled through an L2 cache control 1408, which may include a bus interface unit 1409 and an L2 cache 1411. Cores 1406, 1407 and graphics processing unit 1415 may be communicatively coupled to each other and to the remainder of instruction set architecture 1400 through interconnect 1410. In one embodiment, graphics processing unit 1415 may use a video codec 1420 defining the manner in which particular video signals will be encoded and decoded for output.

Instruction set architecture 1400 may also include any number or kind of interfaces, controllers, or other mechanisms for interfacing or communicating with other portions of an electronic device or system. Such mechanisms may facilitate interaction with, for example, peripherals, communications devices, other processors, or memory. In the example of FIG. 14, instruction set architecture 1400 may include a liquid crystal display (LCD) video interface 1425, a subscriber interface module (SIM) interface 1430, a boot ROM interface 1435, a synchronous dynamic random access memory (SDRAM) controller 1440, a flash controller 1445, and a serial peripheral interface (SPI) master unit 1450. LCD video interface 1425 may provide output of video signals from, for example, GPU 1415 and through, for example, a mobile industry processor interface (MIPI) 1490 or a high-definition multimedia interface (HDMI) 1495 to a display. Such a display may include, for example, an LCD. SIM interface 1430 may provide access to or from a SIM card or device. SDRAM controller 1440 may provide access to or from memory such as an SDRAM chip or module 1460. Flash controller 1445 may provide access to or from memory such as flash memory 1465 or other instances of RAM. SPI master unit 1450 may provide access to or from communications modules, such as a Bluetooth module 1470, high-speed 3G modem 1475, global positioning system module 1480, or wireless module 1485 implementing a communications standard such as 802.11. Instruction set architecture 1400 may also include a power control unit 1455.

Figure 15:
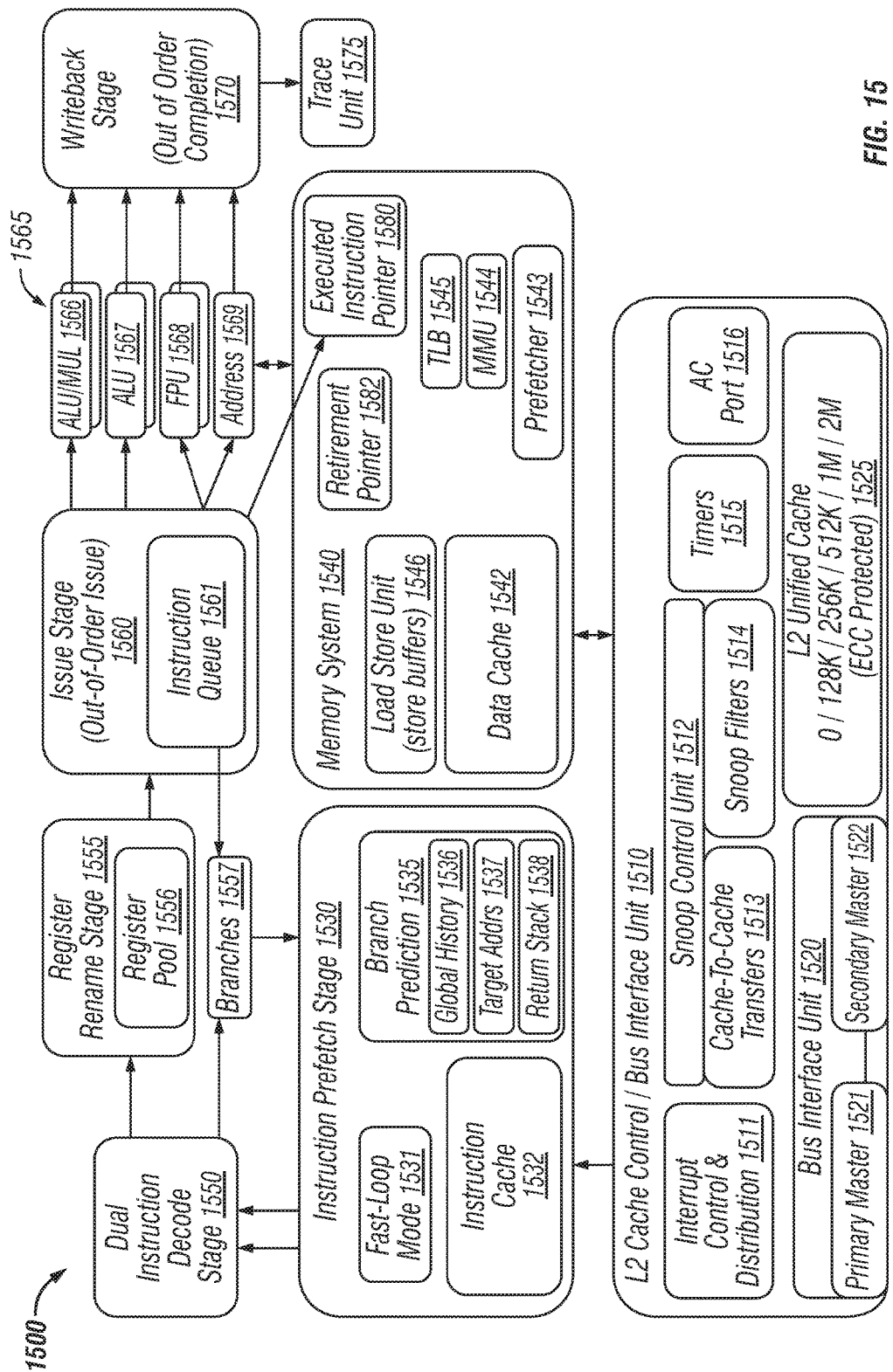
FIG. 15 is a more detailed block diagram of an instruction set architecture of a processor, in accordance with embodiments of the present disclosure.

FIG. 15 is a more detailed block diagram of an instruction set architecture 1500 of a processor, in accordance with embodiments of the present disclosure. Instruction architecture 1500 may implement one or more aspects of instruction set architecture 1400. Furthermore, instruction set architecture 1500 may illustrate modules and mechanisms for the execution of instructions within a processor.

Instruction architecture 1500 may include a memory system 1540 communicatively coupled to one or more execution entities 1565. Furthermore, instruction architecture 1500 may include a caching and bus interface unit such as unit 1510 communicatively coupled to execution entities 1565 and memory system 1540. In one embodiment, loading of instructions into execution entities 1565 may be performed by one or more stages of execution. Such stages may include, for example, instruction prefetch stage 1530, dual instruction decode stage 1550, register rename stage 1555, issue stage 1560, and writeback stage 1570.

In one embodiment, memory system 1540 may include an executed instruction pointer 1580. Executed instruction pointer 1580 may store a value identifying the oldest, undispatched instruction within a batch of instructions. The oldest instruction may correspond to the lowest Program Order (PO) value. A PO may include a unique number of an instruction. Such an instruction may be a single instruction within a thread represented by multiple strands. A PO may be used in ordering instructions to ensure correct execution semantics of code. A PO may be reconstructed by mechanisms such as evaluating increments to PO encoded in the instruction rather than an absolute value. Such a reconstructed PO may be known as an "RPO." Although a PO may be referenced herein, such a PO may be used interchangeably with an RPO. A strand may include a sequence of instructions that are data dependent upon each other. The strand may be arranged by a binary translator at compilation time. Hardware executing a strand may execute the instructions of a given strand in order according to the PO of the various instructions. A thread may include multiple strands such that instructions of different strands may depend upon each other. A PO of a given strand may be the PO of the oldest instruction in the strand which has not yet been dispatched to execution from an issue stage. Accordingly, given a thread of multiple strands, each strand including instructions ordered by PO, executed instruction pointer 1580 may store the oldest—illustrated by the lowest number—PO in the thread.

In another embodiment, memory system 1540 may include a retirement pointer 1582. Retirement pointer 1582 may store a value identifying the PO of the last retired instruction. Retirement pointer 1582 may be set by, for example, retirement unit 454. If no instructions have yet been retired, retirement pointer 1582 may include a null value.

Execution entities 1565 may include any suitable number and kind of mechanisms by which a processor may execute instructions. In the example of FIG. 15, execution entities 1565 may include ALU/multiplication units (MUL) 1566, ALUs 1567, and floating point units (FPU) 1568. In one embodiment, such entities may make use of information contained within a given address 1569. Execution entities 1565 in combination with stages 1530, 1550, 1555, 1560, 1570 may collectively form an execution unit.

Unit 1510 may be implemented in any suitable manner. In one embodiment, unit 1510 may perform cache control. In such an embodiment, unit 1510 may thus include a cache 1525. Cache 1525 may be implemented, in a further embodiment, as an L2 unified cache with any suitable size, such as zero, 128 k, 256 k, 512 k, 1M, or 2M bytes of memory. In another, further embodiment, cache 1525 may be implemented in error-correcting code memory. In another embodiment, unit 1510 may perform bus interfacing to other portions of a processor or electronic device. In such an embodiment, unit 1510 may thus include a bus interface unit 1520 for communicating over an interconnect, intraprocessor bus, interprocessor bus, or other communication bus, port, or line. Bus interface unit 1520 may provide interfacing in order to perform, for example, generation of the memory and input/output addresses for the transfer of data between execution entities 1565 and the portions of a system external to instruction architecture 1500.

To further facilitate its functions, bus interface unit 1510 may include an interrupt control and distribution unit 1511 for generating interrupts and other communications to other portions of a processor or electronic device. In one embodiment, bus interface unit 1510 may include a snoop control unit 1512 that handles cache access and coherency for multiple processing cores. In a further embodiment, to provide such functionality, snoop control unit 1512 may include a cache-to-cache transfer unit 1513 that handles information exchanges between different caches. In another, further embodiment, snoop control unit 1512 may include one or more snoop filters 1514 that monitors the coherency of other caches (not shown) so that a cache controller, such as unit 1510, does not have to perform such monitoring directly. Unit 1510 may include any suitable number of timers 1515 for synchronizing the actions of instruction architecture 1500. Also, unit 1510 may include an AC port 1516.

Memory system 1540 may include any suitable number and kind of mechanisms for storing information for the processing needs of instruction architecture 1500. In one embodiment, memory system 1540 may include a load store unit 1546 for storing information such as buffers written to or read back from memory or registers and a data cache 1542. In another embodiment, memory system 1540 may include a translation lookaside buffer (TLB) 1545 that provides look-up of address values between physical and virtual addresses. In yet another embodiment, memory system 1540 may include a memory management unit (MMU) 1544 for facilitating access to virtual memory. In still yet another embodiment, memory system 1540 may include a prefetcher 1543 for requesting instructions from memory before such instructions are actually needed to be executed, in order to reduce latency.

The operation of instruction architecture 1500 to execute an instruction may be performed through different stages. For example, using unit 1510 instruction prefetch stage 1530 may access an instruction through prefetcher 1543. Instructions retrieved may be stored in instruction cache 1532. Prefetch stage 1530 may enable an option 1531 for fast-loop mode, wherein a series of instructions forming a loop that is small enough to fit within a given cache are executed. In one embodiment, such an execution may be performed without needing to access additional instructions from, for example, instruction cache 1532. Determination of what instructions to prefetch may be made by, for example, branch prediction unit 1535, which may access indications of execution in global history 1536, indications of target addresses 1537, or contents of a return stack 1538 to determine which of branches 1557 of code will be executed next. Such branches may be possibly prefetched as a result. Branches 1557 may be produced through other stages of operation as described below. Instruction prefetch stage 1530 may provide instructions as well as any predictions about future instructions to dual instruction decode stage 1550.

Dual instruction decode stage 1550 may translate a received instruction into microcode-based instructions that may be executed. Dual instruction decode stage 1550 may simultaneously decode two instructions per clock cycle. Furthermore, dual instruction decode stage 1550 may pass its results to register rename stage 1555. In addition, dual instruction decode stage 1550 may determine any resulting branches from its decoding and eventual execution of the microcode. Such results may be input into branches 1557.

Register rename stage 1555 may translate references to virtual registers or other resources into references to physical registers or resources. Register rename stage 1555 may include indications of such mapping in a register pool 1556. Register rename stage 1555 may alter the instructions as received and send the result to issue stage 1560.

Issue stage 1560 may issue or dispatch commands to execution entities 1565. Such issuance may be performed in an out-of-order fashion. In one embodiment, multiple instructions may be held at issue stage 1560 before being executed. Issue stage 1560 may include an instruction queue 1561 for holding such multiple commands. Instructions may be issued by issue stage 1560 to a particular processing entity 1565 based upon any acceptable criteria, such as availability or suitability of resources for execution of a given instruction. In one embodiment, issue stage 1560 may reorder the instructions within instruction queue 1561 such that the first instructions received might not be the first instructions executed. Based upon the ordering of instruction queue 1561, additional branching information may be provided to branches 1557. Issue stage 1560 may pass instructions to executing entities 1565 for execution.

Upon execution, writeback stage 1570 may write data into registers, queues, or other structures of instruction set architecture 1500 to communicate the completion of a given command. Depending upon the order of instructions arranged in issue stage 1560, the operation of writeback stage 1570 may enable additional instructions to be executed. Performance of instruction set architecture 1500 may be monitored or debugged by trace unit 1575.

Figure 16:
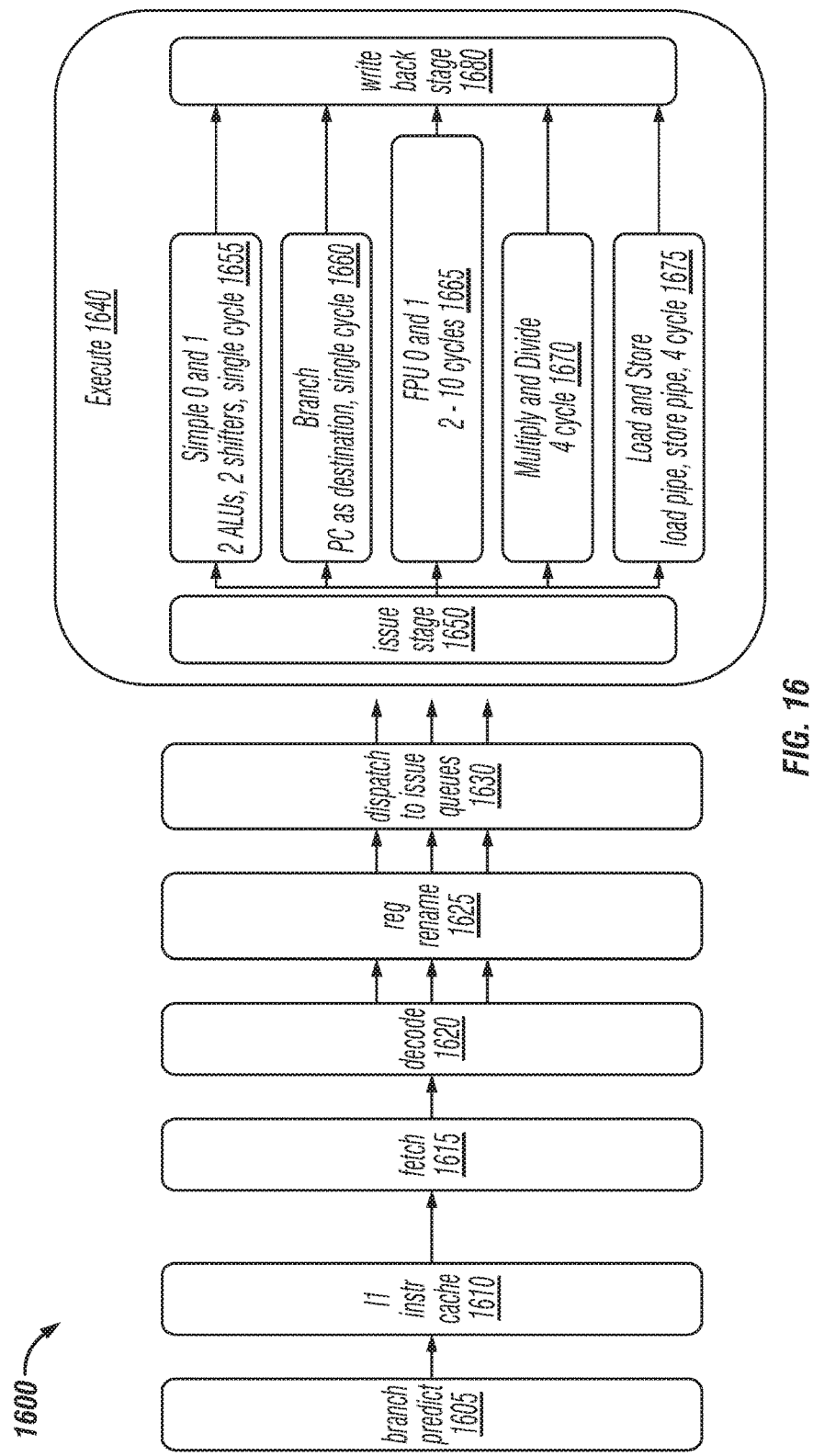
FIG. 16 is a block diagram of an execution pipeline for an instruction set architecture of a processor, in accordance with embodiments of the present disclosure.

FIG. 16 is a block diagram of an execution pipeline 1600 for an instruction set architecture of a processor, in accordance with embodiments of the present disclosure. Execution pipeline 1600 may illustrate operation of, for example, instruction architecture 1500 of FIG. 15.

Execution pipeline 1600 may include any suitable combination of steps or operations. In 1605, predictions of the branch that is to be executed next may be made. In one embodiment, such predictions may be based upon previous executions of instructions and the results thereof. In 1610, instructions corresponding to the predicted branch of execution may be loaded into an instruction cache. In 1615, one or more such instructions in the instruction cache may be fetched for execution. In 1620, the instructions that have been fetched may be decoded into microcode or more specific machine language. In one embodiment, multiple instructions may be simultaneously decoded. In 1625, references to registers or other resources within the decoded instructions may be reassigned. For example, references to virtual registers may be replaced with references to corresponding physical registers. In 1630, the instructions may be dispatched to queues for execution. In 1640, the instructions may be executed. Such execution may be performed in any suitable manner. In 1650, the instructions may be issued to a suitable execution entity. The manner in which the instruction is executed may depend upon the specific entity executing the instruction. For example, at 1655, an ALU may perform arithmetic functions. The ALU may utilize a single clock cycle for its operation, as well as two shifters. In one embodiment, two ALUs may be employed, and thus two instructions may be executed at 1655. At 1660, a determination of a resulting branch may be made. A program counter may be used to designate the destination to which the branch will be made. 1660 may be executed within a single clock cycle. At 1665, floating point arithmetic may be performed by one or more FPUs. The floating point operation may require multiple clock cycles to execute, such as two to ten cycles. At 1670, multiplication and division operations may be performed. Such operations may be performed in four clock cycles. At 1675, loading and storing operations to registers or other portions of pipeline 1600 may be performed. The operations may include loading and storing addresses. Such operations may be performed in four clock cycles. At 1680, write-back operations may be performed as required by the resulting operations of 1655-1675.

Figure 17:
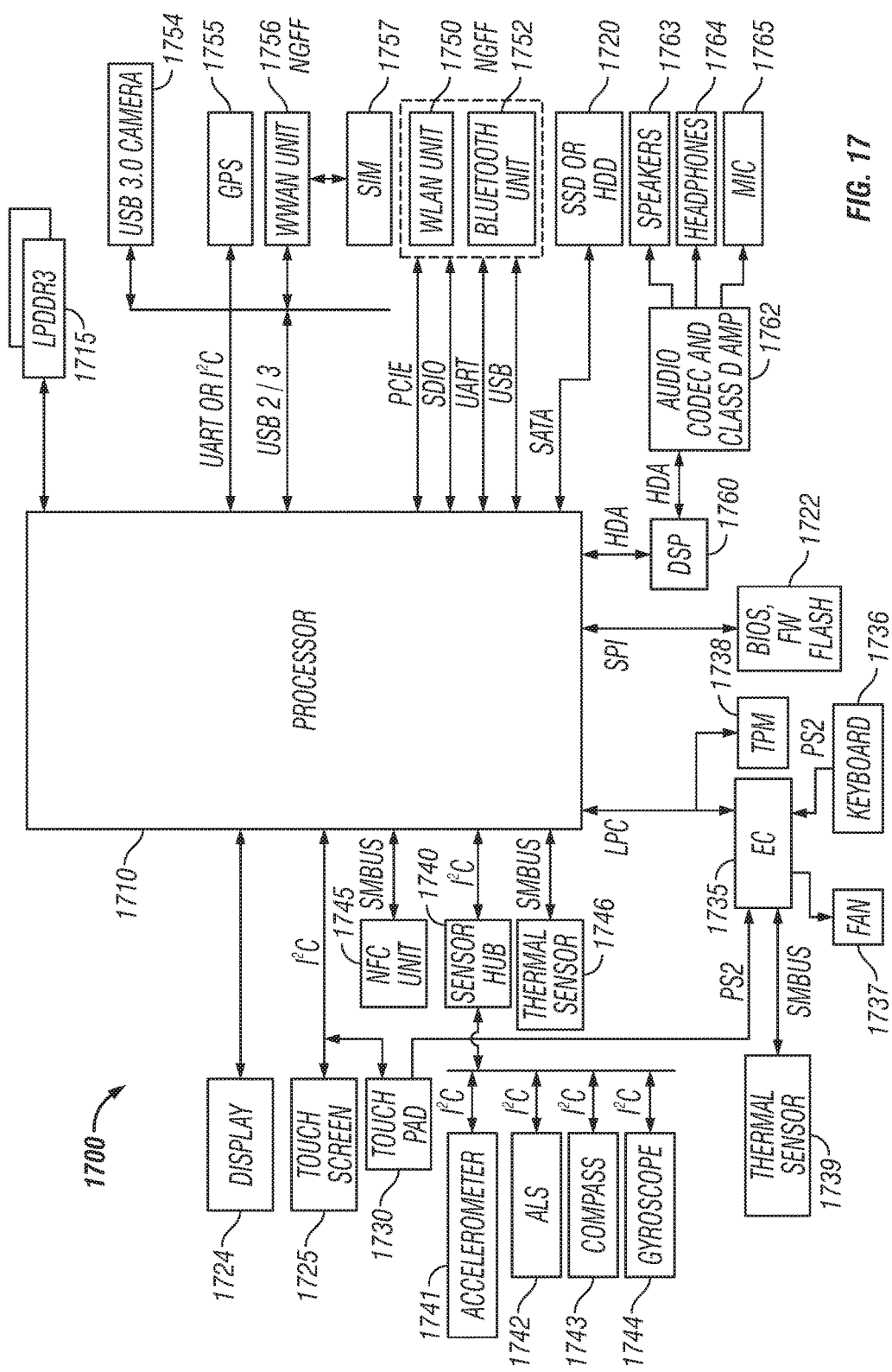
FIG. 17 is a block diagram of an electronic device for utilizing a processor, in accordance with embodiments of the present disclosure.

FIG. 17 is a block diagram of an electronic device 1700 for utilizing a processor 1710, in accordance with embodiments of the present disclosure. Electronic device 1700 may include, for example, a notebook, an ultrabook, a computer, a tower server, a rack server, a blade server, a laptop, a desktop, a tablet, a mobile device, a phone, an embedded computer, or any other suitable electronic device.

Electronic device 1700 may include processor 1710 communicatively coupled to any suitable number or kind of components, peripherals, modules, or devices. Such coupling may be accomplished by any suitable kind of bus or interface, such as I2C bus, system management bus (SMBus), low pin count (LPC) bus, SPI, high definition audio (HDA) bus, Serial Advance Technology Attachment (SATA) bus, USB bus (versions 1, 2, 3), or Universal Asynchronous Receiver/Transmitter (UART) bus.

Such components may include, for example, a display 1724, a touch screen 1725, a touch pad 1730, a near field communications (NFC) unit 1745, a sensor hub 1740, a thermal sensor 1746, an express chipset (EC) 1735, a trusted platform module (TPM) 1738, BIOS/firmware/flash memory 1722, a digital signal processor 1760, a drive 1720 such as a solid state disk (SSD) or a hard disk drive (HDD), a wireless local area network (WLAN) unit 1750, a Bluetooth unit 1752, a wireless wide area network (WWAN) unit 1756, a global positioning system (GPS) 1755, a camera 1754 such as a USB 3.0 camera, or a low power double data rate (LPDDR) memory unit 1715 implemented in, for example, the LPDDR3 standard. These components may each be implemented in any suitable manner.

Furthermore, in various embodiments other components may be communicatively coupled to processor 1710 through the components discussed above. For example, an accelerometer 1741, ambient light sensor (ALS) 1742, compass 1743, and gyroscope 1744 may be communicatively coupled to sensor hub 1740. A thermal sensor 1739, fan 1737, keyboard 1736, and touch pad 1730 may be communicatively coupled to EC 1735. Speakers 1763, headphones 1764, and a microphone 1765 may be communicatively coupled to an audio unit 1762, which may in turn be communicatively coupled to DSP 1760. Audio unit 1762 may include, for example, an audio codec and a class D amplifier. A SIM card 1757 may be communicatively coupled to WWAN unit 1756. Components such as WLAN unit 1750 and Bluetooth unit 1752, as well as WWAN unit 1756 may be implemented in a next generation form factor (NGFF).

As processor technology has evolved, the amount of cache capacity has tended to increase. An increase in cache size may increase processing bandwidth or capabilities of a processor. However, the amount of cache in a processor may cause higher power consumption for the processor. In order to increase cache size without a corresponding increase in power consumption, a processor or components of a processor (including a cache) may be configured to operate at a lower supply voltage. Although using a lower supply voltage may reduce power consumption of a processor (as compared to a higher supply voltage), a lower supply voltage may expose defects in a cache leading to an increase in the frequency of in-field cache failures.

A cache may be composed of arrays of individual bit cells that each store a binary bit. To allow access to information stored in a cache, bit cells in a cache may be organized into rows and columns. Although bit cells in a cache may be designed to have the same capabilities and performance, manufacturing variations or defects may cause individual bit cells, rows, or columns to perform differently or to have different capabilities. For example, manufacturing variations may cause different bit cells, rows, or columns to have different minimum operating voltages. Accordingly, lowering a supply voltage of a cache may cause the supply voltage to drop below a minimum supply voltage of one or more bit cells, rows, or columns. Operating with a supply voltage below the minimum operating voltage may cause a cache failure. In addition to process variations, manufacturing defects may cause one or more bit cells, rows, or columns to be wholly inoperable. Accordingly, a processor may contain circuitry and logic to repair or replace a defective or "weak" bit cell, row, or column. A bit cell, row, or column may be referred to as "weak" if it has a high minimum operating voltage as compared to other bits cells, rows, or columns in a cache.

Historically, cache repair has been performed at a manufacturer's facility during a manufacturing test process. During testing, specialized testing equipment operates to identify bit cells, rows, or columns that need repair or replacement. For example, testing equipment may be used to write known test data to a cache at various supply voltages. The testing equipment may read the data back and identify defective bit cells by comparing the read data to the expected known test data. Some processors may include circuits to perform a built-in-self-test (BIST) of a cache. Test equipment identifies defective cells by setting a supply voltage and causing a processor to execute a BIST routine on a cache. After identifying locations of weak or defective cells, a tester may repair the cache by programming the processor to replace weak or defective bit cells, rows, or columns with redundant cache resources to be used for repairs. For example, the locations of those rows/columns/bits that need to be replaced may be programmed in dedicated fuses. Upon booting in the field, logic within the processor may read information from these fuses and use that information to redirect traffic away from the defective cache areas to a set of redundant cache resources. Accordingly, testing during manufacturing may be an effective way to identify defects that are detectable early in the life span of a processor.

In some cases, bit cells may fail after a processor is sold to a customer or end user. As a processor uses a bit cell repeatedly, a time dependent defect may weaken a bit cell, row, or column by, for example, causing the minimum operating voltage of that bit cell, row, or column to rise over time. Testing during manufacturing may not address these age-related defects, because the bits cells, row, or columns may perform within allowable tolerances at the time of testing during manufacturing. Accordingly, to cover these age-related defect issues, various techniques have been employed. These include using a larger and more complex error-correcting code (ECC) algorithm, such as a Double Error Correct, Triple Error Detect (DECTED) algorithm as opposed to a more efficient Single Error Correct, Double Error Detect (SECDED) algorithm. A DECTED algorithm may provide coverage for more errors due to a stronger in-field error correction capability, which, in turn, may allow operation in spite of some age related defects in bit cells. However, prior schemes to identify and repair in-field failures have come with significant overhead penalties, such as longer cache access latencies due to a more complex algorithm, larger cell areas, and higher power consumption due to the ECC scheme employed.

The systems and methods of the present disclosure provide a mechanism for granular in-field cache repair that allows in-field cache repair without incurring significant overhead penalties. Embodiments of the present disclosure may identify in-field defects, dynamically switch to using redundant cache resources without requiring a CPU reset for recovery of those defects, and store repair information in on-package non-volatile memory.

Figure 18:
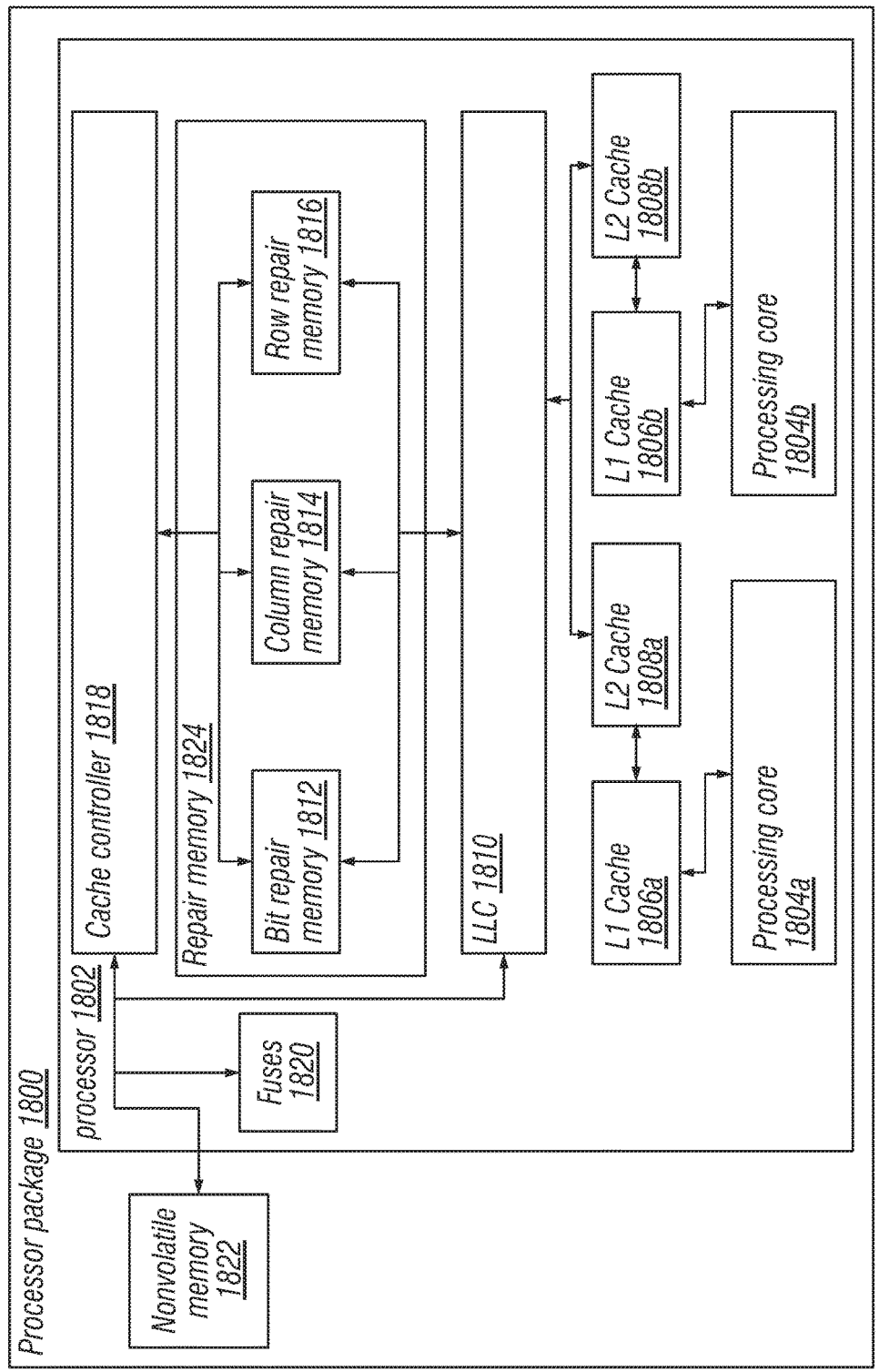
FIG. 18 is a block diagram of a processor package including a processor operable to perform granular in-field cache repairs, in accordance with embodiments of the present disclosure.

FIG. 18 is a block diagram of a processor package including a processor operable to perform granular in-field cache repairs, in accordance with embodiments of the present disclosure. Processor package 1800 may retain processor 1802 and peripheral components, such as non-volatile memory 1822, so that processor 1802 and peripheral components may be coupled to a system. For example, a processor package may include a rigid substrate (not shown). Processor 1802 may be soldered to (or otherwise affixed) to the rigid substrate. The rigid substrate may include electrical traces that couple processor 1802 to leads, pins, or solder points (not shown) so that processor package 1800 may be installed in a system. For example, in some embodiments, processor package 1800 may be soldered to a motherboard in a system. In other embodiments, processor package 1800 may be retained within a socket on a motherboard in a system.

Processor 1802 may include processing cores 1804a and 1804b (collectively "processing cores 1804"). Processing cores 1804 may include similar features to any of the processors described above with reference to FIGS. 1-17. Processing cores 1804 may each be associated with a cache hierarchy. A cache hierarchy may include one or more interconnected portions of cache memory accessible by processing cores 1804. For example, processing cores 1804 are connected to a three-level cache hierarchy. Processing cores 1804a and 1804b may be communicatively coupled to first level (L1) caches 1806a and 1806b, respectively. Typically, an L1 cache is designed to minimize access latency so that a processing core can access or store instructions and data as rapidly as necessary. L1 caches 1806a and 1806b may be communicatively coupled to second level caches (L2) 1808a and 1808b, respectively. L2 caches may be designed to have higher latency than L1 caches, but lower power consumption. Accordingly, L2 caches typically have a higher capacity than L1 caches. If a processing core requests data or an instruction that is not present in an L1 cache, the processor will determine whether the data or instruction is stored in an associated L2 cache. Likewise, if an L1 cache fills up, a portion of the stored data may be temporarily moved to an associated L2 cache to free capacity in the L1 cache. L2 caches 1808a and 1808b may be communicatively coupled to last-level cache (LLC) 1810. In the example embodiment in FIG. 18, each of L1 caches 1806a and 1806b, and L2 caches 1808a and 1808b, is associated with a single processing core, LLC 1810 may be shared between processing cores 1804a and 1804b. In other embodiments, one or more L1 caches or L2 caches may also be shared between multiple processing cores. Sharing LLC 1810 between processing cores 1804a and 1804b may provide advantages such as allowing, at various times, one of processing cores 1804a and 1804b to use the whole capacity of LLC 1810. Sharing LLC 1810 between processing cores 1804a and 1804b may also allow reduced data redundancy by making it possible for different processes or threads executing on different processing cores to share cached data.

While FIG. 18 schematically illustrates a three-level cache hierarchy with a shared LLC, the scope of the present disclosure is not limited in this regard, and in different embodiments a two-level cache hierarchy, a cache hierarchy having greater than three levels, or a cache hierarchy with private LLCs may be provided. Also, while examples illustrating the present disclosure may refer to systems and methods for repairing LLC 1810, in other embodiments other cache levels may be repaired in accordance with one or more aspects of the present disclosure.

Processor 1802 may further comprise cache controller 1818. Cache controller 1818 may include circuitry or logic to manage access requests (such as write or read requests) to LLC 1810. For example, cache controller 1818 may include circuitry or logic to receive a request to write data to a location in a cache. Additionally, cache controller 1818 may include circuitry or logic receive a request to read data from a location in a cache.

Cache controller 1818 may include circuitry or logic to account for repairs made to LLC 1810. For example, LLC 1810 may include a defective portion that has been identified and repaired during manufacturing. A repair to a defective portion LLC 1810 may result in cache controller 1818 redirecting an access to the defective portion of LLC 1810 to a repair resource instead of the defective portion of the cache.

In one example, rather than reading data from a defective portion of a cache, cache controller 1818 may read data from a repair memory 1824 for storing the cache repair data. In some embodiments, responsive to receiving a read request, cache controller 1818 may, in parallel with retrieving the requested cache data from a cache, determine whether the read request targets an area of a cache that has been repaired. If cache controller 1818 determines that the read request targets an area of a cache that has been repaired, cache controller 1818 may read cache repair data (i.e., a bit, column, or row) corresponding to the targeted portion of the cache from a repair memory. Cache controller 1818 may then multiplex or combine the retrieved cache repair data read from repair memory 1824 with the cache data to return repaired cache data to the requesting agent.

A cache write operation may be performed in a similar manner to the above described cache read operation. In some embodiments, responsive to receiving a cache write request, cache controller 1818 may determine whether the write request targets an area of the cache that has been repaired. In parallel with writing the data specified by the request to a cache location identified by the request, cache controller 1818 may also identify a location in a repair memory associated with the repaired portion of the cache. Cache controller 1818 may write at least part of the data into the repair memory associated with the repaired portion of the cache.

Cache controller 1818 may include circuitry or logic to determine whether a location in LLC 1810 has been repaired. In some embodiments of the present disclosure, cache controller 1818 may query a content-addressable memory (CAM) for storing identifiers of cache locations that have been repaired. A CAM may store repair information so that a cache repair location associated with a particular cache location may be identified using a physical address of the cache location and a cache way of the cache location. In some embodiments, cache controller 1818 may include circuitry or logic to determine whether a cache location has been repaired by querying a CAM with the physical address and the identifier of the cache way. If the CAM returns a hit, cache controller 1818 determines that the location has been repaired. Cache controller 1818 may access repair data (e.g., a specific bit, column, or row) by using the index of the CAM hit to access repair memory.

Defects in LLC 1810 typically impact an individual bit cell, a column of bits cells, or a row of bit cells. Accordingly, repair memory 1824 may include various repair resources configured to repair these types of defects. For example, repair memory 1824 may include bit repair memory 1812, column repair memory 1814, and row repair memory 1816. Cache controller 1818 may be coupled to resources within repair memory 1824. For example, cache controller 1818 may be coupled to bit repair memory 1812, column repair memory 1814, and row repair memory 1816.

Each of bit repair memory 1812, column repair memory 1814, and row repair memory 1816 may include a first cache repair memory portion to store cache repair data. In some embodiments, the first cache repair memory portion may be implemented as a register file. Each of bit repair memory 1812, column repair memory 1814, and row repair memory 1816 may additionally include a second cache repair memory portion to store identifiers of cache locations for which the cache repair data is stored by the first cache repair memory portion. In some embodiments, the second cache repair memory portion may be a CAM.

Cache controller 1818 may be configured to retrieve bit repair data from bit repair memory 1812. In some embodiments, to process a read request directed to LLC 1810, cache controller 1818 may look up, in a CAM in bit repair memory 1812, at least a portion of the physical address and the identifier of the cache way corresponding to a physical address of the read request to LLC 1810. If the CAM returns a hit, cache controller 1818 may retrieve bit repair data from a register file in bit repair memory 1812 at the location identified by the index returned by the CAM hit. Cache controller 1818 may be further configured to write bit repair data to bit repair memory 1812. In some embodiments, to process a write request directed to LLC 1810, cache controller 1818 may look up, in a CAM in bit repair memory 1812, at least a portion of the physical address and the identifier of the cache way corresponding to the physical address of the write request to LLC 1810. If the CAM returns a hit, cache controller 1810 may write a portion of the data in the write request to a register file in bit repair memory 1812 at the location identified by the index returned by the CAM hit.

Cache controller 1818 may be configured to retrieve column repair data from column repair memory 1814. In some embodiments, to process a read request directed to LLC 1810, cache controller 1818 may look up, in a CAM in column repair memory 1814, at least a portion of the physical address and the identifier of the cache way corresponding to a physical address of the read request to LLC 1810. If the CAM returns a hit, cache controller 1818 may retrieve column repair data from a register file in column repair memory 1814 at the location identified by the index returned by the CAM hit. Cache controller 1818 may be further configured to write column repair data to column repair memory 1814. In some embodiments, to process a write request to LLC 1810, cache controller 1818 may look up, in a CAM in column repair memory 1814, at least a portion of the physical address and the identifier of the cache way corresponding to the physical address of the write request directed to LLC 1810. If the CAM returns a hit, cache controller 1810 may write a portion of the data in the write request to a register file in column repair memory 1814 at the location identified by the index returned by the CAM hit.

Cache controller 1818 may be configured to retrieve row repair data from row repair memory 1816. In some embodiments, to process a read request directed to LLC 1810, cache controller 1818 may look up, in a CAM in row repair memory 1816, at least a portion of the physical address and the identifier of the cache way corresponding to a physical address of the read request to LLC 1810. If the CAM returns a hit, cache controller 1818 may retrieve row repair data from a register file in row repair memory 1816 at the location identified by the index returned by the CAM hit. Cache controller 1818 may be further configured to write row repair data to row repair memory 1816. In some embodiments, to process a write request to LLC 1810, cache controller 1818 may look up, in a CAM in row repair memory 1816, at least a portion of the physical address and the identifier of the cache way corresponding to the physical address of the write request directed to LLC 1810. If the CAM returns a hit, cache controller 1810 may write a portion of the data in the write request to a register file in row repair memory 1816 from the location identified by the index returned by the CAM hit.

Cache controller 1818 may include circuitry or logic to initialize repair memory 1824. As discussed above, repair memory 1824 may include one or more CAMs for use in determining whether a location in LLC 1810 has been repaired. However, the CAMs in repair memory 1824 may be reset when processor 1802 is reset. Accordingly, cache controller 1818 may reinitialize one or more CAMs in repair memory 1824 after processor 1802 is reset. For example, cache controller 1818 may read a programmable circuit associated with LLC 1810. A programmable circuit may include a non-volatile memory to store repair information identified during a manufacturing test process. In some embodiments, the programmable circuit may include fuses 1820, which may be set and/or cleared at the production testing stage responsive to identifying defects of cache rows, cache columns, and/or individual cache bits. Upon a reset of processor 1802, cache controller 1818 may initialize on or more CAMs in repair memory 1824 by reading the repair information stored in fuses 1820 and writing the repair information into the CAMs.

Cache controller 1818 may also include circuitry or logic to configure repair memory 1824 with in-field repair information. As described in further detail with reference to FIGS. 19-21, cache controller 1818 may be configured to identify defects in LLC 1810 after processor 1802 is deployed in an end-user system (i.e., after manufacturing test defect identification is no longer available to identify defects). Accordingly, cache controller 1818 may include circuitry or logic to initialize repair memory 1824 with previously identified in-field repairs. For example, cache controller 1818 may be communicatively coupled to non-volatile memory 1822. Non-volatile memory 1822 may be located on package 1800 of processor 1802. In some embodiments, non-volatile memory 1822 may be implemented as a flash memory, or any other suitable non-volatile memory. In some embodiments, non-volatile memory 1822 may store in-field repair data identifying defects of cache rows, cache columns, and/or individual cache bits. Upon a reset of processor 1802, cache controller 1818 may initialize one or more CAMs in repair memory 1824 by reading the repair information stored in non-volatile memory 1822 and writing the in-field repair data into the CAMs in repair memory 1824.

Figure 19A:
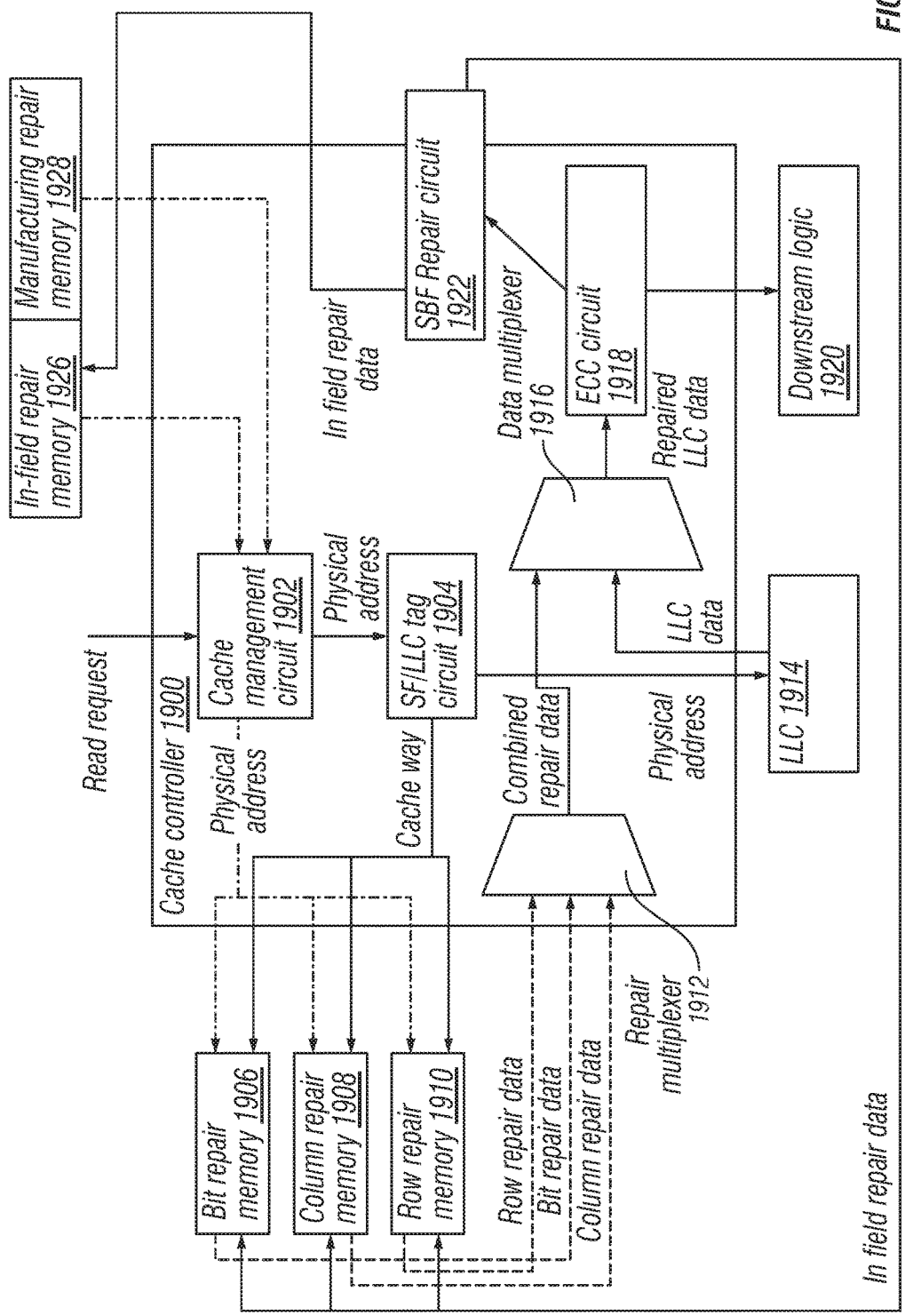
FIG. 19A illustrates a block diagram of a cache controller with circuitry to perform granular in-field cache repair while performing a read operation, in accordance with embodiments of the present disclosure.

FIG. 19A illustrates a block diagram of a cache controller including circuitry to perform granular in-field cache repair while performing a read operation, in accordance with embodiments of the present disclosure. Cache controller 1900 may include similar features to cache controller 1818, discussed above with reference to FIG. 18. Cache controller 1900 may include cache management circuit 1902. Cache management circuit 1902 may include circuitry or logic to perform various functions of cache controller 1900.

For example, cache management circuit 1902 may include circuitry to receive an access request to a location in a cache from another agent in a processor. An access request may include a read request or a write request. Upon receiving a read request, cache management circuit 1902 may process the read request. A read request may include a physical address of the target area of a cache to be read.

Cache management circuit 1902 may provide the physical address to snoop filter/LLC (SF/LLC) tag circuit 1904. SF/LLC tag circuit 1904 may participate in the management of data coherence between the processors that are communicatively coupled to cache controller 1900. SF/LLC tag circuit 1904 may maintain a representation of the data stored in one or more LLCs that are communicatively coupled to cache controller 1900. SF/LLC tag circuit 1904 may store a representation of the organization of the data in each of these LLCs. For example, in some embodiments, SF/LLC tag circuit 1904 may include a tag directory indexing data in the LLCs. SF/LLC tag circuit 1904 may monitor data accesses to the LLCs. These data accesses, such as read requests, may contain data organization information. By monitoring these requests, SF/LLC tag circuit 1904 may maintain a representation of the organization of each LLC that is up to date. Upon receiving a read request from cache management circuit 1902, SF/LLC tag circuit 1904 may identify a cache way associated with the physical address included in the request. SF/LLC tag circuit 1904 may provide the cache way associated with the physical address to each of bit repair memory 1906, column repair memory 1908, and row repair memory 1910. Bit repair memory 1906, column repair memory 1908, and row repair memory 1910 may include similar features to bit repair memory 1812, column repair memory 1814, and row repair memory 1816, discussed above with reference to FIG. 18.

Cache management circuit 1902 may also send the physical address included in the request to each of bit repair memory 1906, column repair memory 1908, and row repair memory 1910. As discussed above with reference to FIG. 18, bit repair memory 1906, column repair memory 1908, and row repair memory 1910 may use a received physical address and a received cache way to determine whether a location in a cache has been repaired. Bit repair memory

1906, column repair memory 1908, and row repair memory 1910 may further use a received physical address and a received cache way to provide the repaired data. Bit repair memory 1906, column repair memory 1908, and row repair memory 1910 may provide bit repair data, row repair data and column repair data, respectively, if any such repair data is associated with a target cache address, to repair multiplexer 1912. Repair multiplexer 1912 may include circuitry or logic to combine the bit repair data, row repair data, and/or column repair data into combined repair data. Repair multiplexer 1912 may provide the combined repair data to data multiplexer 1916.

SF/LLC tag circuit 1904 may also use the physical address and the cache way to read the requested data from LLC 1914. LLC 1914 may include similar features to LLC 1810, discussed above with reference to FIG. 18. LLC 1914 may provide data read from LLC 1914 to data multiplexer 1916. Data multiplexer 1916 may include circuitry or logic to combine the data read from LLC 1914 with the combined repair data to generate repaired LLC data. For example, data multiplexer 1916 may replace one or more bits of the data read from LLC 1914 with one or more bits of the combined repair data. Data multiplexer 1916 may transmit the repaired LLC data to error-correcting code (ECC) circuit 1918.

The repaired LLC data may be provided to ECC circuit 1918. ECC circuit 1918 may include circuitry or logic to determine whether the repaired LLC data includes unrepaired errors. If the repaired LLC data does not include unrepaired errors, ECC circuit 1918 may provide the repaired LLC data to downstream logic 1920. Downstream logic 1920 may include any other agent or circuit in a processor or computer system that may receive data from LLC 1914 as an input.

If ECC circuit 1918 determines that the repaired LLC data includes unrepaired errors, ECC circuit 1918 may send an error indication to single bit failure (SBF) repair circuit 1922. SBF repair circuit 1922 may track the occurrence of unrepaired errors to determine whether an in-field repair should be made to LLC 1914. For example, SBF repair circuit 1922 may include circuitry or logic to count the number of errors associated with specific bits, rows, or columns of LLC 1914, or to track a frequency of errors associated with specific bits, rows, or columns of LLC 1914, or any other suitable circuitry or logic to determine whether an in-field repair should be made to LLC 1914.

In some embodiments, based on a determination that an in-field repair should be made to LLC 1914, SBF repair circuit 1922 may determine whether another in-field repair attempt is currently pending. Typically, in-field failures will occur infrequently, and it is therefore unlikely that multiple in-field repairs would be pending at one time. Accordingly, in some embodiments, cache controller 1900 may be configured to process one repair attempt at a time. This may provide an advantage by obviating the need for specialized circuitry or logic to perform parallel repair attempts. However, as cache sizes increase and as power supply voltages are lowered, the frequency of in-field failures may rise. Accordingly, in some embodiments, SBF repair circuit 1922 may include circuitry or logic to perform parallel in-field repairs. In such embodiments, circuitry or logic to determine whether an in-field repair is pending may be modified to determine whether fewer than a predetermined maximum allowable number of repairs are pending at a given time, or may be omitted.

SBF repair circuit 1922 may include circuitry or logic to determine whether repair resources which could be used for the repair are available. Each of bit repair memory 1906, column repair memory 1908, and row repair memory 1910 may have a limited capacity. Accordingly, SBF repair circuit 1922 may query one or more of bit repair memory 1906, column repair memory 1908, and row repair memory 1910 to determine whether repair capacity is available.

If resources for the in-field repair are available, SBF repair circuit 1922 may attempt to flush the defective cache entry from LLC 1914. For example, SBF repair circuit 1922 may include circuitry or logic to invalidate defective data in lower level caches (such as L1 or L2 caches) that is associated with the defective portion of LLC 1914.

SBF repair circuit 1922 may send in-field repair data to one or more of bit repair memory 1906, column repair memory 1908, and row repair memory 1910. In-field repair data may identify a physical address and a cache way of LLC 1914 to be repaired. One or more of bit repair memory 1906, column repair memory 1908, and row repair memory 1910 may store in-field repair data in a CAM. Accordingly, if cache management circuit 1902 receives a subsequent read request directed to a repaired portion of LLC 1914, when the physical address of the read request is provided to bit repair memory 1906, column repair memory 1908, and row repair memory 1910, a CAM hit will occur, and the repair data will be substituted for the defective data from LLC 1914.

Additionally, SBF repair circuit 1922 may send in-field repair data to in-field repair memory 1926. In some embodiments, in-field repair memory 1926 may be a non-volatile memory (such as non-volatile memory 1822, discussed above with reference to FIG. 18) located on a package of a processor containing cache controller 1900. After beginning a repair, SBF repair circuit 1922 may send a signal to firmware (such as pCode) running on a processor that a repair is currently pending. In some embodiments, the signal may be sent through a general purpose sideband (GBSP) fabric. In some embodiments, the signal may be sent to a power control unit (PCU). A PCU may operate to write the in-field repair data to in-field repair memory 1926.

Cache management circuit 1902 may be further configured to initialize bit repair memory 1906, column repair memory 1908, and row repair memory 1910. As discussed above, with reference to FIG. 18, bit repair memory 1906, column repair memory 1908, and row repair memory 1910 may include one or more CAMs for use in determining whether a location in LLC 1914 has been repaired. However, CAMs in bit repair memory 1906, column repair memory 1908, and row repair memory 1910 may be reset when a processor is reset. Accordingly, cache management circuit 1902 may reinitialize one or more CAMs in bit repair memory 1906, column repair memory 1908, and row repair memory 1910 after the processor is reset. For example, cache management circuit 1902 may read a programmable circuit associated with LLC 1914, such as manufacturing repair memory 1928. Manufacturing repair memory 1928 may include a non-volatile memory to store repair information identified during a manufacturing test process. In some embodiments, the manufacturing repair memory 1928 may include fuses (such as fuses 1820, discussed above with reference to FIG. 18), which may be set and/or cleared at the production testing stage responsive to identifying defects of cache rows, cache columns, and/or individual cache bits. Upon a reset of a processor, cache management circuit 1902 may initialize one or more CAMs in bit repair memory 1906, column repair memory 1908, and row repair memory 1910 by reading the repair information stored in manufacturing repair memory 1928 and writing the repair information into the CAMs.

Cache management circuit 1902 may also include circuitry or logic to configure bit repair memory 1906, column repair memory 1908, and row repair memory 1910 with in-field repair information. For example, cache management circuit 1902 may be communicatively coupled to in-field repair memory 1926. During processor initialization, cache management circuit 1902 may initialize one or more CAMs in bit repair memory 1906, column repair memory 1908, and row repair memory 1910 by reading the repair information stored in in-field repair memory 1926 and writing the repair information into the CAMs. Because repair information is stored in in-field repair memory 1926, which is typically a non-volatile memory, previously identified in-field repair information may persist and be reused even after a processor is reset.

Although various components of cache controller 1900 are described as performing various functions, in other embodiments, functions of cache controller 1900 may be performed by any suitable circuit, or combined in a single circuit. For example, in some embodiments, cache management circuit 1902 may perform some or all of the functions of SF/LLC tag circuit 1904, repair multiplexer 1912, data multiplexer 1916, ECC circuit 1918, and/or SBF repair circuit 1922. Additionally, in some embodiments cache controller 1900 may include in-field repair memory 1926, manufacturing repair memory 1928, bit repair memory 1906, column repair memory 1908, and row repair memory 1910, LLC 1914, or downstream logic 1920.

Figure 19B:
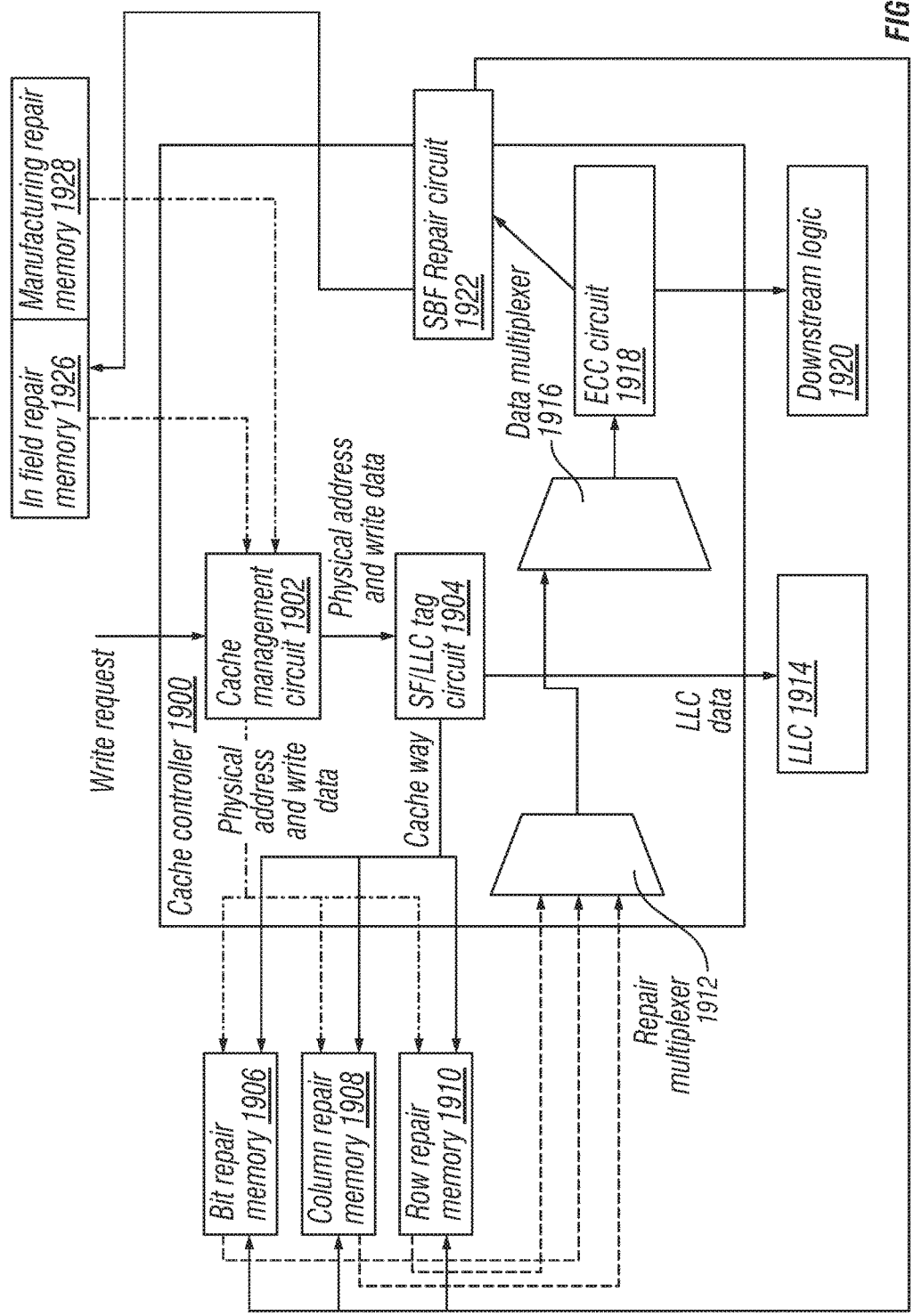
FIG. 19B illustrates a block diagram of a cache controller with circuitry to perform granular in-field cache repair while performing a write operation, in accordance with embodiments of the present disclosure.

FIG. 19B illustrates a block diagram of a cache controller including circuitry to perform granular in-field cache repair while performing a write operation, in accordance with embodiments of the present disclosure. The operation of cache controller 1900 during a write operation may be similar to the operation of cache controller 1900 during a read operation.

For example, cache management circuit 1902 may include circuitry to receive a write request to a location in a cache from another agent in the processor. Upon receiving the write request, cache management circuit 1902 may process the write request. A write request may include a physical address of the target area of a cache to be written to, and data to be written to the target area. Cache management circuit 1902 may provide the physical address to snoop filter/LLC tag module (SF/LLC) tag circuit 1904. Upon receiving a write request from cache management circuit 1902, SF/LLC tag circuit 1904 may identify a cache way associated with the physical address. SF/LLC tag circuit 1904 may provide the cache way associated with the physical address to each of bit repair memory 1906, column repair memory 1908, and row repair memory 1910.

Cache management circuit 1902 may also send the physical address and the data to each of bit repair memory 1906, column repair memory 1908, and row repair memory 1910. As discussed above with reference to FIG. 18, bit repair memory 1906, column repair memory 1908, and row repair memory 1910 may use a received physical address and a received cache way to determine whether a location in a cache has been repaired. Bit repair memory 1906, column repair memory 1908, and row repair memory 1910 may further use a received physical address and a received cache way to address a location in bit repair memory 1906, column repair memory 1908, and row repair memory 1910 in which to write the received data. Based on the received physical address and cache way, bit repair memory 1906, column repair memory 1908, and row repair memory 1910 may store a portion of the received data corresponding to a portion of the target area of LLC 1914 that has been repaired. Additionally, SF/LLC tag circuit 1904 may also use the physical address, the cache way, and the data to write the data to LLC 1914.

Although various components of cache controller 1900 are described as performing various functions, in other embodiments, functions of cache controller 1900 may be performed by any suitable circuit, or combined in a single circuit. For example, in some embodiments, a cache management circuit 1902 may perform some or all of the functions of SF/LLC tag circuit 1904, repair multiplexer 1912, data multiplexer 1916, ECC circuit 1918, or SBF repair circuit 1922. Additionally, in some embodiments cache controller 1900 may include in-field repair memory 1926, manufacturing repair memory 1928, bit repair memory 1906, column repair memory 1908, and row repair memory 1910, LLC 1914, or downstream logic 1920.

Figure 20:
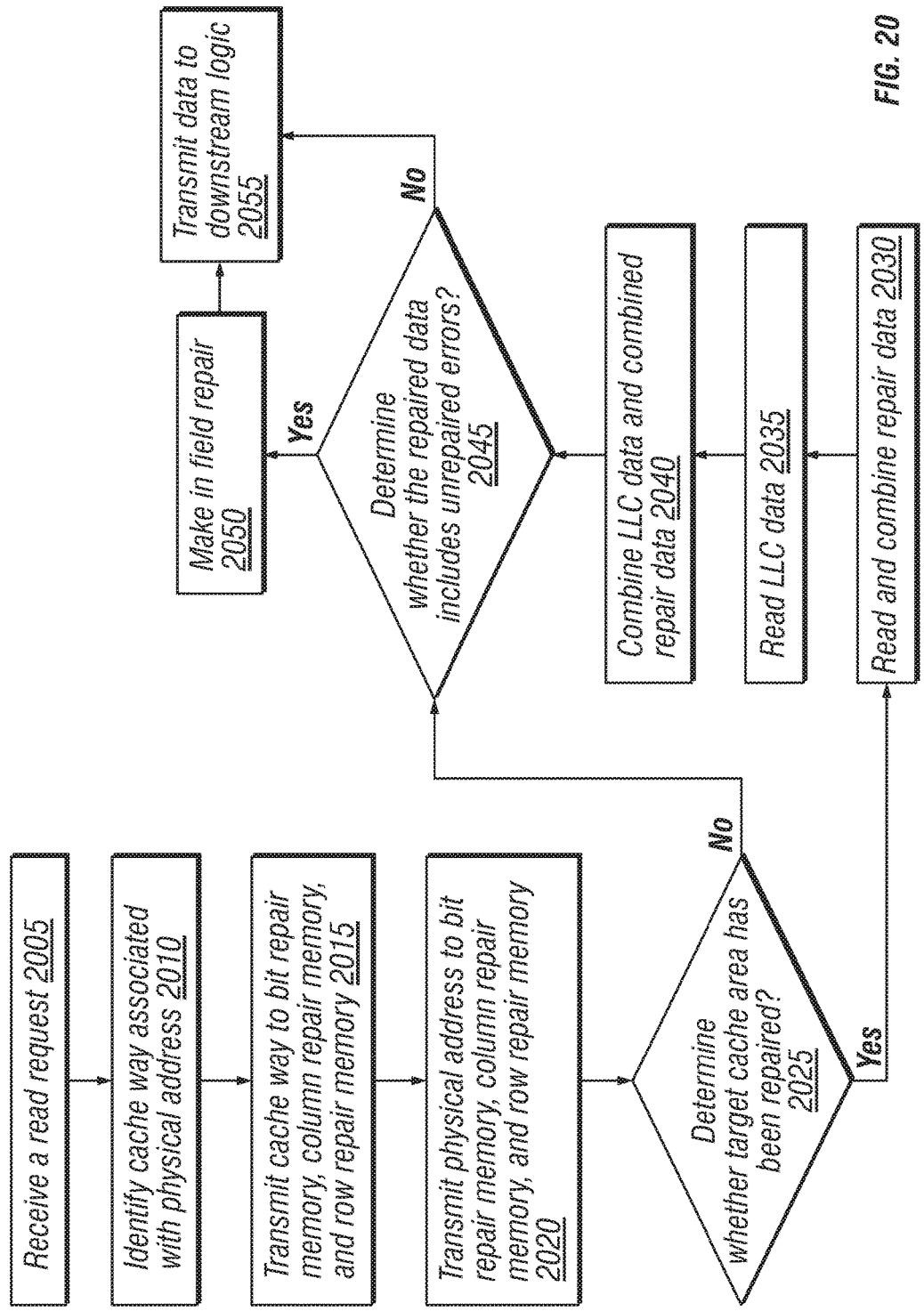
FIG. 20 illustrates an example method 2000 for an in-field repair capable cache controller to process a read request, according to embodiments of the present disclosure.

FIG. 20 illustrates an example method 2000 for a cache management circuit to process a read request, according to embodiments of the present disclosure. Method 2000 may be implemented by any of the elements shown in FIGS. 1-19. Method 2000 may be initiated by any suitable criteria and may initiate operation at any suitable point. In one embodiment, method 2000 may initiate operation at 2005. Method 2000 may include greater or fewer steps than those illustrated. Moreover, method 2000 may execute its steps in an order different than those illustrated below. Method 2000 may terminate at any suitable step. Moreover, method 2000 may repeat operation at any suitable step. Method 2000 may perform any of its steps in parallel with other steps of method 2000, or in parallel with steps of other methods.

At 2005, a cache controller may receive a read request. A cache controller may include circuitry or logic to receive an access request directed to a location in a cache from another agent in a processor. An access request may include a read. A read request may include a physical address of the target area of a cache to be read. Upon receiving a read request, the cache controller circuit may process the read request.

At 2010, the cache controller may identify a cache way associated with the physical address included in the read request. For example, the cache controller may provide the physical address to an SF/LLC circuit. An SF/LLC circuit may include circuitry or logic to identify a cache way associated with the received physical address.

At 2015, the cache controller may provide the cache way associated with the physical address to each of a bit repair memory, a column repair memory, and a row repair memory. In some embodiments, the bit repair memory, the column repair memory, and the row repair memory may include similar features to bit repair memory 1812, column repair memory 1814, and row repair memory 1816, discussed above with references to FIG. 18-19B.

At 2020, the cache controller may send the physical address to each of the bit repair memory, the column repair memory, and the row repair memory. As discussed above with reference to FIGS. 18-19B, a bit repair memory, a column repair memory, and a row repair memory may use a received physical address and a received cache way to determine whether a location in a cache has been repaired.

At 2025, the cache controller may use the received physical address and the received cache way to determine whether the target cache area has been repaired. For example, the cache controller may include circuitry or logic to determine whether a location in an LLC has been repaired. In some embodiments, the cache controller may query content-addressable memory (CAM) for storing identifiers of cache locations that have been repaired. A CAM may store repair information so that a cache repair location associated with a particular cache location may be identified using the physical address of the cache location and the cache way of the cache location. In some embodiments, the cache controller may include circuitry or logic to determine whether a cache location has been repaired by querying a CAM with the physical address and the identifier of the cache way. If the CAM returns a hit, the cache controller determines that the location has been repaired. If the target cache area has been repaired, method 2000 may proceed to 2030. If the target cache area has not been repaired, method 2000 may proceed to 2045.

At 2030, the cache controller may read and combine repair data associated with the target cache area. For example, a cache controller may access repair data for a specific bit, column, or row by using the index of a CAM hit to access each of a bit repair memory, a column repair memory, and a row repair memory. A cache controller may provide bit repair data, row repair data and/or column repair data to a repair multiplexer. The repair multiplexer may include circuitry or logic to combine the bit repair data, row repair data, and/or column repair data into combined repair data.

At 2035, the cache controller may read LLC data. For example, an SF/LLC circuit in the cache controller may use the physical address and the cache way to read the requested data from an LLC. An LLC may include similar features to LLC 1810, discussed above with reference to FIGS. 18-19B.

At 2040, the cache controller may combine repair data and LLC. In response to the read request, the LLC may provide data read from the LLC to a data multiplexer. The data multiplexer may include circuitry or logic to combine the data read from the LLC with the combined repair data to generate repaired the LLC data. For example, data multiplexer 1916 may replace one or bits of the data read from the LLC with one or more bits of the combined repair data.

At 2045, the cache controller may determine whether the repaired data includes unrepaired errors. For example, the data multiplexer may transmit the repaired LLC data to an error-correcting code (ECC) circuit. The ECC circuit in the cache controller may include circuitry or logic to determine whether the repaired LLC data includes unrepaired errors. If the repaired data includes unrepaired errors, method 2000 may proceed to 2050. If the repaired data does not include unrepaired errors, method 2000 may proceed to 2055.

At 2050, the cache controller may make an in-field repair. For example, if the ECC circuit determines that the repaired LLC data includes unrepaired errors, the ECC circuit may send an error indication to a single bit failure (SBF) repair circuit. The SBF repair circuit may track the occurrence of unrepaired errors to determine whether an in-field repair should be made to LLC. For example, the SBF repair circuit may include circuitry or logic to count the number of errors associated with specific bits, rows, or columns of LLC 1914, or to track a frequency of errors associated with specific bits, rows, or columns of LLC 1914, or any other suitable circuitry or logic to determine whether an in-field repair should be made to LLC 1914. If an in-repair is suggested, the cache controller may perform the in-field repair according to the steps of method 2100, discussed below with reference to FIG. 21.

At 2055, the cache controller may provide the repaired LLC data to downstream logic. Downstream logic may include any other agent or circuit in a processor or computer system that may receive data from an LLC as an input. Method 2000 may terminate or repeat.

Figure 21:
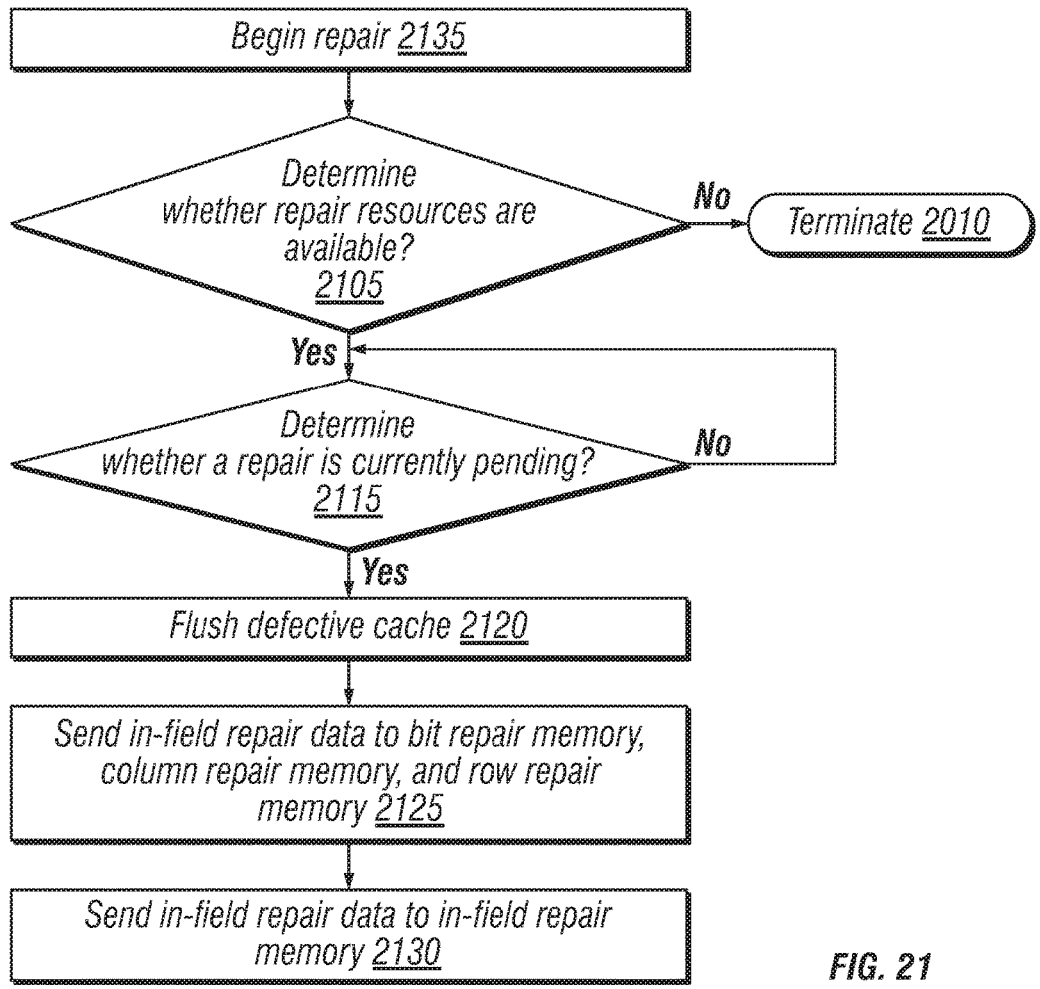
FIG. 21 illustrates an example method 2100 for granular in-field cache repair, according to embodiments of the present disclosure.

FIG. 21 illustrates an example method 2100 for performing granular in-field cache repair, according to embodiments of the present disclosure. Method 2100 may be implemented by any of the elements shown in FIGS. 1-20. Method 2100 may be initiated by any suitable criteria and may initiate operation at any suitable point. In one embodiment, method 2100 may initiate operation at 2105. Method 2100 may include greater or fewer steps than those illustrated. Moreover, method 2100 may execute its steps in an order different than those illustrated below. Method 2100 may terminate at any suitable step. Moreover, method 2100 may repeat operation at any suitable step. Method 2100 may perform any of its steps in parallel with other steps of method 2100, or in parallel with steps of other methods.

At 2105, a cache controller may determine whether repair resources are available. For example, an SBF repair circuit in the cache controller may include circuitry or logic to determine whether repair resources which could be used for the repair are available. Each of a bit repair memory, a column repair memory, and a row repair memory may have a limited capacity. Accordingly, an SBF repair circuit may query one or more of a bit repair memory, a column repair memory, and a row repair memory to determine whether repair resource capacity is available. If repair resources are available, method 2100 may proceed to 2115. If repair resources are not available, method 2100 may proceed to 2110.

At 2110, method 2100 may terminate or repeat.

At 2115, the cache controller may determine whether a repair is currently pending. For example, an SBF repair circuit in the cache controller may include circuitry or logic to determine whether another in-field repair attempt is currently pending. If a repair is currently pending, method 2100 may terminate or return to 2115. If no repair is pending, method 2100 may proceed to 2120.

At 2120, the cache controller may flush the defective cache entry from the LLC. For example, the SBF repair circuit 1922 may include circuitry or logic to invalidate defective data in lower level caches (such as L1 or L2 caches) that is associated with the defective portion of the LLC.

At 2125, the cache controller may send in-field repair data to a bit repair memory, a column repair memory, or a row repair memory. For example, the SBF repair circuit may send in-field repair data to one or more repair memories. The in-field repair data may identify a physical address and a cache way of a location in the LLC to be repaired. One or more of bit repair memory, column repair memory, and row repair memory may store in-field repair data in a CAM. Accordingly, if the cache controller receives a subsequent read request to a repaired portion of an LLC, when the physical address of the read request is provided to bit repair memory, column repair memory, and row repair memory, a CAM hit will occur, and the repair data will be substituted for the defective data from the LLC.

At 2130, the cache controller may send in-field repair data to an in-field repair memory. For example, the SBF repair circuit may send in-field repair data to the in-field repair memory. In some embodiments, the in-field repair memory may be a non-volatile memory located on a package of a processor containing the cache controller. An SBF repair circuit may send a signal to firmware (such as pCode) running on a processor that a repair is currently pending. In some embodiments, the signal may be sent through a general purpose sideband (GBSP) fabric. In some embodiments, the signal may be sent to a power control unit (PCU). A PCU may operate to write the in-field repair data to the in-field repair memory. Method 2100 may terminate or repeat.

Figure 22:
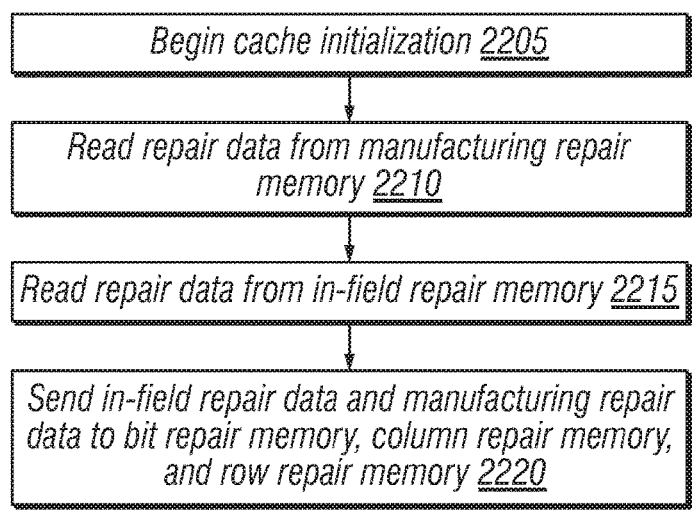
FIG. 22 illustrates an example method 2200 for initializing cache repair memories, according to embodiments of the present disclosure.

FIG. 22 illustrates an example method 2200 for initializing cache repair memories, according to embodiments of the present disclosure. Method 2200 may be implemented by any of the elements shown in FIGS. 1-21. Method 2200 may be initiated by any suitable criteria and may initiate operation at any suitable point. In one embodiment, method 2200 may initiate operation at 2205. Method 2200 may include greater or fewer steps than those illustrated. Moreover, method 2200 may execute its steps in an order different than those illustrated below. Method 2200 may terminate at any suitable step. Moreover, method 2100 may repeat operation at any suitable step. Method 2200 may perform any of its steps in parallel with other steps of method 2200, or in parallel with steps of other methods.

At 2205, a cache controller may begin cache initialization. For example, CAMs in bit repair memory, column repair memory, and row repair memory may be reset when a processor is reset. Accordingly, a cache controller may reinitialize CAMs in bit repair memory, column repair memory, and row repair memory after the processor is reset.

At 2210, the cache controller may read repair data from a manufacturing repair memory. For example, the cache controller may read a programmable circuit associated with an LLC. A manufacturing repair memory may include a non-volatile memory to store repair information identified during a manufacturing test process. In some embodiments, the manufacturing repair memory may include fuses, which may be set and/or cleared at the production testing stage responsive to the identification of defects in cache rows, cache columns, and/or individual cache bits.

At 2215, the cache controller may read repair data from in-field repair memory. For example, the cache controller may be communicatively coupled to in-field repair memory. During processor initialization, the cache controller may read the repair information stored in in-field repair memory. Because repair information is stored in in-field repair memory, which is typically a non-volatile memory, previously identified in-field repair information may persist and be reused even after a processor is reset.

At 2220, the cache controller may send in-field repair data and manufacturing repair data to bit repair memory, column repair memory, and row repair memory. For example, a cache controller may initialize CAMs in bit repair memory, column repair memory, and row repair memory by writing repair information into the CAMs. A cache controller may include circuitry or logic to configure bit repair memory, column repair memory, and row repair memory with both in-field repair information and manufacturing repair information.

Embodiments of the mechanisms disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code may be applied to input instructions to perform the functions described herein and generate output information. The output information may be applied to one or more output devices, in known fashion. For purposes of this application, a processing system may include any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine-readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

Accordingly, embodiments of the disclosure may also include non-transitory, tangible machine-readable media containing instructions or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part-on and part-off processor.

Thus, techniques for performing one or more instructions according to at least one embodiment are disclosed. While certain exemplary embodiments have been described and shown in the accompanying drawings, it is to be understood that such embodiments are merely illustrative of and not restrictive on other embodiments, and that such embodiments not be limited to the specific constructions and arrangements shown and described, since various other modifications may occur to those ordinarily skilled in the art upon studying this disclosure. In an area of technology such as this, where growth is fast and further advancements are not easily foreseen, the disclosed embodiments may be readily modifiable in arrangement and detail as facilitated by enabling technological advancements without departing from the principles of the present disclosure or the scope of the accompanying claims.

Embodiments of the present disclosure may include a packaged processor, comprising a processor, including a cache controller, a last level cache coupled to the cache controller; and a repair memory coupled to the cache controller, and a non-volatile memory external to the processor and coupled to the cache controller, the non-volatile memory including circuitry to store in-field repair information. In combination with any of the above embodiments, the cache controller may include circuitry to identify an in-field failure of at least one bit in the last level cache. In combination with any of the above embodiments, the cache controller may include circuitry to perform, in response to the identification of the in-field failure of the at least one bit in the last level cache, an in-field repair of the last level cache. In combination with any of the above embodiments, to identify an in-field failure of a bit in the last level cache, the cache controller may further includes circuitry to read data from a target location in the last level cache, apply error-correction code to determine that the data includes an error, increment a count of a number of errors associated with the target location, and determine that the count of the number of errors associated with the target location exceeds a predetermined threshold. In combination with any of the above embodiments, to perform an in-field repair, the cache controller may further includes circuitry to determine that no other in-field repair is pending in the last level cache, determine that a repair resource is available, write in-field repair data to the repair memory, the in-field repair data including, a physical address associated with a target location in the last level cache including the at least one bit; and a cache way associated with the target location in the last level cache. In combination with any of the above embodiments, to perform an in-field repair, the cache controller may further include circuitry to determine that a repair resource is available, write in-field repair data to the repair memory, the in-field repair data including a physical address associated with a target location in the last level cache including the at least one bit, and a cache way associated with the target location in the last level cache. In combination with any of the above embodiments, to perform the in-field repair, the cache controller may further include circuitry to write the in-field repair data to the non-volatile memory. In combination with any of the above embodiments, to perform the in-field repair, the cache controller may further include circuitry to transmit a signal that a repair is currently pending to a circuit executing firmware on the processor. In combination with any of the above embodiments, the circuitry to transmit a signal that a repair is currently pending to a circuit executing firmware on the processor may include a general purpose sideband interface. In combination with any of the above embodiments, to perform the in-field repair, the cache controller may further include circuitry to flush data from a target location in the last level cache including the at least one bit. In combination with any of the above embodiments, the packaged processor may further include a lower level cache coupled to the last level cache, and wherein to flush data from a target location in the last level cache may include circuitry to invalidate data in the lower level cache that is associated with the target location in the last level cache. In combination with any of the above embodiments, the packaged processor may further include a manufacturing repair memory including circuitry to store manufacturing repair data, wherein the cache controller further includes circuitry to read manufacturing repair data from a manufacturing repair memory, read in-field repair data from the non-volatile memory, and transmit the manufacturing repair data and the in-field repair data to the repair memory.

Some embodiments of the present disclosure may include a cache controller. In combination with any of the above embodiments, a cache controller may receive a request to access data in a target location of a last level cache of a processor on a processor package, identify an in-field failure in the target location of the last level cache, perform, in response to the identification of the in-field failure, an in-field repair, including circuitry to write in-field repair information to a non-volatile memory on the processor package and external to the processor, the non-volatile memory including circuitry to store in-field repair information. In combination with any of the above embodiments, to identify an in-field failure in the target location, the cache controller may further include circuitry to read data from the target location in the last level cache, apply error-correction code to determine that the data includes an error, increment a count of a number of errors associated with the target location, determine that the count of the number of errors associated with the target location exceeds a predetermined threshold. In combination with any of the above embodiments, to perform an in-field repair, the cache controller may further include circuitry to determine that no other in-field repair is pending in the last level cache, determine that a repair resource is available, write in-field repair data to a repair memory, the in-field repair data including a physical address associated with the target location in the last level cache, and a cache way associated with the target location in the last level cache. In combination with any of the above embodiments, to perform an in-field repair, the cache controller may further include circuitry to determine that a repair resource is available, write in-field repair data to a repair memory, the in-field repair data including a physical address associated with the target location in the last level cache, and a cache way associated with the target location in the last level cache. In combination with any of the above embodiments, the repair memory may include a bit repair memory, a column repair memory, and a row repair memory. In combination with any of the above embodiments, to perform the in-field repair, the cache controller may further include circuitry to transmit a signal that a repair is currently pending to a circuit executing firmware on the processor. In combination with any of the above embodiments, the circuitry to transmit a signal that a repair is currently pending to a circuit executing firmware on the processor may include a general purpose sideband interface. In combination with any of the above embodiments, to perform the in-field repair, the cache controller may further include circuitry to flush data from the target location in the last level cache. In combination with any of the above embodiments, the circuitry to flush data from the target location in the last level cache may include circuitry to invalidate data in a lower level cache coupled to the last level cache that is associated with the target location in the last level cache. In combination with any of the above embodiments, the cache controller may further comprise circuitry to read manufacturing repair data from a manufacturing repair memory including circuitry to store manufacturing repair data, read in-field repair data from a non-volatile memory including circuitry to store in-field repair data, and transmit the manufacturing repair data and the in-field repair data to a repair memory. In combination with any of the above embodiments, the circuitry to write in-field repair information to a non-volatile memory may include a general purpose sideband interface.

Embodiments of the present disclosure may include a method, comprising, in a processor receiving, at a cache controller, a read request directed to a target area in a last level cache, reading data from the target area, determining that the data includes unrepaired errors to be repaired, determining, in response to determining that the data includes unrepaired errors to be repaired, to perform an in-field repair, and performing, in response to determining to perform an in-field repair, an in-field repair of the target area. In combination with any of the above embodiments, the method may further include determining that the data includes unrepaired errors to be repaired includes applying error-correction code to determine that the data includes an error, and determining to perform an in-field repair may include incrementing, in response to determining that the data includes an error, a count of a number of errors associated with the target location, and determining that the count of a number of errors associated with the target location exceeds a predetermined threshold. In combination with any of the above embodiments, performing an in-field repair may include determining that no other in-field repair is pending in the last level cache, determining that a repair resource is available, writing in-field repair data to a repair memory, the in-field repair data including a physical address associated with the target location in the last level cache, and a cache way associated with the target location in the last level cache. In combination with any of the above embodiments, performing an in-field repair may include flushing data from the target location in the last level cache. In combination with any of the above embodiments, performing an in-field repair may include writing in-field repair data to a non-volatile memory external to the processor.

Embodiments of the present disclosure may include a packaged processor, comprising a processor means, including a cache controller means, a last level cache means coupled to the cache controller means, a repair memory means coupled to the cache controller means, and a non-volatile memory means external to the processor means and coupled to the cache controller means, the non-volatile memory means including circuitry to store in-field repair information. In combination with any of the above embodiments, the cache controller means may include circuitry to identify an in-field failure of at least one bit in the last level cache means, and perform, in response to the identification of the in-field failure of the at least one bit in the last level cache, an in-field repair of the last level cache. In combination with any of the above embodiments, to identify an in-field failure of a bit in the last level cache, the cache controller means may further include circuitry to read data from a target location in the last level cache means, apply error-correction code to determine that the data includes an error, increment a count of a number of errors associated with the target location, and determine that the count of the number of errors associated with the target location exceeds a predetermined threshold. In combination with any of the above embodiments, to perform an in-field repair, the cache controller means may further include circuitry to determine that no other in-field repair is pending in the last level cache, determine that a repair resource is available, write in-field repair data to the repair memory means, the in-field repair data including a physical address associated with a target location in the last level cache means including the at least one bit, and a cache way associated with the target location in the last level cache means. In combination with any of the above embodiments, to perform an in-field repair, the cache controller means may further include circuitry to determine that a repair resource is available, write in-field repair data to the repair memory means, the in-field repair data including a physical address associated with a target location in the last level cache means including the at least one bit, and a cache way associated with the target location in the last level cache means. In combination with any of the above embodiments, to perform the in-field repair, the cache controller means may further include circuitry to write the in-field repair data to the non-volatile memory means. In combination with any of the above embodiments, to perform the in-field repair, the cache controller means may further include circuitry to transmit a signal that a repair is currently pending to a circuit executing firmware on the processor. In combination with any of the above embodiments, the circuitry to transmit a signal that a repair is currently pending to a circuit executing firmware on the processor may include a general purpose sideband interface. In combination with any of the above embodiments, to perform the in-field repair, the cache controller means may further include circuitry to flush data from a target location in the last level cache means including the at least one bit. In combination with any of the above embodiments, packaged processor may further include a lower level cache means coupled to the last level cache means, and wherein to flush data from a target location in the last level cache means includes circuitry to invalidate data in the lower level cache means that is associated with the target location in the last level cache means. In combination with any of the above embodiments, the packaged processor may further include a manufacturing repair memory means including circuitry to store manufacturing repair data, wherein the cache controller means further includes circuitry to read manufacturing repair data from the manufacturing repair memory means, read in-field repair data from the non-volatile memory means, and transmit the manufacturing repair data and the in-field repair data to the repair memory means.

What is claimed is:

1. A packaged processor for granular in-field cache repair, comprising:
   a processor, including:
      a cache controller;
      a last level cache coupled to the cache controller;
      a repair memory coupled to the cache controller;
   a non-volatile memory external to the processor and coupled to the cache controller, the non-volatile memory including circuitry to store in-field repair information; and
   wherein the cache controller includes circuitry to:
      identify an in-field failure of at least one bit in the last level cache;
      perform, in response to identification of the in-field failure of the at least one bit in the last level cache, an in-field repair of the last level cache, wherein to perform the in-field repair, the cache controller further includes circuitry to:
         determine that no other in-field repair is pending in the last level cache;
         determine that a repair resource is available;
         write in-field repair data to the repair memory, the in-field repair data including:
            a physical address associated with a target location in the last level cache including the at least one bit; and
            a cache way associated with the target location in the last level cache.

2. The packaged processor of claim 1, wherein to identify an in-field failure of a bit in the last level cache, the cache controller further includes circuitry to:
   read data from a target location in the last level cache;
   apply error-correction code to determine that the data includes an error;

increment a count of a number of errors associated with the target location; and determine that the count of the number of errors associated with the target location exceeds a predetermined threshold.

3. The packaged processor of claim 1, wherein to perform the in-field repair, the cache controller further includes circuitry to write the in-field repair data to the non-volatile memory.

4. The packaged processor of claim 1, wherein to perform the in-field repair, the cache controller further includes circuitry to flush data from a target location in the last level cache including the at least one bit.

5. The packaged processor of claim 1, further comprising a manufacturing repair memory including circuitry to store manufacturing repair data; wherein the cache controller further includes circuitry to:
   read manufacturing repair data from a manufacturing repair memory;
   read in-field repair data from the non-volatile memory; and
   transmit the manufacturing repair data and the in-field repair data to the repair memory.

6. The packaged processor of claim 1, wherein the cache controller further includes circuitry to:
   receive an access request associated with the at least one bit in the last level cache; and
   redirect the access request to a repair resource in the repair memory, wherein the repair resource is associated with the at least one bit in the last level cache.

7. A cache controller, comprising circuitry to:
   receive a request to access data in a target location of a last level cache of a processor on a processor package;
   identify an in-field failure in the target location of the last level cache;
   perform, in response to the identification of the in-field failure, an in-field repair of the last level cache, including circuitry to:
      determine that no other in-field repair is pending in the last level cache;
      determine that a repair resource is available;
      write in-field repair data to a repair memory, the in-field repair data including:
         a physical address associated with the target location in the last level cache; and
         a cache way associated with the target location in the last level cache;
      write in-field repair information to a non-volatile memory on the processor package and external to the processor, the non-volatile memory including circuitry to store in-field repair information.

8. The cache controller of claim 7, wherein to identify an in-field failure in the target location, the cache controller further includes circuitry to:
   read data from the target location in the last level cache;
   apply error-correction code to determine that the data includes an error;
   increment a count of a number of errors associated with the target location; and
   determine that the count of the number of errors associated with the target location exceeds a predetermined threshold.

9. The cache controller of claim 7, wherein the repair memory includes a bit repair memory, a column repair memory, and a row repair memory.

10. The cache controller of claim 7, wherein to perform the in-field repair, the cache controller further includes circuitry to flush data from the target location in the last level cache.

11. The cache controller of claim 7, further comprising circuitry to
   read manufacturing repair data from a manufacturing repair memory including circuitry to store manufacturing repair data;
   read in-field repair data from a non-volatile memory including circuitry to store in-field repair data; and
   transmit the manufacturing repair data and the in-field repair data to a repair memory.

12. The cache controller of claim 7, wherein the circuitry to write in-field repair information to a non-volatile memory includes a general purpose sideband interface.

13. A method for granular in-field cache repair, comprising, in a processor:
   receiving, at a cache controller, a read request directed to a target area in a last level cache;
   reading data from the target area;
   determining that the data includes unrepaired errors to be repaired;
   determining, in response to determining that the data includes unrepaired errors to be repaired, to perform an in-field repair; and
   performing, in response to determining to perform the in-field repair, the in-field repair of the target area, wherein performing the in-field repair comprises:
      determining that no other in-field repair is pending in the last level cache;
      determining that a repair resource is available;
      writing in-field repair data to a repair memory, the in-field repair data including:
         a physical address associated with a target location in the last level cache; and
         a cache way associated with the target location in the last level cache.

14. The method of claim 13, wherein:
   determining that the data includes unrepaired errors to be repaired includes applying error-correction code to determine that the data includes an error; and
   determining to perform an in-field repair includes:
      incrementing, in response to determining that the data includes an error, a count of a number of errors associated with the target location; and
      determining that the count of a number of errors associated with the target location exceeds a predetermined threshold.

15. The method of claim 13, wherein performing an in-field repair comprises flushing data from the target location in the last level cache.

16. The method of claim 13, wherein performing an in-field repair comprises writing in-field repair data to a non-volatile memory external to the processor.

17. The method of claim 13, wherein writing in-field repair data to a repair memory includes writing in-field repair data to a repair memory using a general purpose sideband interface.

* * * * *